(12) United States Patent
Suzuri et al.

(10) Patent No.: US 7,740,955 B2
(45) Date of Patent: *Jun. 22, 2010

(54) ORGANIC ELECTROLUMINESCENT DEVICE AND DISPLAY

(75) Inventors: Yoshiyuki Suzuri, Musashino (JP); Hiroshi Kita, Hachioji (JP); Eisaku Katoh, Hachioji (JP); Tomohiro Oshiyama, Hachioji (JP); Mitsuhiro Fukuda, Chofu (JP); Noriko Ueda, Hino (JP)

(73) Assignee: Konica Minolta Holdings, Inc., Tokyo (JP)

( * ) Notice: Subject to any disclaimer, the term of this patent is extended or adjusted under 35 U.S.C. 154(b) by 475 days.

This patent is subject to a terminal disclaimer.

(21) Appl. No.: 10/519,107

(22) PCT Filed: Apr. 20, 2004

(86) PCT No.: PCT/JP2004/005603

§ 371 (c)(1),
(2), (4) Date: Dec. 23, 2004

(87) PCT Pub. No.: WO2004/095889

PCT Pub. Date: Nov. 4, 2004

(65) Prior Publication Data

US 2005/0249970 A1    Nov. 10, 2005

(30) Foreign Application Priority Data

Apr. 23, 2003  (JP) ............................. 2003-117886
Jan. 23, 2004  (JP) ............................. 2004-15487

(51) Int. Cl.
    *H01L 51/54* (2006.01)
(52) U.S. Cl. ............ 428/690; 428/917; 313/504; 313/506; 257/40; 257/E51.05
(58) Field of Classification Search ............ 428/690, 428/917; 313/502–509; 427/58, 66; 257/40, 257/88–103, E51.001–E51.052; 252/301.16–301.35; 544/184, 250, 345; 546/81–86; 548/427, 548/429

See application file for complete search history.

(56) References Cited

U.S. PATENT DOCUMENTS

| 5,217,961    | A    | 6/1993  | Yamato et al. | |
|--------------|------|---------|------------------|--------|
| 5,326,868    | A    | 7/1994  | Thurkauf et al. | |
| 6,344,459    | B1   | 2/2002  | Bridges et al. | |
| 6,458,475    | B1 * | 10/2002 | Adachi et al. | 428/690 |
| 6,660,410    | B2 * | 12/2003 | Hosokawa | 428/690 |
| 2001/0043044 | A1 * | 11/2001 | Wakimoto et al. | 313/506 |
| 2002/0197511 | A1 * | 12/2002 | D'Andrade et al. | 428/690 |
| 2004/0086745 | A1 * | 5/2004  | Iwakuma et al. | 428/690 |
| 2005/0127823 | A1 * | 6/2005  | Iwakuma et al. | 313/504 |
| 2006/0121308 | A1   | 6/2006  | Katoh et al. | |

FOREIGN PATENT DOCUMENTS

| EP | 517542 | * | 9/1992 |
|----|--------|---|--------|
| EP | 1 067 165 A2 | | 1/2001 |
| EP | 1 067 165 A3 | | 1/2001 |
| EP | 1571193 A1 | | 9/2005 |
| JP | 54-11736 A | | 1/1979 |
| JP | 63-293550 A | | 11/1988 |
| JP | 02-108058 A | | 4/1990 |
| JP | 07-110940 B2 | | 11/1995 |
| JP | 2001-160488 A | | 6/2001 |
| JP | 2002-008860 | * | 1/2002 |
| JP | 2003-031371 | * | 1/2003 |
| JP | 2003-109767 A | | 4/2003 |
| JP | 2003-335754 A | | 11/2003 |
| WO | WO 03/078541 | * | 9/2003 |
| WO | WO 2004/053019 A1 | | 6/2004 |

OTHER PUBLICATIONS

Wieczorek et al., "Antineoplastic and activity of azacarbazoles. III. Synthesis and Antitumor Evaluation of Selected 2-,3-aza and Diazaanalogues of Carbazole," Archivum Immunologiae et Therapiae Experimentalis, vol. 34, pp. 323-326, 1986.*

Thelakkat et al, "Low molecular weight and polymeric heterocyclics as electron transport/hole-blocking materials in organic light-emitting diodes," Polymers for Advanced Technologies, vol. 9, No. 7, pp. 429-442, Jul. 1998.*

(Continued)

*Primary Examiner*—Marie R. Yamnitzky
(74) *Attorney, Agent, or Firm*—Frishauf, Holtz, Goodman & Chick, P.C.

(57) ABSTRACT

The present invention relates to an organic electroluminescent element and a display device exhibiting high emission efficiency and long life. The organic electroluminescent element contains a pair of electrodes having therebetween at least one constituting layer containing a phosphorescent light emitting layer, wherein one of the constituting layer contains a compound represented by Formula (1):

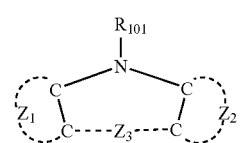

Formula (1)

wherein $Z_1$ represents an aromatic heterocylic ring which may have a substituent; $Z_2$ represents an aromatic heterocylic ring or an aromatic hydrocarbon ring both of which may have a substituent; $Z_3$ represents a divalent linking group or a single bond; and $R_{101}$ represents a hydrogen atom or a substituent.

8 Claims, 3 Drawing Sheets

OTHER PUBLICATIONS

Machine Translation of JP 2002-008860. (Jan. 2002).*

Machine Translation of JP 2003-031371. (Jan. 2003).*

Shoustikov et al., "Electroluminescence color tuning by dye doping in organic light-emitting diodes," IEEE Journal of Selected Topics in Quantum Electronics, vol. 4, No. 1, pp. 3-13, Jan./Feb. 1998.*

Baldo et al., "Phosphorescent materials for application to organic light omitting devices," Pure and Applied Chemistry, vol. 71, No. 11, pp. 2095-2106, 1999.*

Thompson, et al., "Phosphorescent Materials and Devices", The $10^{th}$ International Workshop on Inorganic and Organic Electroluminescence (EL '00, Hamamatsu), University of Southern California, Princeton University and Universal Display Corporation, Ewing, NJ, pp. 35-38, (2000).

Yang, et al., "High Efficiency Organic Emitting Devices Using New Iridium Complexes", The $10^{th}$ International Workshop on Inorganic and Organic Electroluminescence (EL '00, Hamamatsu), Kyushu University, Kasuga, Fukuoka, Japan, pp. 227-229, (2000).

Ikai et al., "Highly efficient phosphorescence from organic light emitting devices with tris (2-phenylpyridine) iridium doped into hole-transporting materials", The $10^{th}$ International Workshop on Inorganic and Organic Electroluminescence (EL '00, Hamamatsu), Toyota Central Research & Development Laboratories, Inc., Nagakute, Aichi, Japan, pp. 175-177, (2000).

* cited by examiner

ORGANIC ELECTROLUMINESCENT DEVICE AND DISPLAY

This application is a U.S. National Phase Application under 35 USC 371 of International Application PCT/JP2004/005603 filed Apr. 20, 2004

TECHNICAL FIELD

The present invention relates to an organic electroluminescent element exhibiting a high emission efficiency and a long life, and to a display employing the same.

BACKGROUND

As an emission type electronic displaying device, an electroluminescence device (ELD) is known. Elements constituting the ELD include an inorganic electroluminescent element and an organic electroluminescent element (hereinafter referred to also as an organic EL element).

Inorganic electroluminescent element has been used for a plane light source, however, a high voltage alternating current has been required to drive the element.

An organic EL element has a structure in which a light emitting layer containing a light emitting compound is arranged between a cathode and an anode, and an electron and a hole were injected into the light emitting layer and recombined to form an exciton. The element emits light, utilizing light (fluorescent light or phosphorescent light) generated by inactivation of the exciton, and the element can emit light by applying a relatively low voltage of several volts to several tens of volts. The element has a wide viewing angle and a high visuality since the element is of self light emission type. Further, the element is a thin, complete solid element, and therefore, the element is noted from the viewpoint of space saving and portability.

A practical organic EL element is required to emit light of high luminance with high efficiency at a lower power. For example, disclosed are an element exhibiting higher luminance of emitting light with longer life in which stilbene derivatives, distyrylarylene derivatives or tristyrylarylene derivatives doped with a slight amount of a fluorescent compound are employed (see Patent Document 1), an element which has an organic light emitting layer containing 8-hydroxyquinoline aluminum complex as a host compound doped with a slight amount of a fluorescent compound (see Patent Document 2), and an element which has an organic light emitting layer containing 8-hydroxyquinoline aluminum complex as a host compound doped with a quinacridone type dye (see Patent Document 3).

When light emitted through excited singlet state is used in the element disclosed in the above Patent documents, the upper limit of the external quantum efficiency ($\eta$ext) is considered to be at most 5%, because the generation probability of excited species capable of emitting light is 25%, since the generation ratio of singlet excited species to triplet excited species is 1:3, and further, external light emission efficiency is 20%.

Since an organic EL element, employing phosphorescence through the excited triplet, was reported by Princeton University (see Non-Patent Document 1), studies on materials emitting phosphorescence at room temperature have been actively carried out (see Non-Patent Document 2 and Patent Document 4).

As the upper limit of the internal quantum efficiency of the excited triplet is 100%, the light emission efficiency of the exited triplet is theoretically four times that of the excited singlet. Accordingly, light emission employing the excited triplet exhibits almost the same performance as a cold cathode tube, and can be applied to illumination.

For example, many kinds of heavy metal complexes such as iridium complexes have been synthesized and studied (see Non-Patent Document 3).

An example employing tris(2-phenylpyridine)iridium as a dopant has also been studied (see Non-Patent Document 2).

Other examples of a dopant which has been studied include, $L_2Ir$ (acac) such as $(ppy)_2Ir$ (acac) (see Non-Patent Document 4), tris(2-(p-tolyl)pyridine)iridium ($Ir(ptpy)_3$), tris(benzo[h]quinoline)iridium ($Ir(bzq)_3$) and $Ir(bzq)_2ClP$ $(Bu)_3$ (see Non-Patent Document 5).

A hole transporting material is used as a host of a phosphorescent compound in order to increase emission efficiency (see Non-Patent Document 6).

Various kinds of electron transporting materials doped with a new iridium complex are used as a host of a phosphorescent compound (see Non-Patent Document 4). High emission efficiency has been obtained by incorporating a hole blocking layer (see Non-Patent Document 5).

Also disclosed is a thermally stable hole transporting material having an aromatic heterocyclic ring containing nitrogen as a partial structure and having a chemical structure extending in three or four directions from a nitrogen atom, or from an aryl portion as a center (see Patent Document 5). However, in Patent Document 5, an organic EL element has not been fully disclosed.

Further, an aromatic heterocyclic compound containing nitrogen, which is a light emitting compound exhibiting high luminance, has been disclosed (see Patent Document 6), however, an organic EL element exhibiting phosphorescent emission has not been fully disclosed in Patent Document 6.

At present, an organic electroluminescent element emitting phosphorescence with further higher emission efficiency and longer life has been studied.

An external quantum efficiency of around 20%, which is a theoretical threshold, has been attained in green light emission in a lower current region (a lower luminance region), however, the theoretical threshold has not been attained in a higher current region (a higher luminance region). Further, a sufficient emission efficiency has not been attained in other color emission, where further improvement is required. With respect to the practical use in the near future, required is an organic EL element which efficiently emits light with high luminance at a lower power. Specifically, an organic EL element which emits a blue phosphorescence with high efficiency is required.

Accordingly, an object of the present invention is to provide an organic electroluminescent element and a display device exhibiting high luminance and, furthermore, to provide an organic electroluminescent element and a display device exhibiting long life.

(Patent Document 1)
Japanese Pat. No. 3093796
(Patent Document 2)
Japanese Patent Publication Open to Public Inspection (hereafter referred to as JP-A) No. 63-264692
(Patent Document 3)
JP-A No. 3-255190
(Patent Document 4)
U.S. Pat. No. 6,097,147
(Patent Document 5)
Examined Japanese Patent Publication No, 7-110940
(Patent Document 6)
JP-A No. 2001-160488
(Non-Patent Document 1)

M. A. Baldo et al., nature, 395, 151-154 (1998)

(Non-Patent Document 2)

M. A. Baldo et al., nature, 403(17), 750-753 (2000)

(Non-Patent Document 3)

S. Lamansky et al., J. Am. Chem. Soc., 123, 4304

(Non-Patent Document 4)

M. E. Tompson et al., The 10th International Workshop on Inorganic and Organic Electroluminescence (EL '00, Hamamatsu)

(Non-Patent Document 5)

Moon-Jae Youn.0g, Tetsuo Tsutsui et al., The 10th International Workshop on Inorganic and Organic Electroluminescence (EL '00, Hamamatsu)

(Non-Patent Document 6)

Ikai et al., The 10th International Workshop on Inorganic and Organic Electroluminescence (EL '00, Hamamatsu)

SUMMARY OF THE INVENTION

The above object of the present invention is achieved by the following structures:

(1) An organic electroluminescent element comprising a pair of electrodes having therebetween at least one constituting layer containing a phosphorescent light emitting layer, wherein one of the constituting layer contains a compound represented by Formula (1):

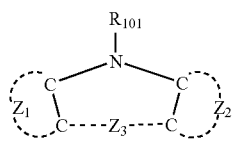

Formula (1)

wherein $Z_1$ represents an aromatic heterocylic ring which may have a substituent; $Z_2$ represents an aromatic heterocylic ring which may have a substituent or an aromatic hydrocarbon ring which may have a substituent; $Z_3$ represents a divalent linking group or a single bond; and $R_{101}$ represents a hydrogen atom or a substituent.

(2) The organic electroluminescent element of Item 1, wherein $Z_1$ of the compound represented by Formula (1) is a 6-membered ring.

(3) The organic electroluminescent element of Item 1 or Item 2, wherein $Z_2$ of the compound represented by Formula (1) is a 6-membered ring.

(4) The organic electroluminescent element of any one of Items 1 to 3, wherein $Z_3$ of the compound represented by Formula (1) is a single bond.

(5) The organic electroluminescent element of any one of Items 1 to 4, wherein the compound represented by Formula (1) has a molecular weight of 450 or more.

(6) The organic electroluminescent element of any one of Items 1 to 5, wherein the compound represented by Formula (1) is further represented by Formula (1-1).

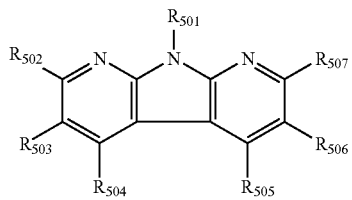

Formula (1-1)

wherein $R_{501}$-$R_{507}$ each independently represents a hydrogen atom or a substituent.

(7) The organic electroluminescent element of any one of Items 1 to 5, wherein the compound represented by Formula (1) is further represented by Formula (1-2).

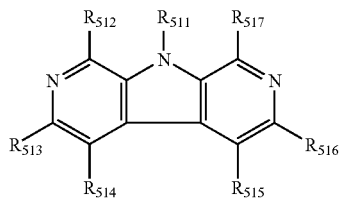

Formula (1-2)

wherein $R_{511}$-$R_{517}$ each independently represents a hydrogen atom or a substituent.

(8) The organic electroluminescent element of any one of Items 1 to 5, wherein the compound represented by Formula (1) is further represented by Formula (1-3).

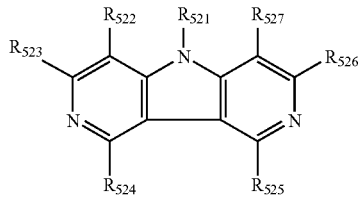

Formula (1-3)

wherein $R_{521}$-$R_{527}$ each independently represents a hydrogen atom or a substituent.

(9) The organic electroluminescent element of any one of Items 1 to 5, wherein the compound represented by Formula (1) is further represented by Formula (1-4).

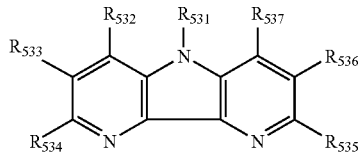

Formula (1-4)

wherein $R_{531}$-$R_{537}$ each independently represents a hydrogen atom or a substituent.

(10) The organic electroluminescent element of any one of Items 1 to 5, wherein the compound represented by Formula (1) is further represented by Formula (1-5).

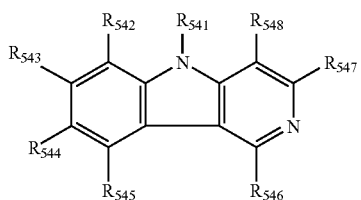

Formula (1-5)

wherein $R_{541}$-$R_{548}$ each independently represents a hydrogen atom or a substituent.

(11) The organic electroluminescent element of any one of Items 1 to 5, wherein the compound represented by Formula (1) is further represented by Formula (1-6).

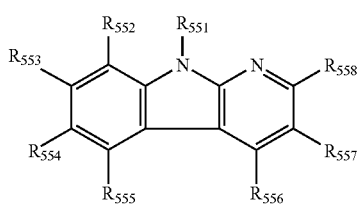

Formula (1-6)

wherein $R_{551}$-$R_{558}$ each independently represents a hydrogen atom or a substituent.

(12) The organic electroluminescent element of any one of Items 1 to 5, wherein the compound represented by Formula (1) is further represented by Formula (1-7).

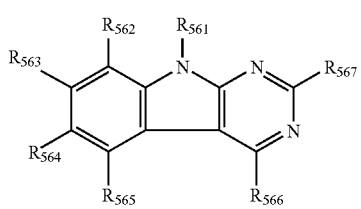

Formula (1-7)

wherein $R_{561}$-$R_{567}$ each independently represents a hydrogen atom or a substituent.

(13) The organic electroluminescent element of any one of Items 1 to 5, wherein the compound represented by Formula (1) is further represented by Formula (1-8).

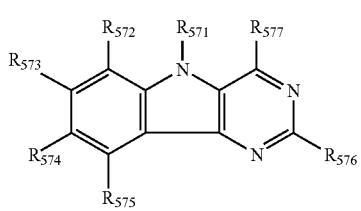

Formula (1-8)

wherein $R_{571}$-$R_{577}$ each independently represents a hydrogen atom or a substituent.

(14) The organic electroluminescent element of any one of Items 1 to 5, wherein the compound represented by Formula (1) is further represented by Formula (1-9).

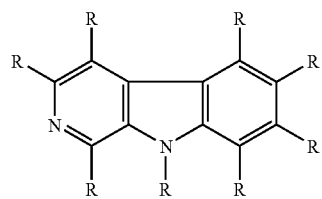

Formula (1-9)

wherein each R represents a hydrogen atom or a substituent and a plurality of R may be the same or may be different from each other.

(15) The organic electroluminescent element of any one of Items 1 to 5, wherein the compound represented by Formula (1) is further represented by Formula (1-10).

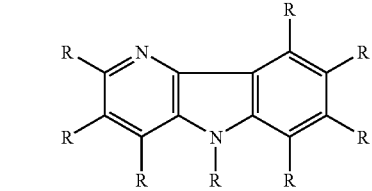

Formula (1-10)

wherein each R represents a hydrogen atom or a substituent and a plurality of R may be the same or may be different from each other.

(16) The organic electroluminescent element of any one of Items 1 to 5, wherein the compound represented by Formula (1) has at least one of groups represented by Formulae (2-1) to (2-8).

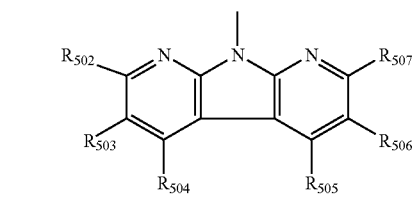

Formula (2-1)

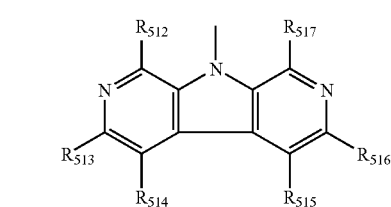

Formula (2-2)

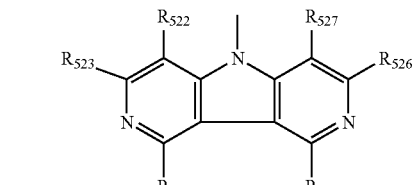

Formula (2-3)

-continued

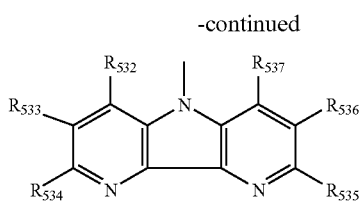
Formula (2-4)

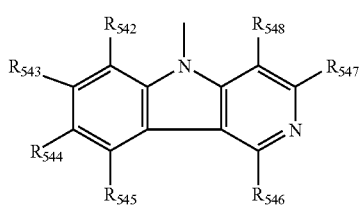
Formula (2-5)

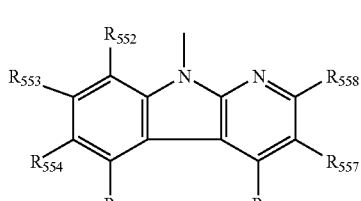
Formula (2-6)

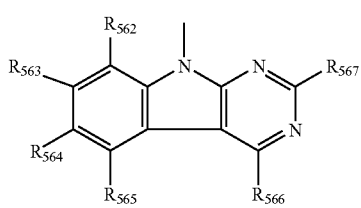
Formula (2-7)

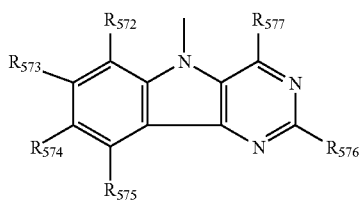
Formula (2-8)

wherein
(a) in Formula (2-1), $R_{502}$-$R_{507}$ each independently represents a hydrogen atom or a substituent;
(b) in Formula (2-2), $R_{512}$-$R_{517}$ each independently represents a hydrogen atom or a substituent;
(c) in Formula (2-3), $R_{522}$-$R_{527}$ each independently represents a hydrogen atom or a substituent;
(d) in Formula (2-4), $R_{532}$-$R_{537}$ each independently represents a hydrogen atom or a substituent;
(e) in Formula (2-5), $R_{542}$-$R_{548}$ each independently represents a hydrogen atom or a substituent;
(f) in Formula (2-6), $R_{552}$-$R_{558}$ each independently represents a hydrogen atom or a substituent;
(g) in Formula (2-7), $R_{562}$-$R_{567}$ each independently represents a hydrogen atom or a substituent; and
(h) in Formula (2-8), $R_{572}$-$R_{577}$ each independently represents a hydrogen atom or a substituent.

(17) The organic electroluminescent element of any one of Items 1 to 5, wherein the compound represented by Formula (1) is further represented by Formula (3).

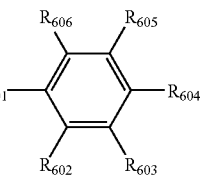
Formula (3)

wherein $R_{601}$-$R_{606}$ each independently represents a hydrogen atom or a substituent and at least one of $R_{601}$-$R_{606}$ is represented by one of Formulae (2-1) to (2-4).

(18) The organic electroluminescent element of any one of Items 1 to 5, wherein the compound represented by Formula (1) is further represented by Formula (4).

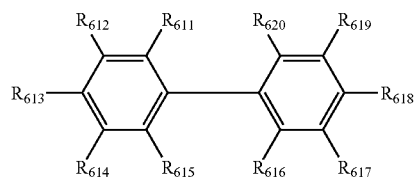
Formula (4)

wherein $R_{611}$-$R_{620}$ each independently represents a hydrogen atom or a substituent and at least one of $R_{611}$-$R_{620}$ is represented by one of Formulae (2-1) to (2-4).

(19) The organic electroluminescent element of any one of Items 1 to 5, wherein the compound represented by Formula (1) is further represented by Formula (5).

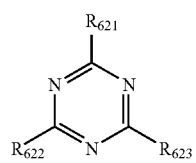
Formula (5)

wherein $R_{621}$-$R_{623}$ each independently represents a hydrogen atom or a substituent and at least one of $R_{621}$-$R_{623}$ is represented by one of Formulae (2-1) to (2-4).

(20) The organic electroluminescent element of any one of Items 1 to 5, wherein the compound represented by Formula (1) is further represented by Formula (6).

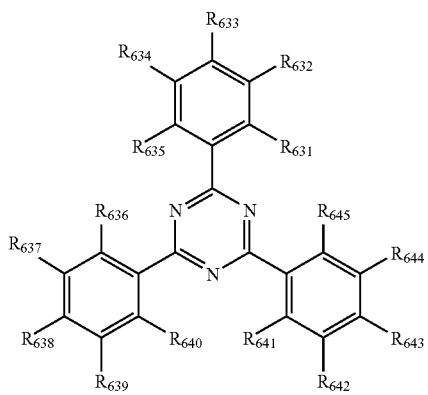

Formula (6)

wherein $R_{631}$-$R_{645}$ each independently represents a hydrogen atom or a substituent and at least one of $R_{631}$-$R_{645}$ is represented by one of Formulae (2-1) to (2-4).

(21) The organic electroluminescent element of any one of Items 1 to 5, wherein the compound represented by Formula (1) is further represented by Formula (7).

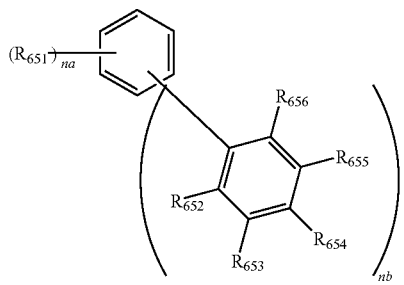

Formula (7)

wherein $R_{651}$-$R_{656}$ each independently represents a hydrogen atom or a substituent and at least one of $R_{651}$-$R_{656}$ is represented by one of Formulae (2-1) to (2-4); na represents an integer of 0 to 5; and nb represents an integer of 1 to 6, provided that a sum of na and nb is 6.

(22) The organic electroluminescent element of any one of Items 1 to 5, wherein the compound represented by Formula (1) is further represented by Formula (8).

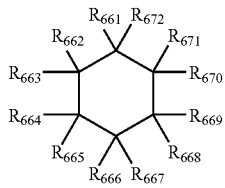

Formula (8)

wherein $R_{661}$-$R_{672}$ each independently represents a hydrogen atom or a substituent and at least one of $R_{661}$-$R_{672}$ is represented by one of Formulae (2-1) to (2-4).

(23) The organic electroluminescent element of any one of Items 1 to 5, wherein the compound represented by Formula (1) is further represented by Formula (9).

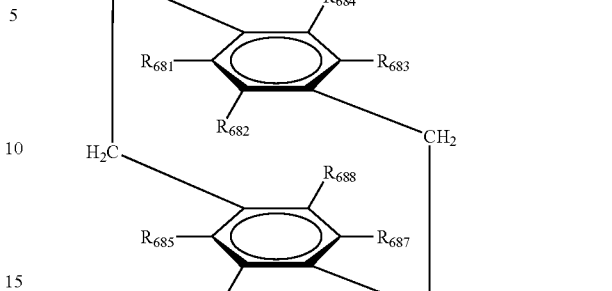

Formula (9)

wherein $R_{681}$-$R_{688}$ each independently represents a hydrogen atom or a substituent and at least one of $R_{681}$-$R_{688}$ is represented by one of Formulae (2-1) to (2-4).

(24) The organic electroluminescent element of any one of Items 1 to 5, wherein the compound represented by Formula (1) is further represented by Formula (10).

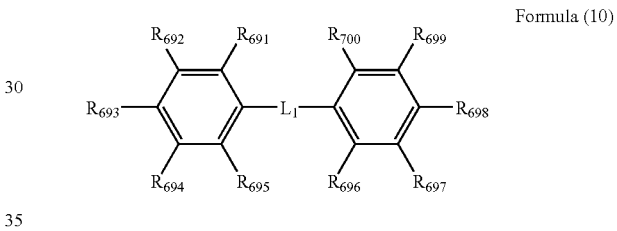

Formula (10)

wherein $R_{691}$-$R_{700}$ each independently represents a hydrogen atom or a substituent and at least one of $R_{691}$-$R_{700}$ is represented by one of Formulae (2-1) to (2-4); and $L_1$ represents a divalent linking group.

(25) The organic electroluminescent element of any one of Items 1 to 5, wherein the compound represented by Formula (1) is further represented by Formula (11).

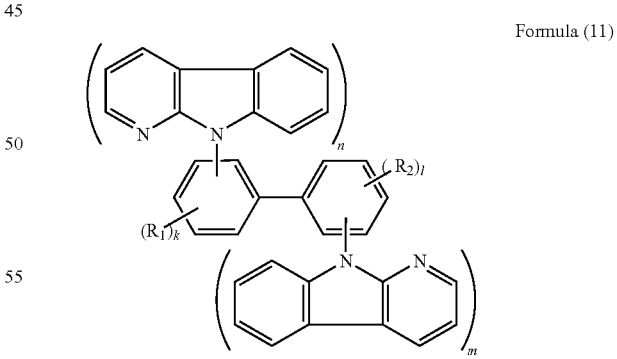

Formula (11)

wherein $R_1$ and $R_2$ each independently represents a hydrogen atom or a substituent; n and m each represents an integer of 1 to 2; and k and l each represents an integer of 3 to 4, provided that n+k=5 and l+m=5.

(26) The organic electroluminescent element of any one of Items 1 to 5, wherein the compound represented by Formula (1) is further represented by Formula (12).

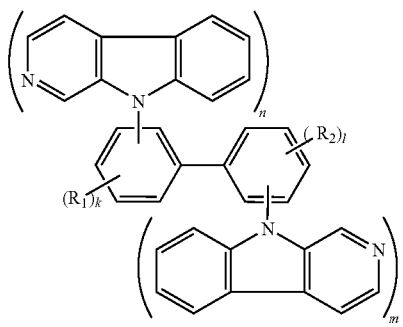

Formula (12)

wherein $R_1$ and $R_2$ each independently represents a hydrogen atom or a substituent; n and m each represents an integer of 1 to 2; and k and l each represents an integer of 3 to 4, provided that n+k=5 and l+m=5.

(27) The organic electroluminescent element of any one of Items 1 to 5, wherein the compound represented by Formula (1) is further represented by Formula (13).

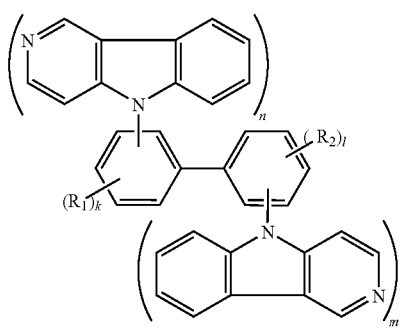

Formula (13)

wherein $R_1$ and $R_2$ each independently represents a hydrogen atom or a substituent; n and m each represents an integer of 1 to 2; and k and l each represents an integer of 3 to 4, provided that n+k=5 and l+m=5.

(28) The organic electroluminescent element of any one of Items 1 to 5, wherein the compound represented by Formula (1) is further represented by Formula (14).

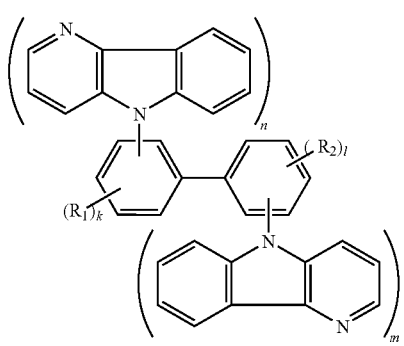

Formula (14)

wherein $R_1$ and $R_2$ each independently represents a hydrogen atom or a substituent; n and m each represents an integer of 1 to 2; and k and l each represents an integer of 3 to 4, provided that n+k=5 and l+m=5.

(29) The organic electroluminescent element of any one of Items 1 to 5, wherein the compound represented by Formula (1) is further represented by Formula (15).

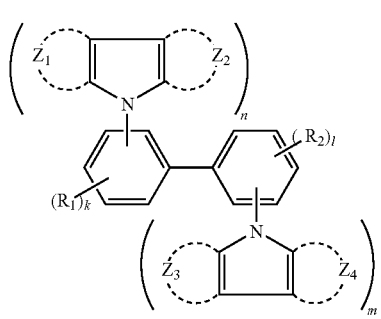

Formula (15)

wherein $R_1$ and $R_2$ each independently represents a hydrogen atom or a substituent; n and m each represents an integer of 1 to 2; k and l each represents an integer of 3 to 4, provided that n+k=5 and l+m=5; and $Z_1$, $Z_2$, $Z_3$ and $Z_4$ each represent a 6-membered aromatic heterocyclic ring containing a nitrogen atom.

(30) The organic electroluminescent element of any one of Items 1 to 5, wherein the compound represented by Formula (1) is further represented by Formula (16).

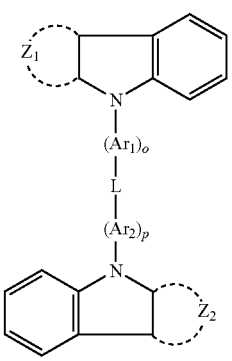

Formula (16)

wherein o and p each represents an integer of 1 to 3; $Ar_1$ and $Ar_2$ each represents an arylene group or a divalent aromatic heterocyclic group; $Z_1$ and $Z_2$ each represents a 6-membered aromatic heterocyclic ring containing a nitrogen atom; and L represents a divalent linking group.

(31) The organic electroluminescent element of any one of Items 1 to 5, wherein the compound represented by Formula (1) is further represented by Formula (17).

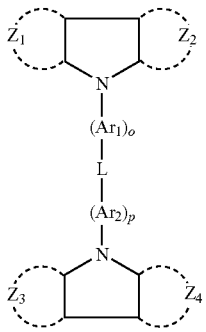

Formula (17)

wherein o and p each represents an integer of 1 to 3; $Ar_1$ and $Ar_2$ each represents an arylene group or a divalent aromatic heterocyclic group; $Z_1$, $Z_2$, $Z_3$ and $Z_4$ each represents a 6-membered aromatic heterocyclic ring containing a nitrogen atom; and L represents a divalent linking group.

(32) The organic electroluminescent element of any one of Items 1 to 31, wherein the light emitting layer contains the compound represented by Formula (1).

(33) The organic electroluminescent element of any one of Items 1 to 32, wherein at least one of the constituting layers is a hole blocking layer and the hole blocking layer contains the compound represented by Formula (1).

(34) The organic electroluminescent element of any one of Items 1 to 33 which emits blue light.

(35) The organic electroluminescent element of any one of Items 1 to 33 which emits white light.

(36) A display device having the organic electroluminescent element of any one of Items 1 to 35.

(37) An organic electroluminescent element comprising a pair of electrodes having therebetween at least one constituting layer containing a phosphorescent light emitting layer, wherein one of the constituting layer contains a compound represented by Formula (1-11):

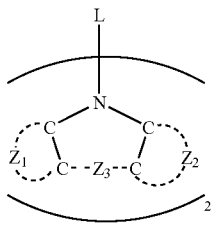

Formula (1-11)

wherein $Z_1$ represents an aromatic heterocylic ring which may have a substituent; $Z_2$ represents an aromatic heterocylic ring which may have a substituent or an aromatic hydrocarbon ring which may have a substituent; $Z_3$ represents a divalent linking group or a single bond; L represents a divalent linking group; and the two groups linked by L may be the same or different from each other.

(38) The organic electroluminescent element of Item 37, wherein $Z_1$ of the compound represented by Formula (1-11) is a 6-membered ring.

(39) The organic electroluminescent element of Item 37 or Item 38, wherein $Z_2$ of the compound represented by Formula (1-11) is a 6-membered ring.

(40) The organic electroluminescent element of any one of Items 37 to 39, wherein $Z_3$ of the compound represented by Formula (1-11) is a single bond.

(41) The organic electroluminescent element of any one of Items 37 to 40, wherein the compound represented by Formula (1-11) has a molecular weight of 450 or more.

(42) The organic electroluminescent element of any one of Items 37 to 41, wherein the light emitting layer contains the compound represented by Formula (1-11).

(43) The organic electroluminescent element of any one of Items 37 to 42, wherein at least one of the constituting layers is a hole blocking layer and the hole blocking layer contains the compound represented by Formula (1-11).

(44) The organic electroluminescent element of any one of Items 37 to 43 which emits blue light.

(45) The organic electroluminescent element of any one of Items 37 to 43 which emits white light.

(46) A display device having the organic electroluminescent element of any one of Items 37 to 45.

(47) An organic electroluminescent element comprising a pair of electrodes having therebetween at least one constituting layer containing a phosphorescent light emitting layer, wherein one of the constituting layer contains a compound represented by Formula (1-12):

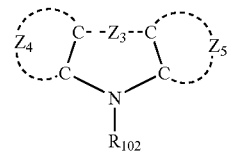

Formula (1-12)

wherein $R_{102}$ represents an alkyl group which may have a substituent, a cycloalkyl group which may have a substituent, an aryl group which may have a substituent or a heterocyclic group which may have a substituent; $Z_4$ and $Z_5$ each independently represents an atom group which is necessary to form a 5-7 membered heterocylic ring containing nitrogen; and $Z_3$ represents a divalent linking group or a single bond.

(48) The organic electroluminescent element of Item 47, wherein $Z_3$ of the compound represented by Formula (1-12) is a single bond.

(49) The organic electroluminescent element of Item 47 or Item 48, wherein the compound represented by Formula (1-12) has a molecular weight of 450 or more.

(50) The organic electroluminescent element of any one of Items 47 to 49, wherein the light emitting layer contains the compound represented by Formula (1-12).

(51) The organic electroluminescent element of any one of Items 47 to 50, wherein at least one of the constituting layers is a hole blocking layer and the hole blocking layer contains the compound represented by Formula (1-12).

(52) The organic electroluminescent element of any one of Items 47 to 51 which emits blue light.

(53) The organic electroluminescent element of any one of Items 47 to 51 which emits white light.

(54) A display device having the organic electroluminescent element of any one of Items 47 to 53.

(55) An organic electroluminescent element comprising a pair of electrodes having therebetween at least one constituting layer containing a phosphorescent light emitting layer, wherein one of the constituting layer contains a compound represented by Formula (1-13):

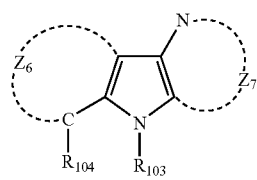

Formula (1-13)

wherein $R_{103}$ represents an alkyl group which may have a substituent, a cycloalkyl group which may have a substituent, an aryl group which may have a substituent or a heterocyclic group which may have a substituent; $R_{104}$ represents a hydrogen atom or a substituent; and $Z_6$ and $Z_7$ each independently represents an atom group which is necessary to form a 5-7 membered heterocylic ring containing nitrogen.

(56) The organic electroluminescent element of Item 55, wherein $Z_6$ of the compound represented by Formula (1-13) is a 6-membered ring.

(57) The organic electroluminescent element of Item 55 or Item 56, wherein $Z_7$ of the compound represented by Formula (1-13) is a 6-membered ring.

(58) The organic electroluminescent element of any one of Items 55 to 57, wherein the compound represented by Formula (1-13) has a molecular weight of 450 or more.

(59) The organic electroluminescent element of any one of Items 55 to 58, wherein the light emitting layer contains the compound represented by Formula (1-13).

(60) The organic electroluminescent element of any one of Items 55 to 59, wherein at least one of the constituting layers is a hole blocking layer and the hole blocking layer contains the compound represented by Formula (1-13).

(61) The organic electroluminescent element of any one of Items 55 to 60 which emits blue light.

(62) The organic electroluminescent element of any one of Items 55 to 60 which emits white light.

(63) A display device having the organic electroluminescent element of any one of Items 55 to 62.

DESCRIPTION OF THE PREFERRED EMBODIMENTS

Figure 1:
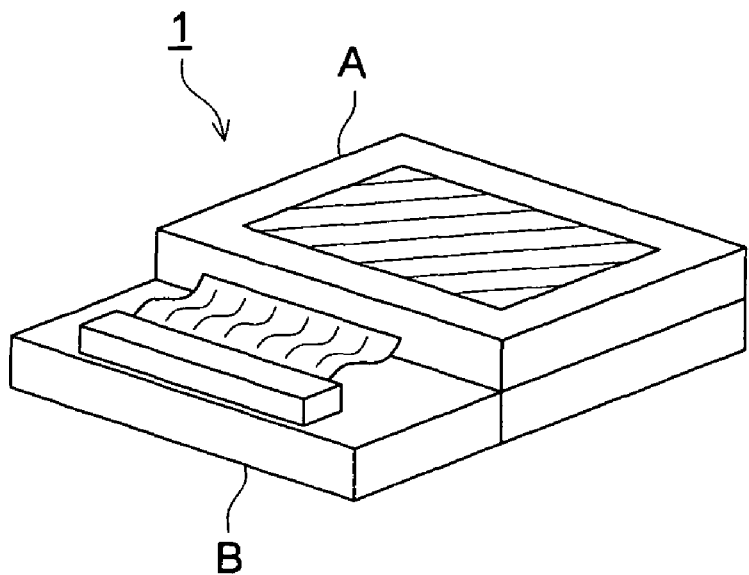
FIG. 1 is a schematic drawing of one example of a display comprising an organic EL element.

Details of the constituting elements of the present invention will now be explained.

<<Materials for Organic EL Elements>>

Compounds used in the present invention will be explained.

<<Compounds Represented by Formula (1)>>

Compounds represented by Formula (1) will be explained.

An organic EL element employing a compound represented by Formula (1) was found to exhibit high emission efficiency. Further, an organic EL element employing a compound represented by Formula (1) was found to exhibit a long life.

In Formula (1), $Z_1$ represents an aromatic heterocylic ring which may have a substituent; $Z_2$ represents an aromatic heterocylic ring which may have a substituent or an aromatic hydrocarbon ring which may have a substituent; $Z_3$ represents a divalent linking group or a single bond; and $R_{101}$ represents a hydrogen atom or a substituent.

In Formula (1), examples of an aromatic heterocyclic ring represented by $Z_1$ or $Z_2$ include: a furan ring, a thiophene ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, a benzimidazole ring, a benzothiazole ring, a benzoxazole ring, a quinoxaline ring, a quinazoline ring, a phthalazine ring, a carbazole ring, a carboline ring and a ring which is formed by replacing one of the carbon atoms of a hydrocarbon ring constituting a carboline ring with a nitrogen atom. The above mentioned aromatic hydrocarbon rings may have a substituent represented by $R_{101}$ which will be described later.

In Formula (1), examples of an aromatic hydrocarbon ring represented by $Z_2$ include: a benzene ring, a biphenyl ring, a naphthalene ring, an azulene ring, an anthracene ring, a phenanthrene ring, a pyrene ring, a chrysene ring, a naphthacene ring, a triphenylene ring, o-terphenyl ring, m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring and a anthranthrene ring. Furthermore, the above mentioned aromatic hydrocarbon rings may have a substituent represented by $R_{101}$ which will be described below.

In Formula (1), examples of a substitute represented by $R_{101}$ include: alkyl groups (for example, a methyl group, an ethyl group, a propyl group, an isopropyl group, a tert-butyl group, a pentyl group, a hexyl group, an octyl group, a dodecyl group, a tridecyl group, a tetradecyl group and a pentadecyl group); cycloalkyl groups (for example, a cyclopentyl group and a cyclohexyl group); alkenyl groups (for example, a vinyl group and an allyl group); alkynyl groups (for example, an ethynyl group and a propargyl group); aryl groups (for example, a phenyl group and a naphthyl group); aromatic heterocyclic groups (for example, a furyl group, a thienyl group, a pyridyl group, a pyridazinyl group, a pyrimidinyl group, a pyrazinyl group, the triazinyl group, an imidazolyl group, a pyrazolyl group, a thiazolyl group, a quinazolinyl group and a phthalazinyl group), heterocyclic groups (for example, a pyrrolidyl group, an imidazolidyl group, a morpholyl group and an oxazolidyl group), alkoxyl groups (for example, a methoxy group, an ethoxy group, a propyloxy group, a pentyloxy group, a hexyloxy group, an octyloxy group and a dodecyloxy group), cyclo alkoxyl groups (for example, a cyclopentyloxy group, a cyclohexyloxy group), aryloxy groups (for example, a phenoxy group and a naphthyloxy group), alkylthio groups (for example, a methylthio group, an ethylthio group, a propylthio group, a pentylthio group, a hexylthio group, an octylthio group and a dodecylthio group), cycloalkylthio groups (for example, a cyclopentylthio group and a cyclohexylthio group), arylthio groups (for example, a phenylthio group and a naphthylthio group), alkoxycarbonyl groups (for example, a methyloxycarbonyl group, an ethyloxycarbonyl group, a butyloxycarbonyl group, an octyloxycarbonyl group and a dodecyloxycarbonyl group), aryloxycarbonyl groups (for example, a phenyloxycarbonyl group and a naphthyloxycarbonyl group), sulfamoyl groups (for example, the aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group and 2-pyridylaminosulfonyl group), acyl groups (for example, an acetyl group, an ethylcarbonyl group, a propylcarbonyl group, a pentylcarbonyl group, a cyclohexylcarbonyl group, an octylcarbonyl group, 2-ethylhexylcarbonyl group, a dodecylcarbonyl group, a phenylcarbonyl group, a naphthylcarbonyl group and a pyridyl carbonyl group), acyloxy groups (for example, an acetyloxy group, an ethylcarbonyloxy group, a butylcarbonyloxy group, an octylcarbonyloxy group, a dodecylcarbonyloxy group and a phenylcarbonyloxy group), amide groups (for example, a methylcarbonylamino group, an ethylcarbonylamino group, a dimethylcarbonylamino group, a propylcarbonylamino group, a pentylcarbonylamino group, a cyclohexylcarbonylamino group, 2-ethylhexylcarbonylamino group, an octylcarbonylamino group, a dodecylcarbonylamino group, a phenylcarbonylamino group, a naphthylcarbonylamino group, etc.), carbamoyl groups (for example, the aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, 2-ethylhexylaminocarbonyl group, a dodecylaminocarbonyl group, a phenylaminocarbonyl group, a naphthylaminocarbonyl group and 2-pyridylaminocarbonyl group), ureido groups (for example, a methylureido group, an ethylureido group, a pentylureido group, a cyclohexylureido group, an octylureido group, a dodecylureido group, a phenylureido group naphthylureido group and 2-pyridylaminoureido group), sulfinyl groups (for example, a methylsulfinyl group, an ethylsulfinyl group, a butylsulfinyl group, a cyclohexylsulfinyl group, 2-ethylhexylsulfinyl group, a dodecylsulfinyl group, a phenylsulfinyl group, a naphthylsulfinyl group and 2-pyridylsulfinyl group), alkylsulfonyl groups (for example, a methylsulfonylamino group, an ethylsulfonyl group, a butylsulfonyl group, a cyclohexylsulfonyl group, 2-ethylhexylsulfonyl group and a dodecylsulfonyl group), arylsulfonyl groups (a phenylsulfonyl group, a naphthylsulfonyl group and 2-pyridylsulfonyl group), amino groups (for example, an amino group, an ethylamino group, a dimethylamino group, a butylamino group, a cyclopentylamino group, 2-ethylhexylamino group, a dodecylamino group, an anilino group and a naphthylamino group, 2-pyridylamino group), halogen atoms (for example, a fluorine atom, a chlorine atom and a bromine atom), fluoride hydro fluoro carbon groups (for example, a fluoromethyl group, a trifluoromethyl group, a pentafluoroethyl group and a pentafluorophenyl group), a cyano group, a nitro group, a hydroxy group, a mercapto group, silyl groups (for example, a trimethylsilyl group, a triisopropylsilyl group, a triphenylsilyl group and a phenyldiethylsilyl group).

These substituents may further be replaced by another substituent described above. Moreover, a plurality of substituents may be combined together to form a ring.

The preferable substituents include an alkyl group, a cycloalkyl group, a hydro fluoro carbon group, an aryl group and an aromatic heterocyclic group.

Examples of a divalent linking group may include hydrocarbon groups such as an alkylene group, an alkenylene group, an alkynylene and an arylene group; a group containing a heteroatom; divalent linking groups derived from a compound containing aromatic heterocyclic ring (also referred to as a heteroaromatic compound) such as a thiophene-2,5-diyl group and a pyrazine-2,3-diyl group; chalcogen atoms such as an oxygen atom and a sulfur atom; and linking groups containing a linkage through a heteroatom such as an alkylimino group, a dialkylsilanediyl group and a diarylgermanediyl group.

A single bond represents a bond directly combining two substituents.

In the present invention, $Z_1$ in Formula (1) is preferably a 6-membered ring, whereby high emission efficiency is obtained and, further, a longer life is attained.

In the present invention, $Z_2$ in Formula (1) is preferably a 6-membered ring, whereby high emission efficiency is obtained and, further, a longer life is attained.

Further, both of $Z_1$ and $Z_2$ in Formula (1) are preferably 6-membered rings, whereby a still longer life is attained.

Among the compounds represented by Formula (1), preferable are the compounds represented by Formulae (1-1) to (1-13).

In Formula (1-1), $R_{501}$-$R_{507}$ each independently represents a hydrogen atom or a substituent.

By using a compound represented by Formula (1-1), an organic EL element exhibiting higher emission efficiency and, further, a longer life is obtained.

In Formula (1-2), $R_{511}$-$R_{517}$ each independently represents a hydrogen atom or a substituent.

By using a compound represented by Formula (1-2), an organic EL element exhibiting higher emission efficiency and, further, a longer life is obtained.

In Formula (1-3), $R_{521}$-$R_{527}$ each independently represents a hydrogen atom or a substituent.

By using a compound represented by Formula (1-3), an organic EL element exhibiting higher emission efficiency and, further, a longer life is obtained.

In Formula (1-4), $R_{531}$-$R_{537}$ each independently represents a hydrogen atom or a substituent.

By using a compound represented by Formula (1-4), an organic EL element exhibiting higher emission efficiency and, further, a longer life is obtained.

In Formula (1-5), $R_{541}$-$R_{548}$ each independently represents a hydrogen atom or a substituent.

By using a compound represented by Formula (1-5), an organic EL element exhibiting higher emission efficiency and, further, a longer life is obtained.

In Formula (1-6), $R_{551}$-$R_{558}$ each independently represents a hydrogen atom or a substituent.

By using a compound represented by Formula (1-6), an organic EL element exhibiting higher emission efficiency and, further, a longer life is obtained.

In Formula (1-7), $R_{561}$-$R_{567}$ each independently represents a hydrogen atom or a substituent.

By using a compound represented by Formula (1-7), an organic EL element exhibiting higher emission efficiency and, further, a longer life is obtained.

In Formula (1-8), $R_{571}$-$R_{577}$ each independently represents a hydrogen atom or a substituent.

By using a compound represented by Formula (1-8), an organic EL element exhibiting higher emission efficiency and, further, a longer life is obtained.

In Formula (1-9), R represents a hydrogen atom or a substituent. A plurality of R may be the same or may be different from each other By using a compound represented by Formula (1-9), an organic EL element exhibiting higher emission efficiency and, further, a longer life is obtained.

In Formula (1-10), R represents a hydrogen atom or a substituent. A plurality of R may be the same or may be different from each other.

By using a compound represented by Formula (1-10), an organic EL element exhibiting higher emission efficiency and, further, a longer life is obtained.

In Formula (1-11), $Z_1$ represents an aromatic heterocyclic ring which may have a substituent; $Z_2$ represents an aromatic heterocylic ring which may have a substituent or an aromatic hydrocarbon ring which may have a substituent; $Z_3$ represents a divalent linking group or a single bond. L represents a divalent linking group. Two groups linked by L may be the same or may be different from each other.

By using a compound represented by Formula (1-11), an organic EL element exhibiting higher emission efficiency and, further, a longer life is obtained.

In Formula (1-12), $R_{102}$ represents an alkyl group which may have a substituent, a cycloalkyl group which may have a substituent, an aryl group which may have a substituent or a heterocyclic group which may have a substituent; $Z_4$ and $Z_5$ each independently represents an atom group which is necessary to form a 5-7 membered heterocyclic ring containing nitrogen; and $Z_3$ represents a divalent linking group or a single bond.

By using a compound represented by Formula (1-12), an organic EL element exhibiting higher emission efficiency and, further, a longer life is obtained.

In Formula (1-13), $R_{103}$ represents an alkyl group which may have a substituent, a cycloalkyl group which may have a substituent, an aryl group which may have a substituent or a heterocyclic group which may have a substituent; $R_{104}$ represents a hydrogen atom or a substituent; and $Z_6$ and $Z_7$ each represents an atom group which is necessary to form a 5-7 membered ring.

By using a compound represented by Formula (1-13), an organic EL element exhibiting higher emission efficiency and, further, a longer life is obtained.

The substituents which may further be introduced in each of Formulae (1-1) to (1-13) are common to the substituents represented by $R_{101}$ in the compound represented by Formula (1).

Among the compounds represented by Formula (1), preferable are the compounds containing at least one group represented by any one of Formulae (2-1) to (2-8). Specifically preferable are the compounds having 2 to 4 groups represented by Formulae (2-1) to (2-2) a molecule, in which also included is the case when only the portions except for $R_{101}$ of the structure represented by Formula (1) are replaced by the groups represented by Formulae (2-1) to (2-8).

Herein, the compounds represented by Formulae (3) to (17) are preferable to obtain the effect of the present invention.

In Formula (3), $R_{601}$-$R_{606}$ each independently represents a hydrogen atom or a substituent and at least one of $R_{601}$-$R_{606}$ is represented by one of Formulae (2-1) to (2-4).

By using a compound represented by Formula (3), an organic EL element exhibiting higher emission efficiency and, further, a longer life is obtained.

In Formula (4), $R_{611}$-$R_{620}$ each independently represents a hydrogen atom or a substituent and at least one of $R_{611}$-$R_{620}$ is represented by one of Formulae (2-1) to (2-4).

By using a compound represented by Formula (4), an organic EL element exhibiting higher emission efficiency and, further, a longer life is obtained.

In Formula (5), $R_{621}$-$R_{623}$ each independently represents a hydrogen atom or a substituent and at least one of $R_{621}$-$R_{623}$ is represented by one of Formulae (2-1) to (2-4).

By using a compound represented by Formula (5), an organic EL element exhibiting higher emission efficiency and, further, a longer life is obtained.

In Formula (6), $R_{631}$-$R_{645}$ each independently represents a hydrogen atom or a substituent and at least one of $R_{631}$-$R_{645}$ is represented by one of Formulae (2-1) to (2-4).

By using a compound represented by Formula (6), an organic EL element exhibiting higher emission efficiency and, further, a longer life is obtained.

In Formula (7), $R_{651}$-$R_{656}$ each independently represents a hydrogen atom or a substituent and at least one of $R_{651}$-$R_{656}$ is represented by one of Formulae (2-1) to (2-4).

By using a compound represented by Formula (7), an organic EL element exhibiting higher emission efficiency and, further, a longer life is obtained.

In Formula (8), $R_{661}$-$R_{672}$ each independently represents a hydrogen atom or a substituent and at least one of $R_{661}$-$R_{672}$ is represented by one of Formulae (2-1) to (2-4).

By using a compound represented by Formula (8), an organic EL element exhibiting higher emission efficiency and, further, a longer life is obtained.

In Formula (9), $R_{681}$-$R_{688}$ each independently represents a hydrogen atom or a substituent and at least one of $R_{681}$-$R_{688}$ is represented by one of Formulae (2-1) to (2-4).

By using a compound represented by Formula (9), an organic EL element exhibiting higher emission efficiency and, further, a longer life is obtained.

In Formula (10), $R_{691}$-$R_{700}$ each independently represents a hydrogen atom or a substituent and at least one of $R_{691}$-$R_{700}$ is represented by one of Formulae (2-1) to (2-4).

Examples of a divalent linking group represented by $L_1$ in Formula (10) include: hydrocarbon groups, for example, alkylene groups (for example, an ethylene group, a trimethylene group, a tetramethylene group, a propylene group, an ethylethylene group, a pentamethylene group, a hexamethylene group, 2,2,4-trimethylhexamethylene group, a heptamethylene group, an octamethylene group, a nonamethylene group, a decamethylene group, an undecamethylene group, a dodecamethylene group, cyclohexylene groups (for example, a 1,6-cyclohexanediyl group), cyclopentylene groups (for example, a 1,5-cyclopentanediyl group), alkenylene groups (for example, a vinylene group and a propenylene group), alkynylene groups (for example, a ethynylene group and 3-pentynylene group, etc.), and arylene groups; and groups containing a hetero atom (for example, divalent groups containing a chalcogen atom, such as —O— and —S—; and —N(R)— groups where R represents a hydrogen atom or an alkyl group wherein the alkyl group is common to the alkyl groups represented by $R_{101}$ in Formula (1)).

In each of the above alkylene group, alkenylene group, and arylene group, at least one of the carbon atoms constituting the divalent group may be replaced by a chalcogen atom (oxygen or sulfur) or the —N(R)— group.

Further, examples of a divalent linking group represented by $L_1$ include: groups having a divalent heterocyclic group, for example, an oxazolediyl group, a pyrimidinediyl group, a pyridazinediyl group, a pyrandiyl group, a pyrrolinediyl group, an imidazolinediyl group, an imidazolidinediyl group, a pyrazolidinediyl group, a pyrazolinediyl group, a piperidinediyl group, a piperazinediyl group, a morpholinediyl group, and a quinuclidinediyl group; and divalent linking groups derived from compounds having an aromatic heterocyclic ring (also referred to as a heteroaromatic compounds), for example, a thiophene-2,5-diyl group and a pyrazine-2,3-diyl group.

Also included are divalent linking groups containing a linkage via a hetero atom, for example, an alkylimino group, a dialkylsilanediyl group and a diarylgermanediyl group.

By using a compound represented by Formula (10), an organic EL element exhibiting higher emission efficiency and, further, a longer life is obtained.

In each compound represented by Formulae (11) to (15), the substituents represented by $R_1$ and $R_2$ are common to the substituents represented by $R_{101}$ in Formula (1).

Examples of a 6-membered aromatic heterocyclic ring containing at least one nitrogen atom which is represented by $Z_1$, $Z_2$, $Z_3$ or $Z_4$ of Formula (15) include: a pyridine ring, a pyridazine ring, a pyrimidine ring and a pyrazine ring.

Examples of a 6-membered aromatic heterocyclic ring containing at least one nitrogen atom which is represented by $Z_1$ or $Z_2$ of Formula (16) include: a pyridine ring, a pyridazine ring, a pyrimidine ring and a pyrazine ring.

Examples of an arylene group represented by $Ar_1$ or $Ar_2$ of Formula (16) include: an o-phenylene group, a m-phenylene group, a p-phenylene group, a naphthalenediyl group, an anthracenediyl group, a naphthacenediyl group, a pyrenediyl group, a naphthylnaphthalenediyl group, a biphenyldiyl groups (for example, a 3,3-biphenyldiyl group and a 3,6-biphenyldiyl group), a terphenyldiyl group, a quaterphenyldiyl group, a quinquephenyldiyl group, the sexiphenyldiyl group, the septiphenyldiyl group, an octiphenyldiyl group, the noviphenyldiyl group and a deciphenyldiyl group. The above mentioned arylene group may further have a substituent which will be described later.

Examples of a divalent aromatic heterocyclic group represented by $Ar_1$ or $Ar_2$ of Formula (16) include: a furan ring, a thiophene ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, a benzimidazole ring, a benzothiazole ring, a benzoxazole ring, a quinoxaline ring, a quinazoline ring, a phthalazine ring, a carbazole ring, a carboline ring and a divalent group, for example, derived from a hydrocarbon ring constituting a carboline ring, of which a carbon atom is further replaced with a nitrogen atom. Further, the above mentioned aromatic heterocyclic group may have a substituent represented by $R_{101}$.

The divalent linking groups represented by L in Formula (16) are common to the divalent linking groups represented by $L_1$ in Formula (10), however, preferable are an alkylene group or a divalent group containing a chalcogen atom, for example, —O— or —S—, and more preferable is an alkylene group.

The arylene groups represented by $Ar_1$ or $Ar_2$ in Formula (17) are common to the arylene groups represented by $Ar_1$ or $Ar_2$ in Formula (16).

Examples of the 6-membered aromatic heterocyclic ring containing at least one nitrogen atom represented by $Z_1$, $Z_2$, $Z_3$ or $Z_4$ in Formula (17) include: a pyridine ring, a pyridazine ring, a pyrimidine ring and a pyrazine ring.

In the following, the compounds relating to the present invention or specific examples of the compounds relating to the present invention will be shown, however, the present invention is not limited thereto:

| Compound | Central Moiety | A |
|---|---|---|
| 1 | | |
| 2 | | |
| 3 | | |

-continued
| | | |
|---|---|---|
| 4 | 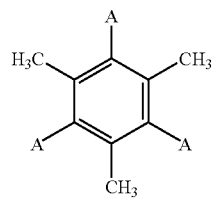 | 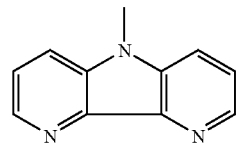 |
| 5 | 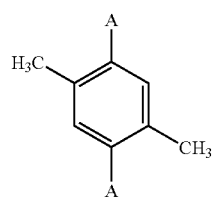 | 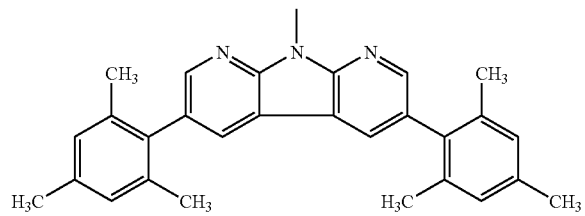 |
| 6 | 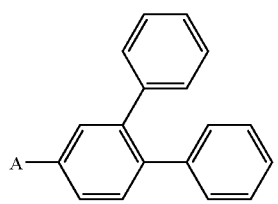 | 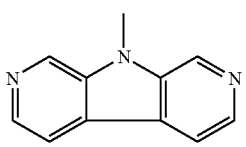 |
| 7 | 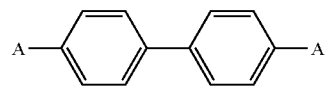 | 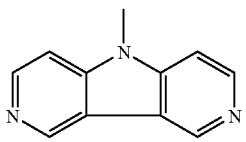 |
| 8 | 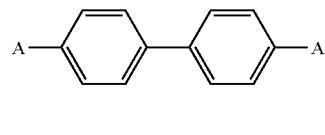 | 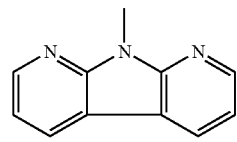 |
| 9 | 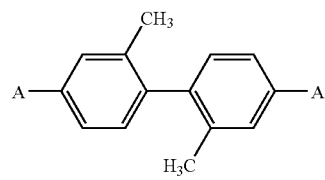 | 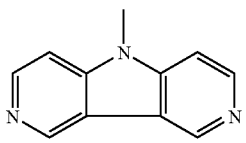 |
| 10 | 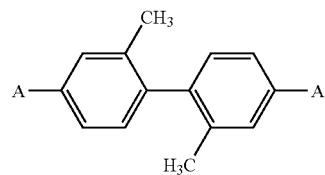 | 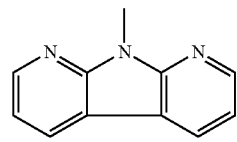 |
| 11 | 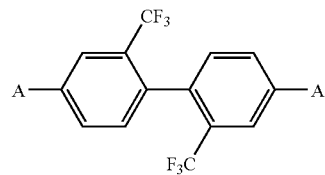 | 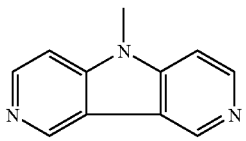 |

-continued
| | | |
|---|---|---|
| 12 | 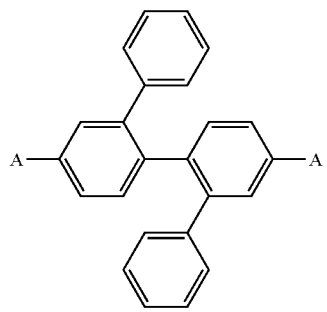 | 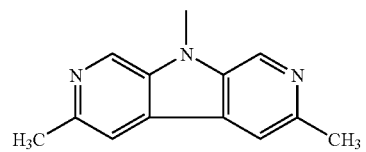 |
| 13 | 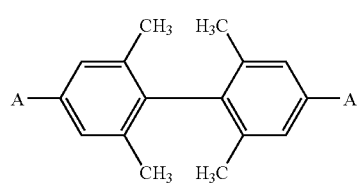 | 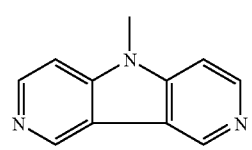 |
| 14 | 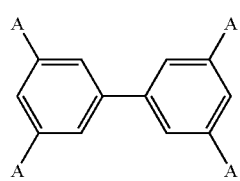 | 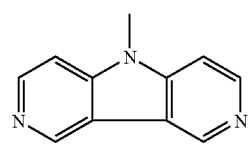 |
| 15 | 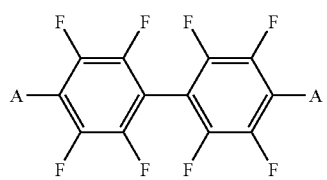 | 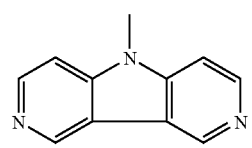 |
| 16 | 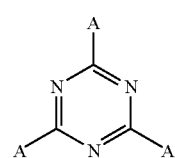 | 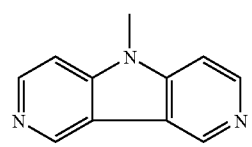 |
| 17 | 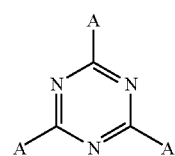 | 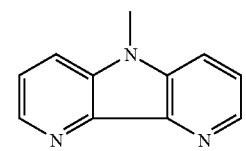 |
| 18 | 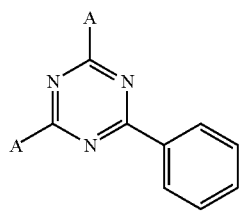 | 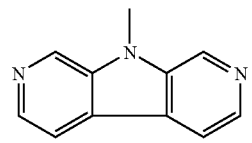 |

-continued
19 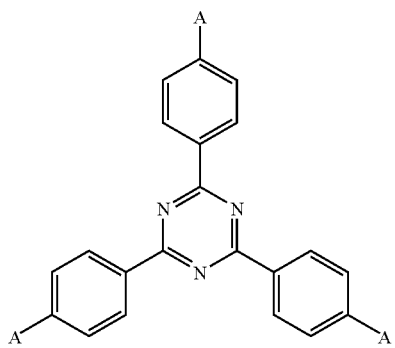 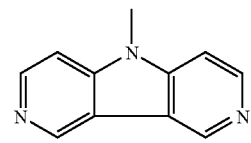
20 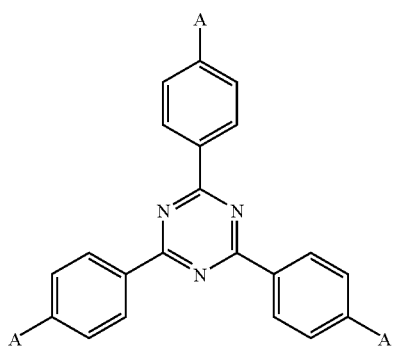 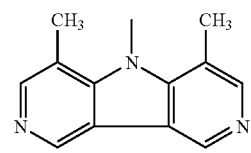
21 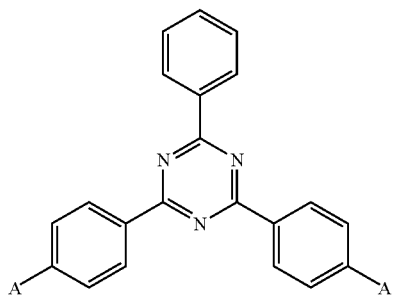 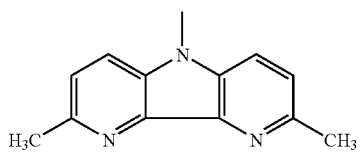
22 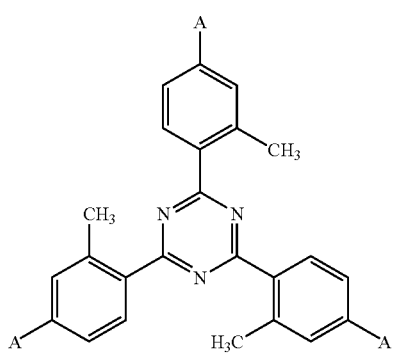 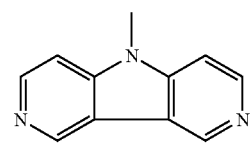

-continued
23 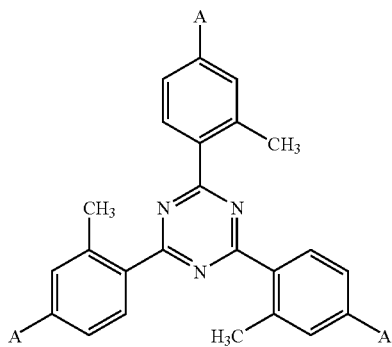 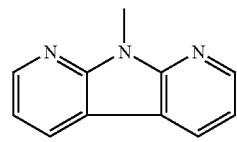
24 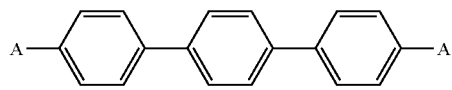 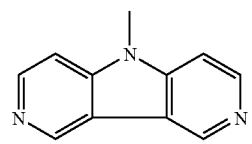
25  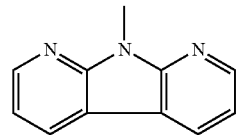
26 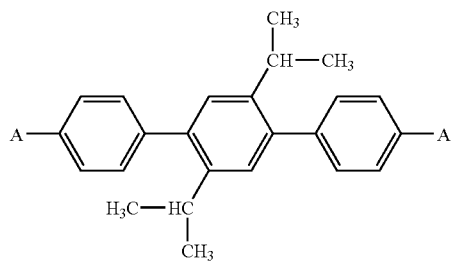 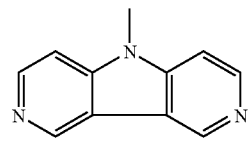
27 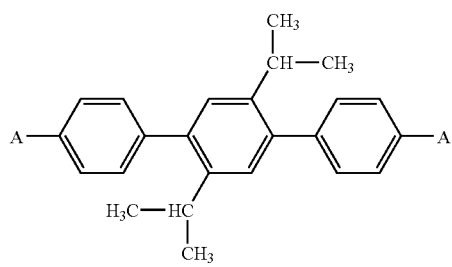 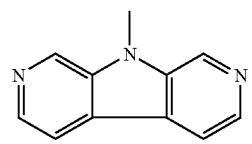
28 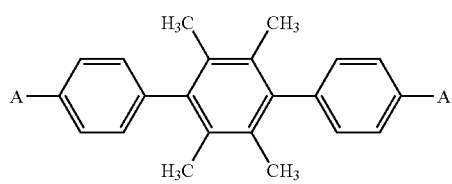 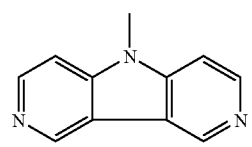
29 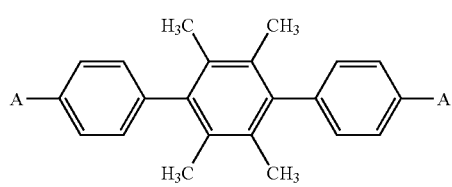 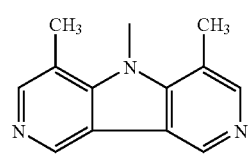

-continued
| | | |
|---|---|---|
| 30 | 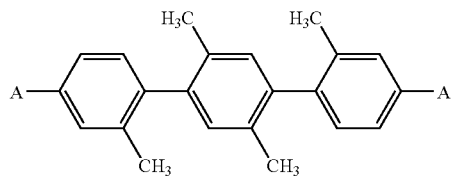 | 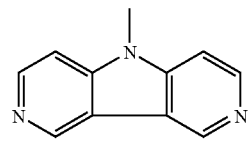 |
| 31 | 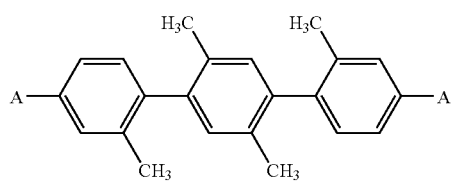 | 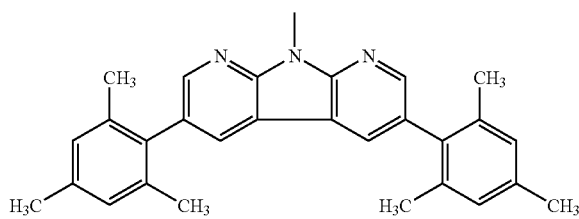 |
| 32 | 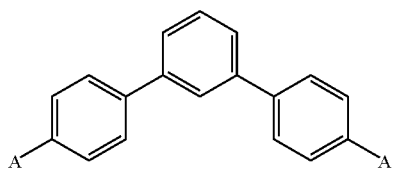 | 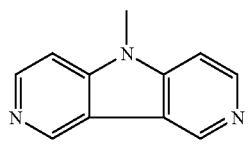 |
| 33 | 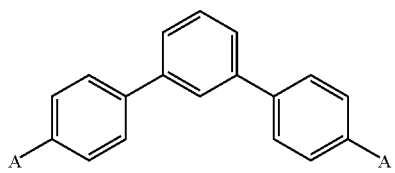 | 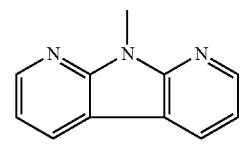 |
| 34 | 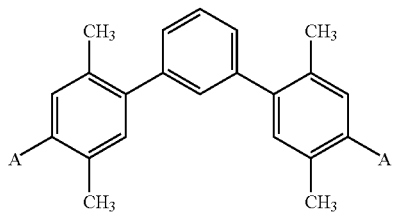 | 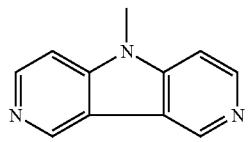 |
| 35 | 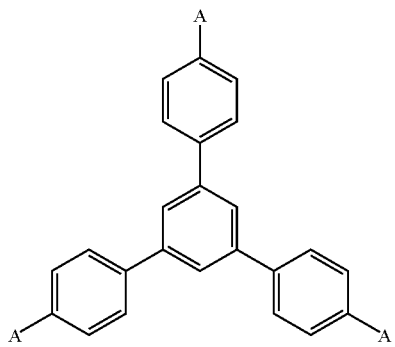 | 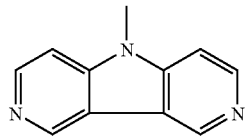 |

-continued
36 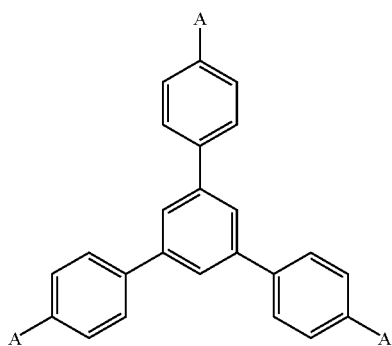 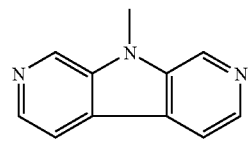
37 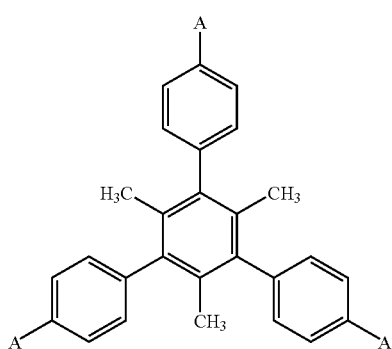 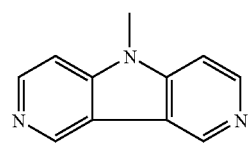
38 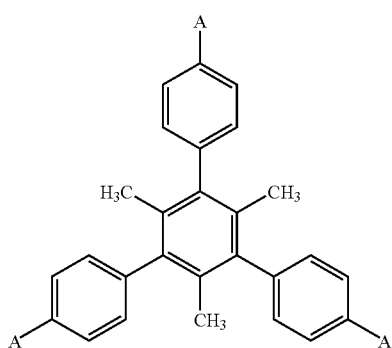 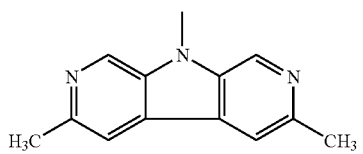
39 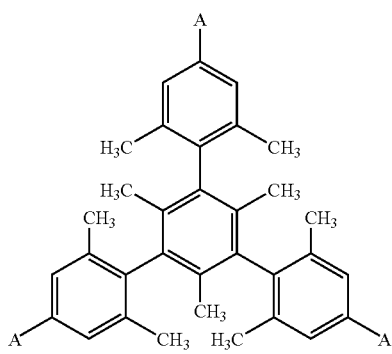 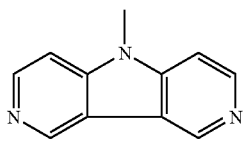

-continued
| | | |
|---|---|---|
| 40 | 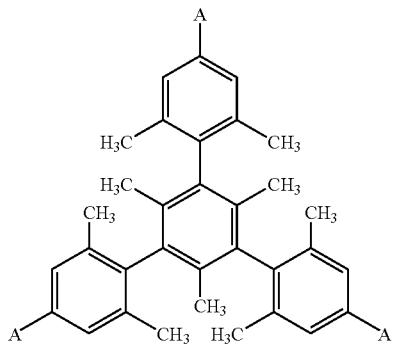 | 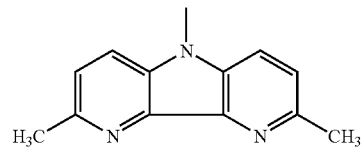 |
| 41 | 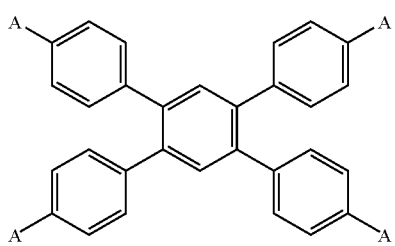 | 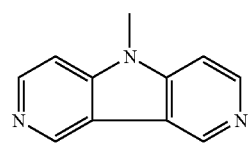 |
| 42 | 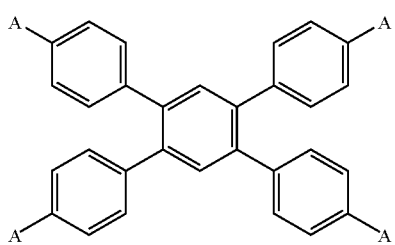 | 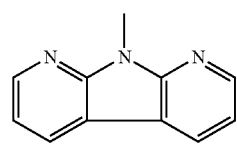 |
| 43 | 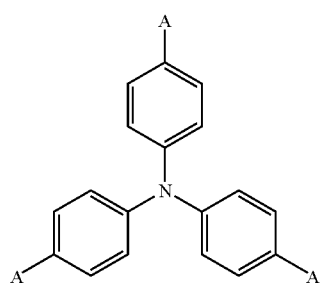 | 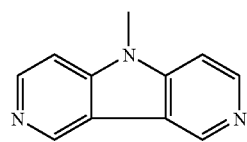 |
| 44 | 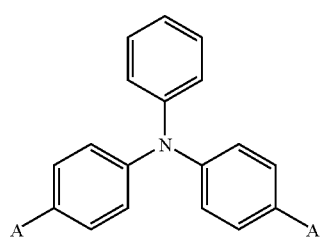 | 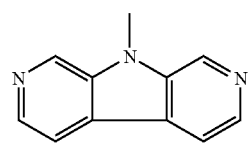 |
| 45 | 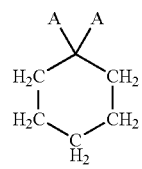 | 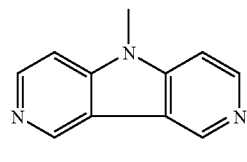 |

-continued
| 46 | 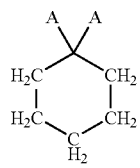 | 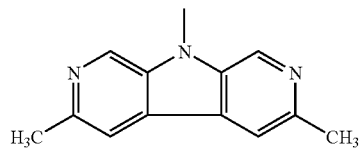 |
| 47 | 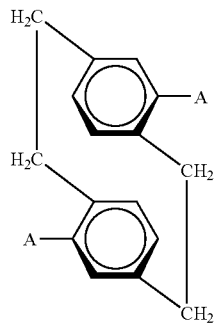 | 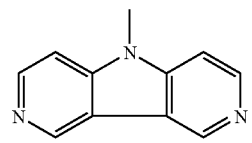 |
| 48 | 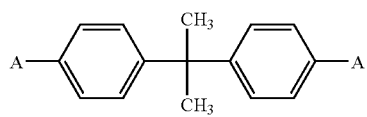 | 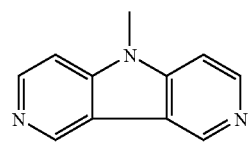 |
| 49 | 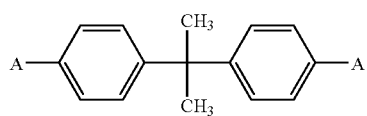 | 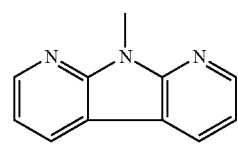 |
| 50 | 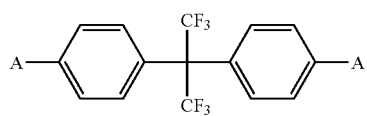 | 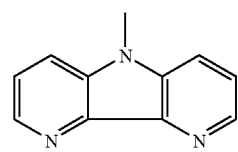 |
| 51 | 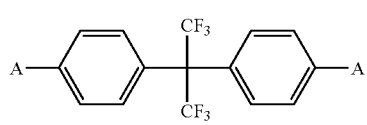 | 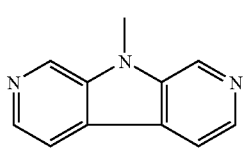 |
| 52 | 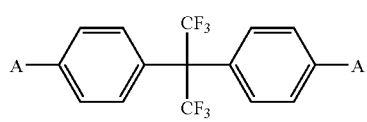 | 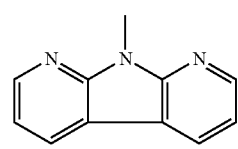 |
| 53 | 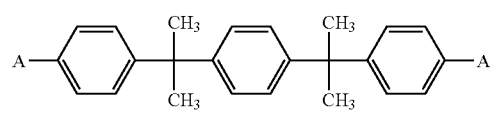 | 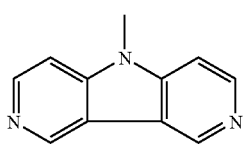 |
| 54 | 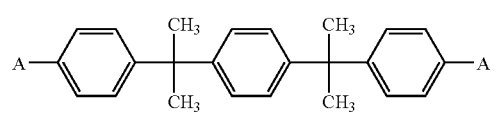 | 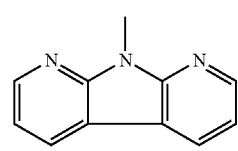 |

-continued
| | | |
|---|---|---|
| 55 | 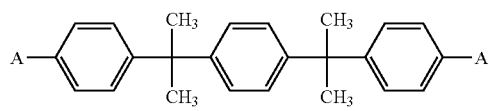 | 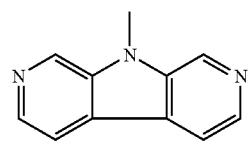 |
| 56 | 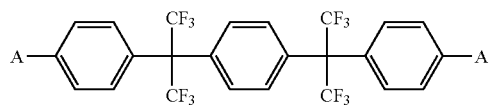 | 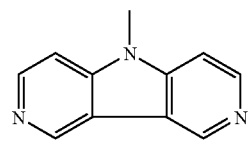 |
| 57 | 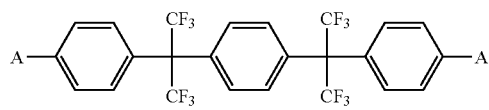 | 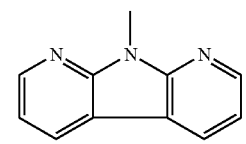 |
| 58 | 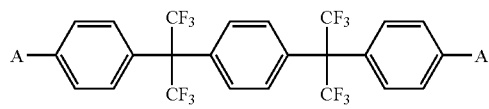 | 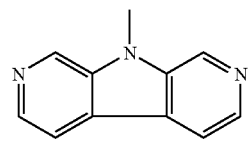 |
| 59 | 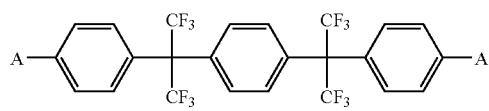 | 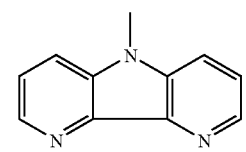 |
| 60 | 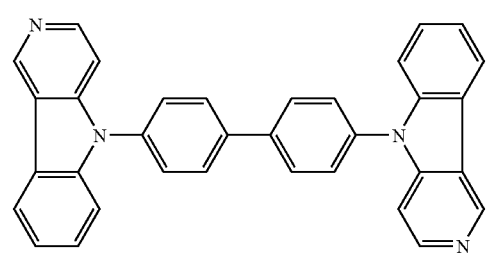 | |
| 61 | 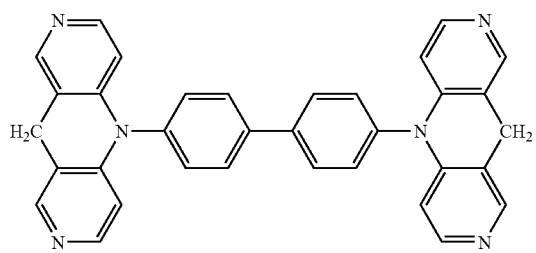 | |
| 62 | 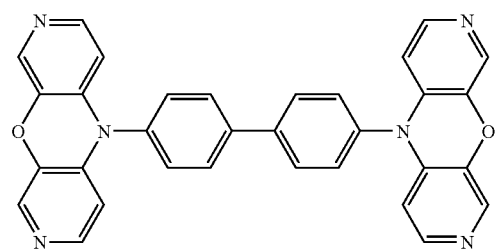 | |

63 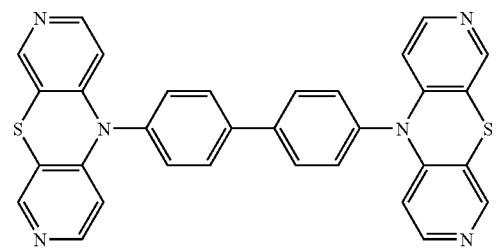
64 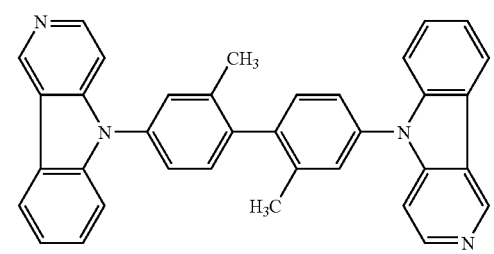
65 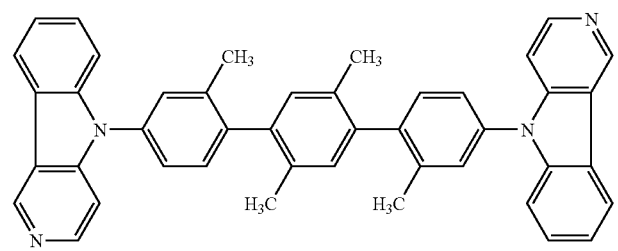
66 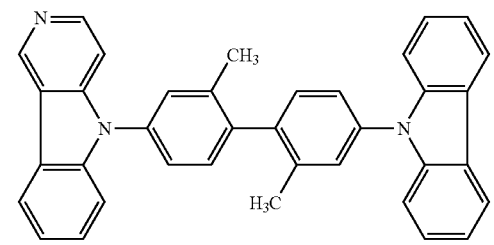
67 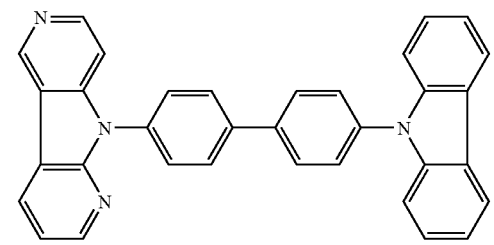

-continued
68
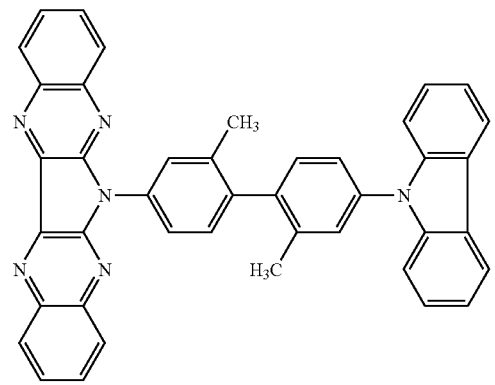
69
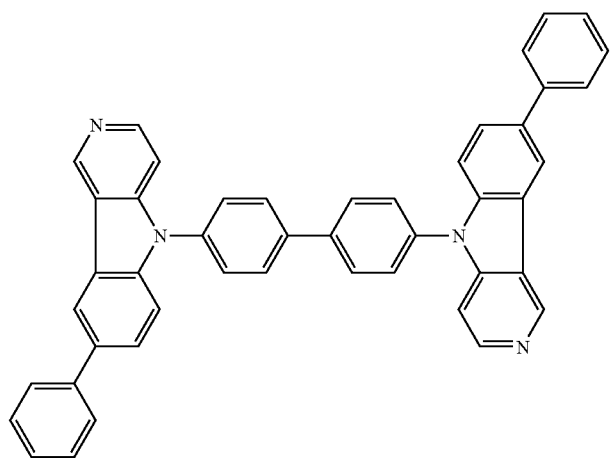
70
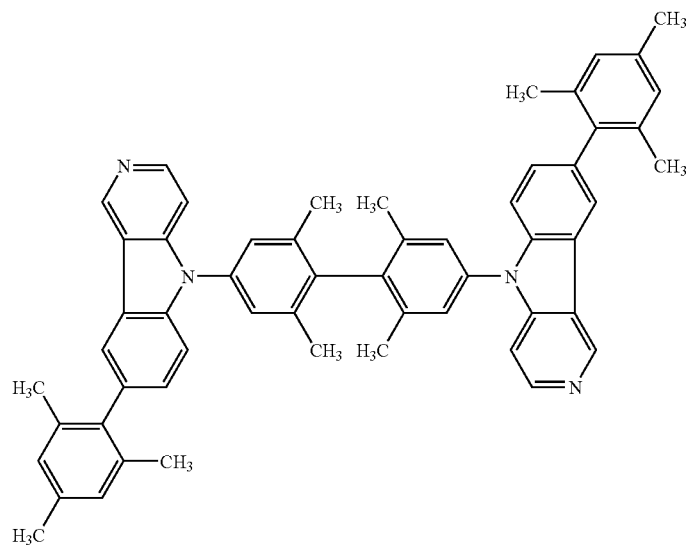

71
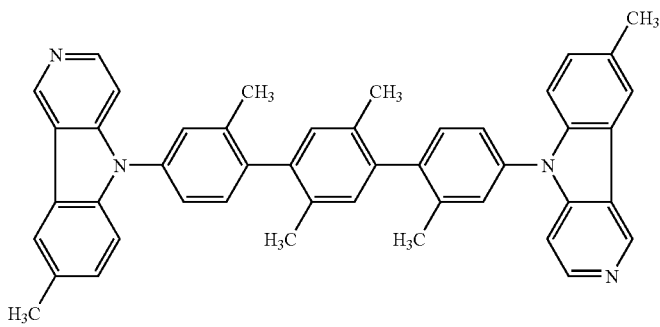
72
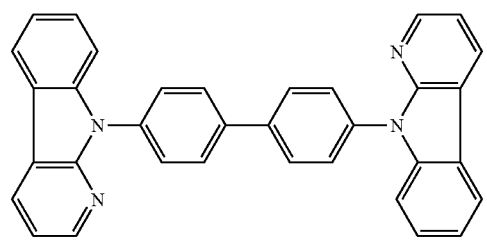
73
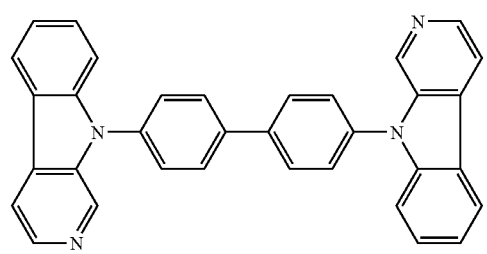
74
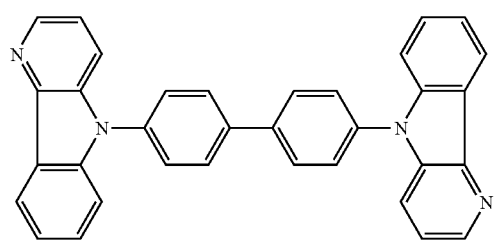
75
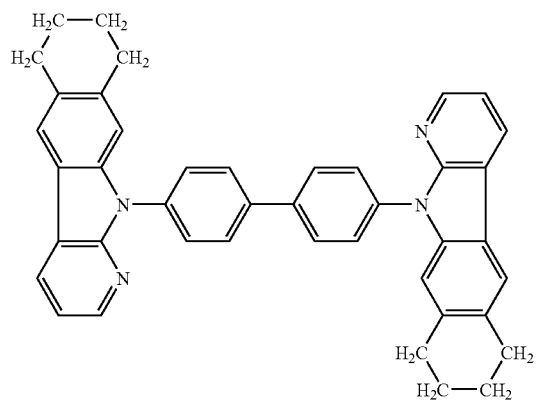

| 76 | 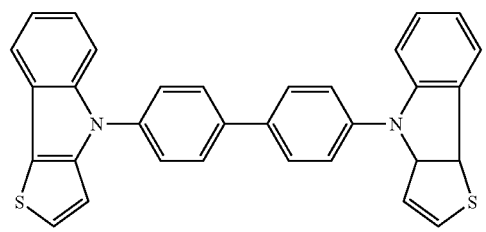 |
|----|----|
| 77 | 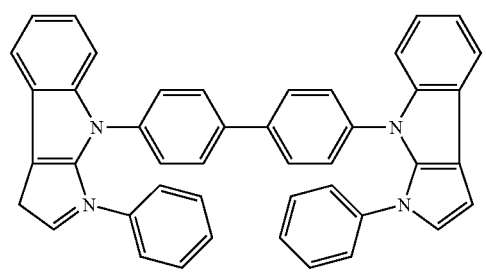 |
| 78 | 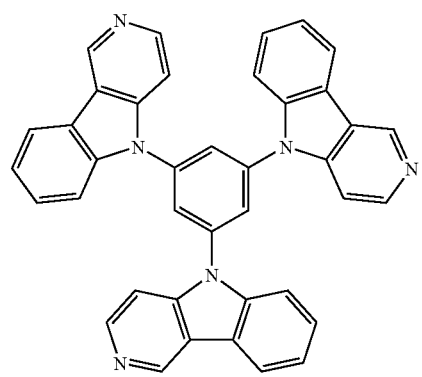 |
| 79 | 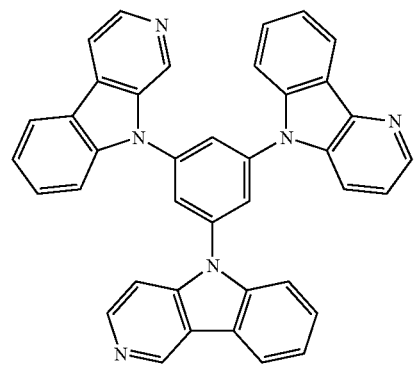 |

-continued
80
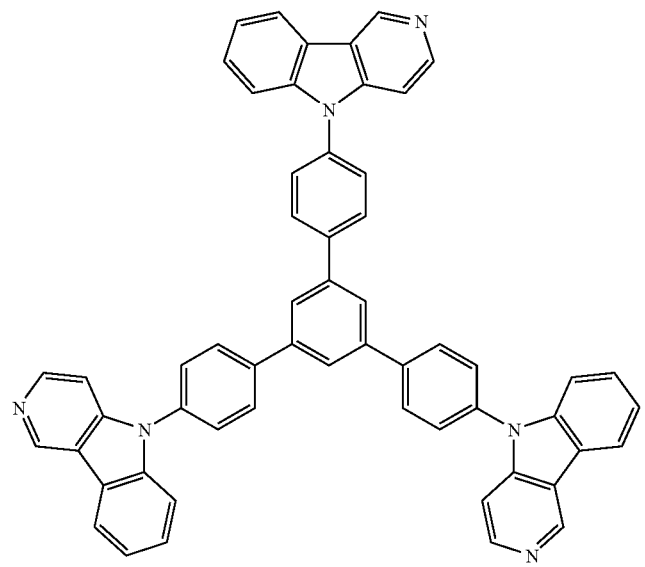
81
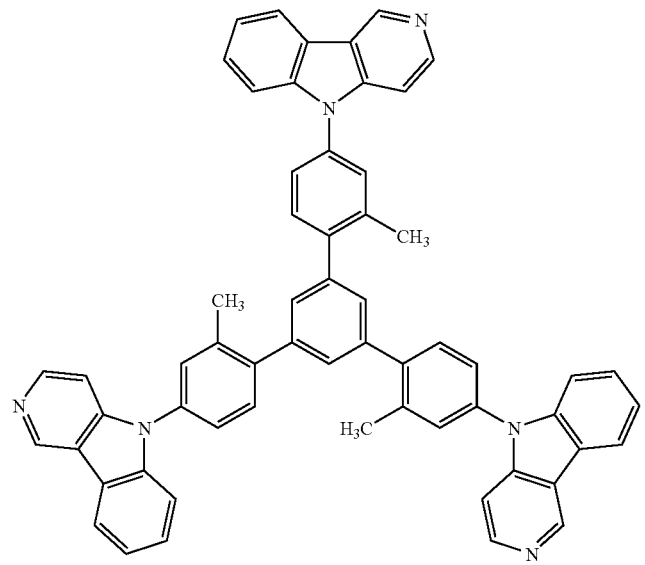

-continued
82
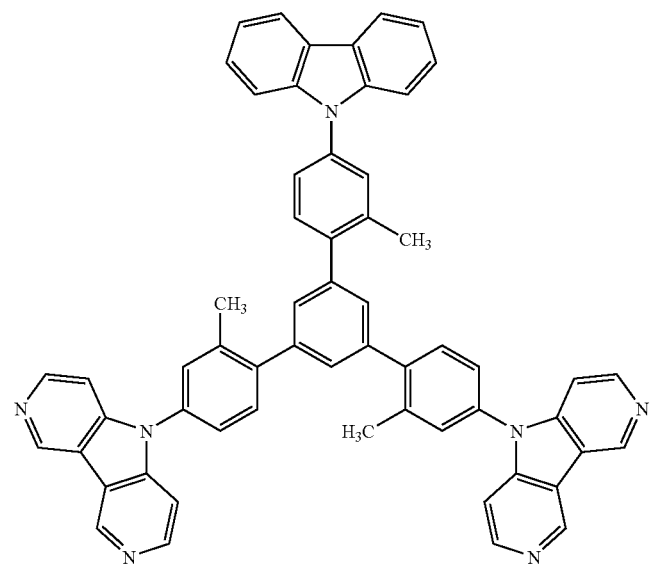
83
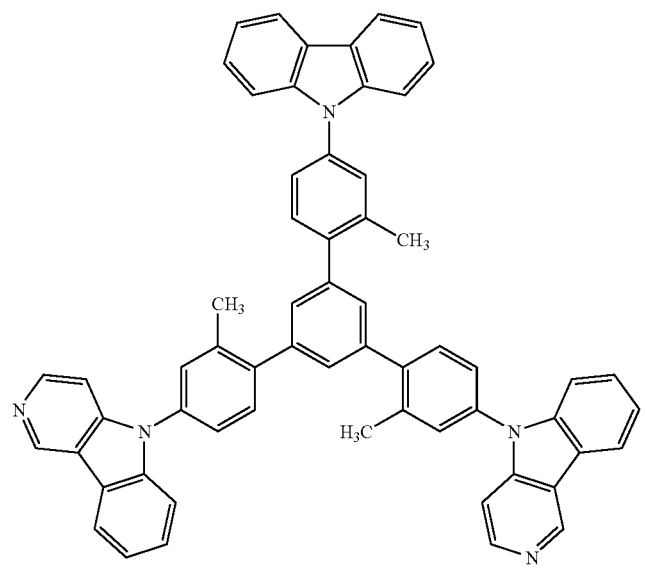
84
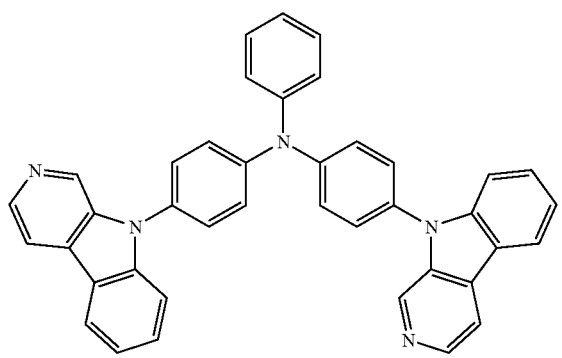

-continued
85
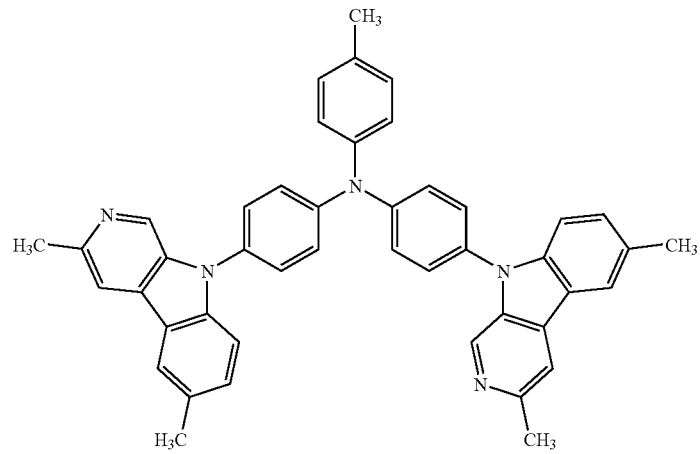
86
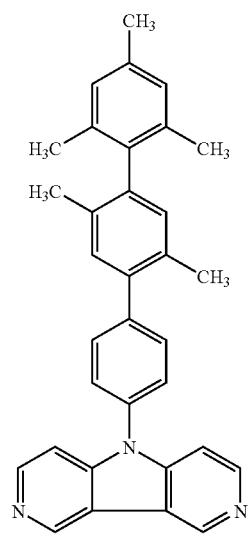
87
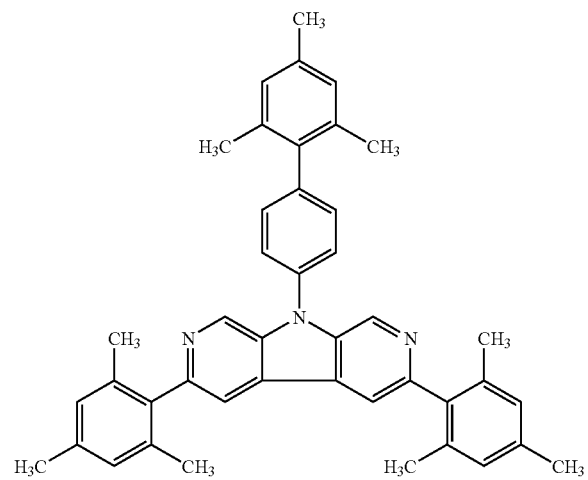

-continued
88
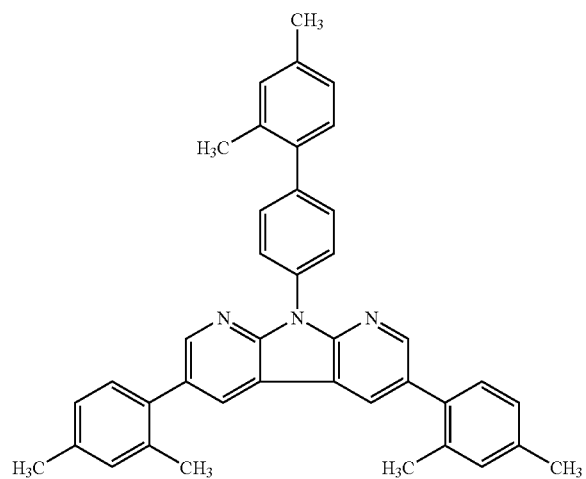
89
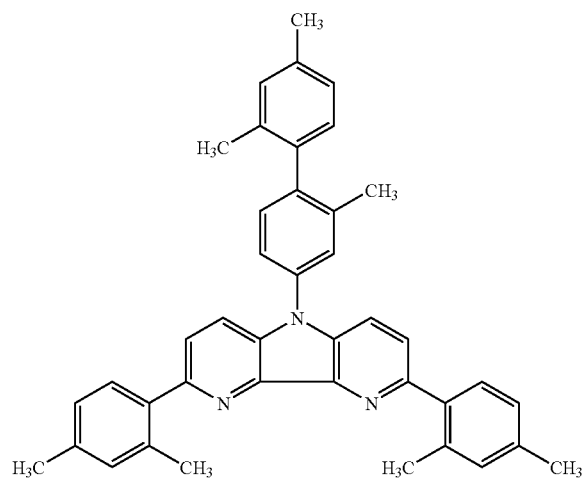
90
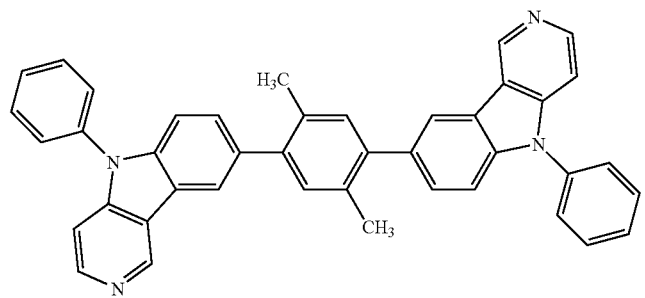

-continued
91
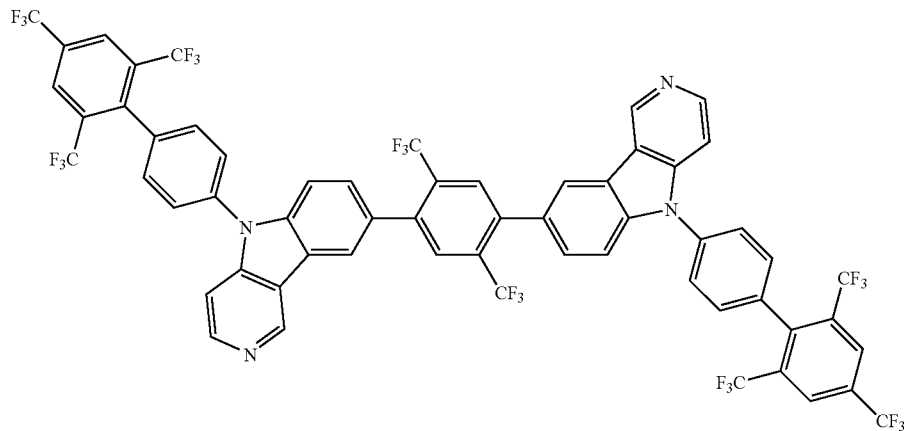
92
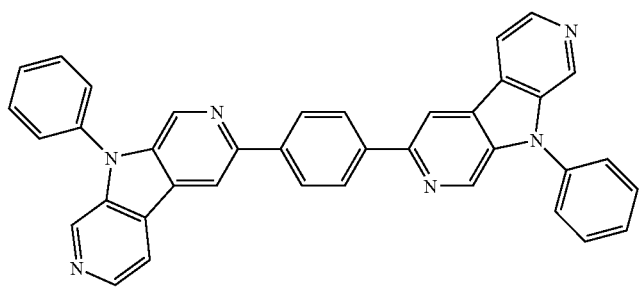
93
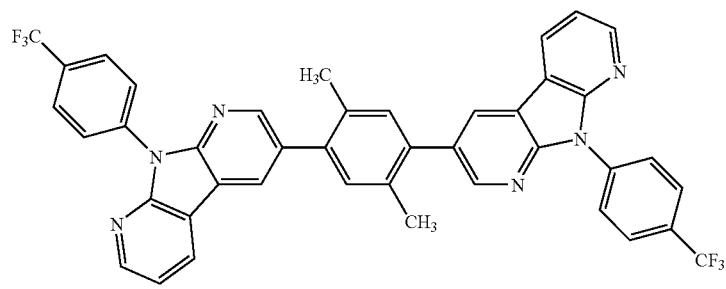
94
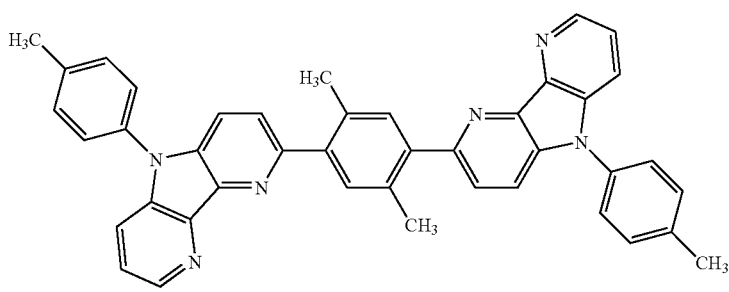
95
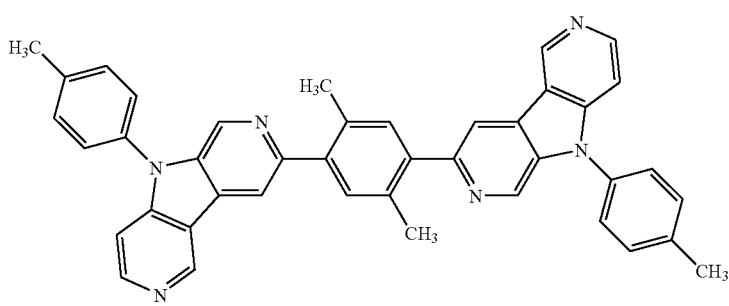

-continued
96 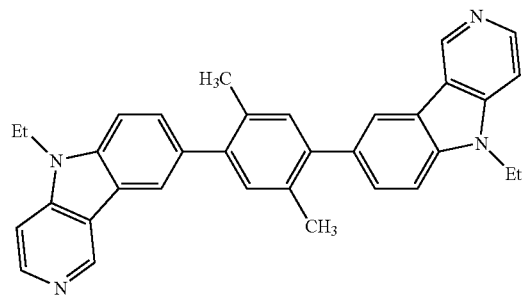
97 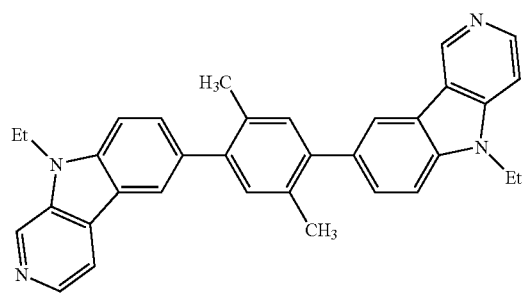
98 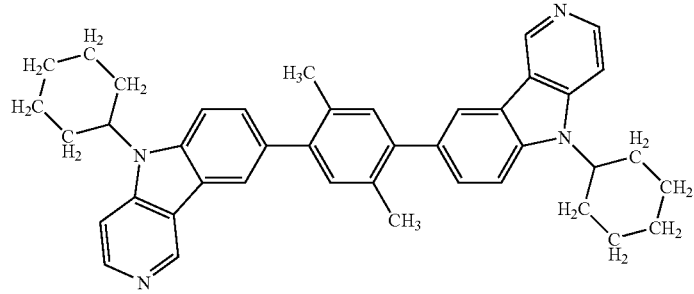
99 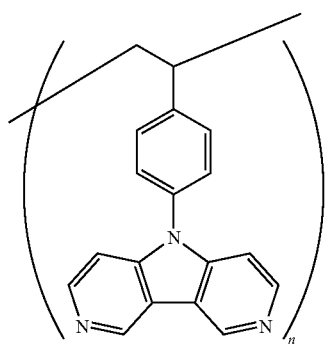
100 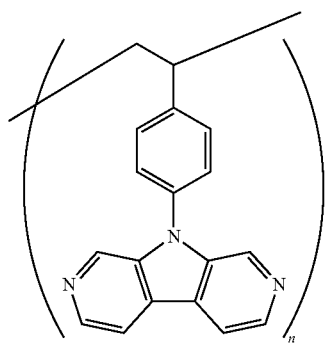

-continued
101 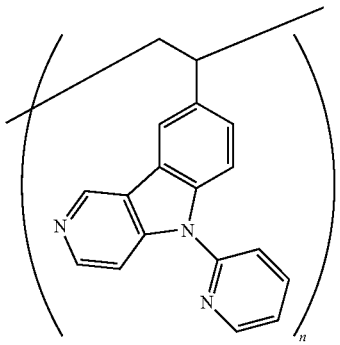
102 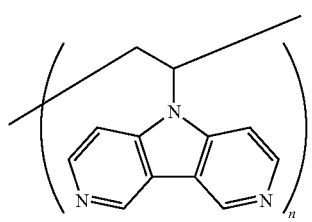
103 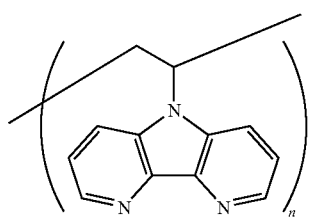
104 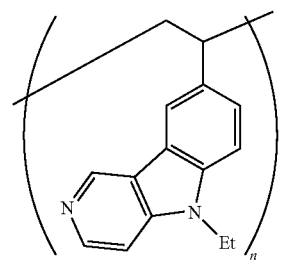
105 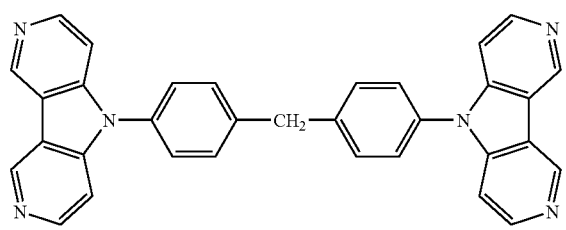
106 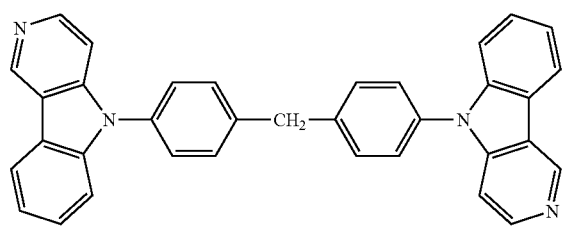

-continued
107
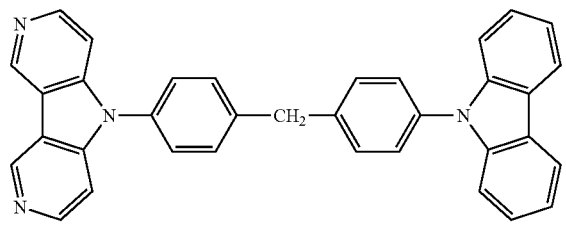
108
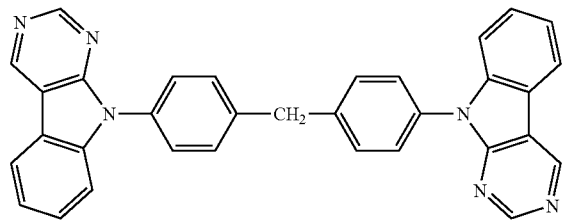
109
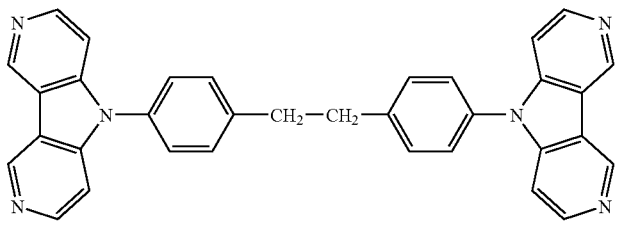
110
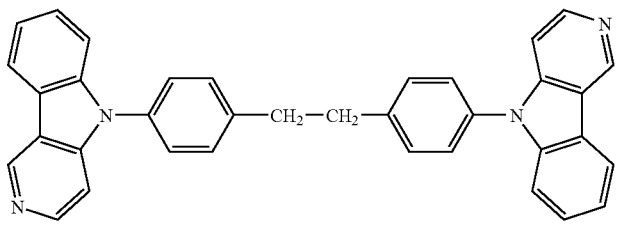
111
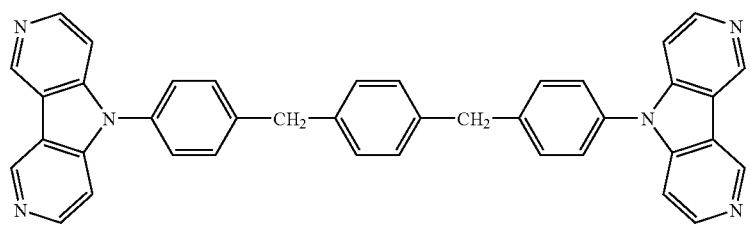
112
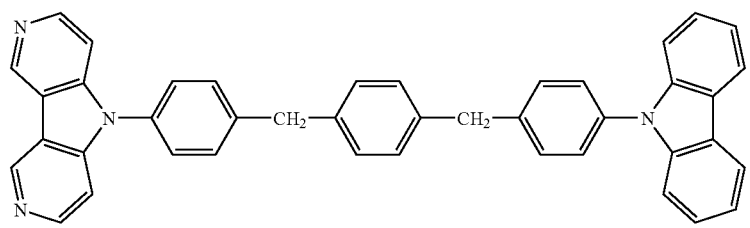
113
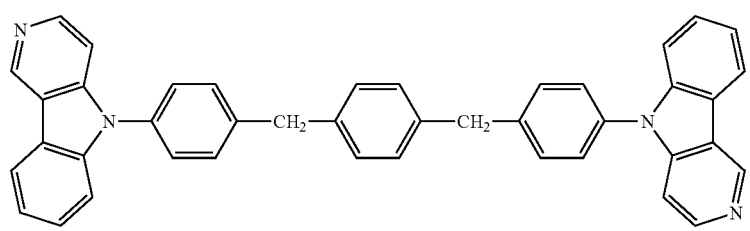

| | |
|---|---|
| 114 | 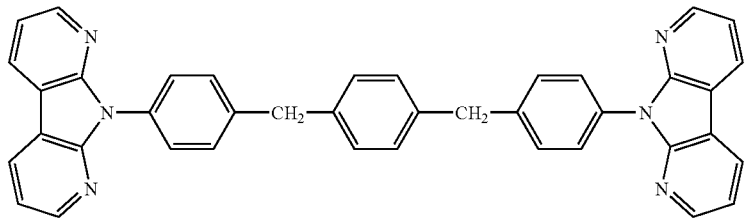 |
| 115 | 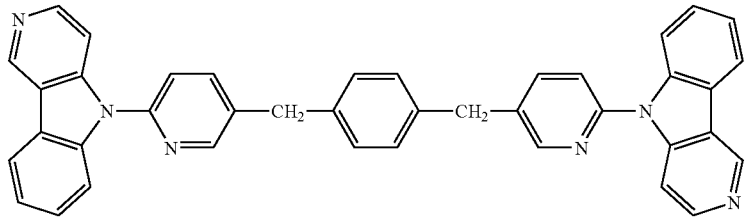 |
| 116 | 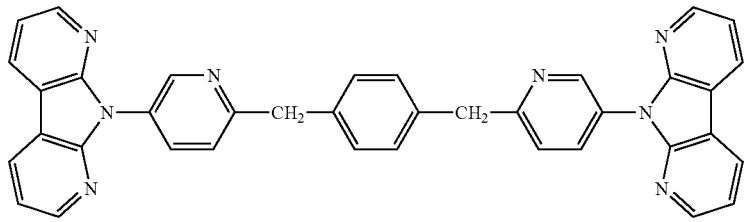 |
| 117 | 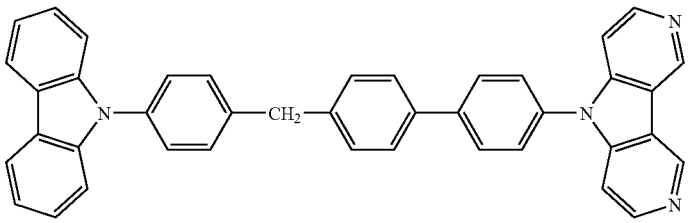 |
| 118 | 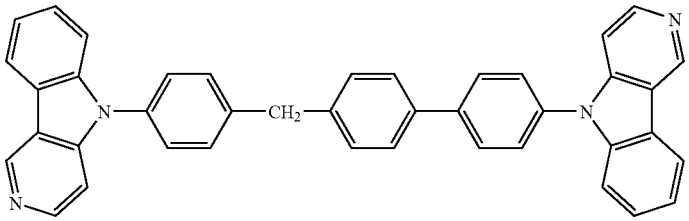 |
| 119 | 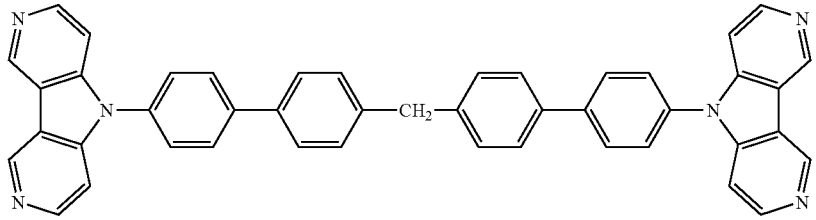 |
| 120 | 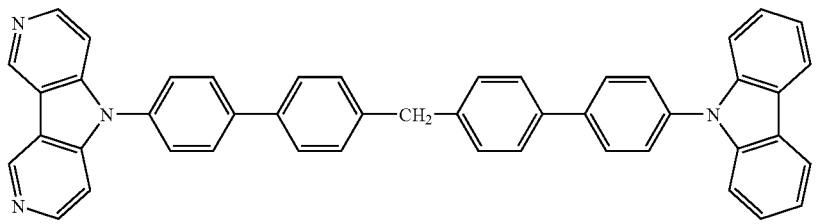 |

-continued
121 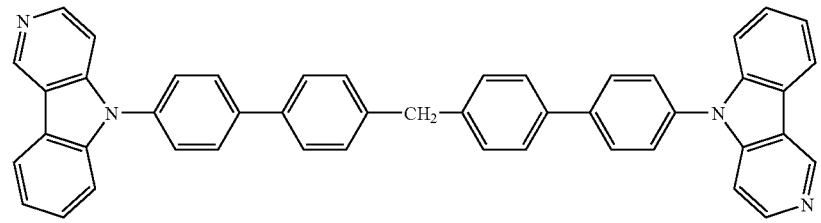
122 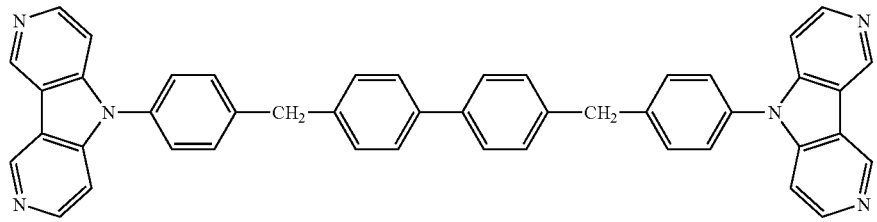
123 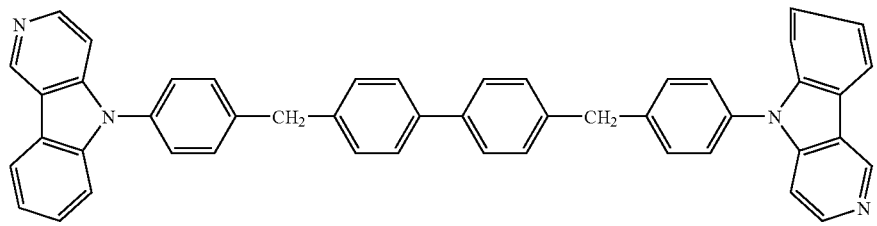
124 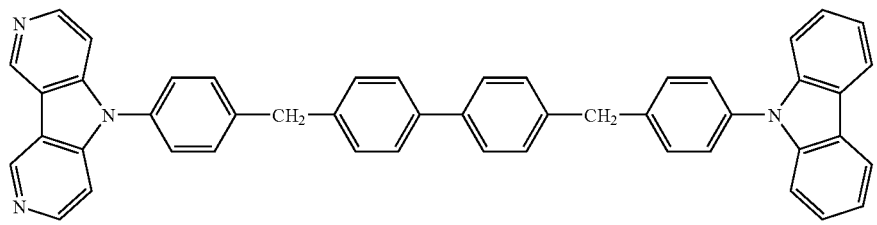
125 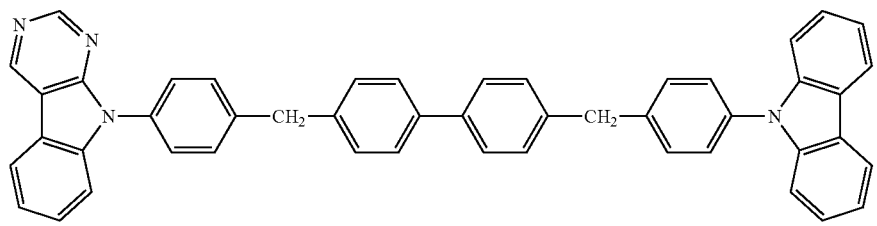
126 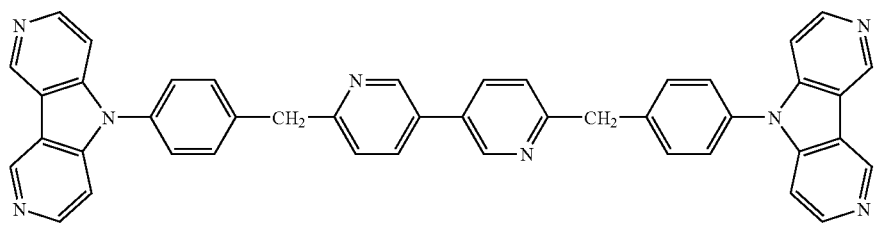
127 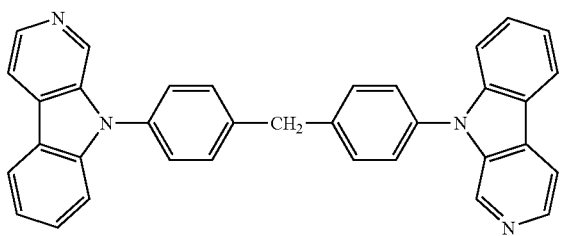

-continued
128 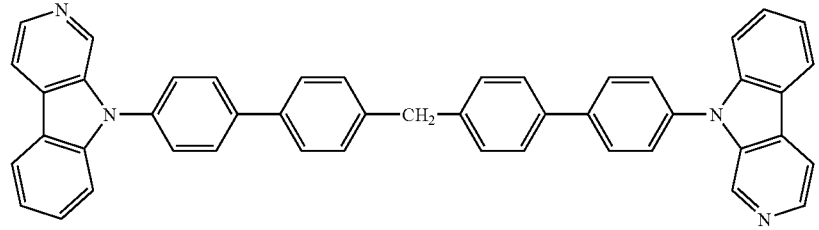
129 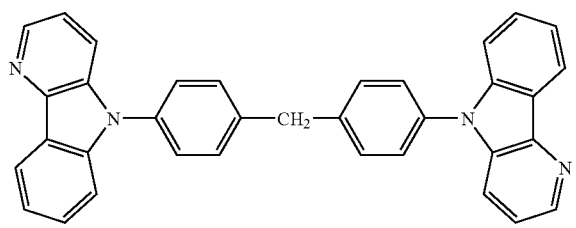
130 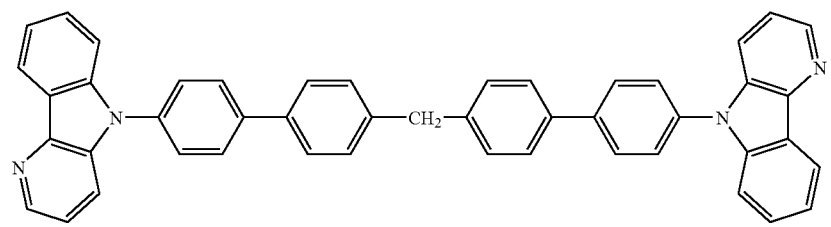
131 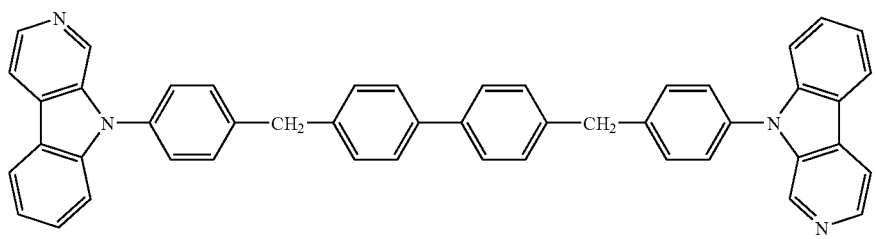
132 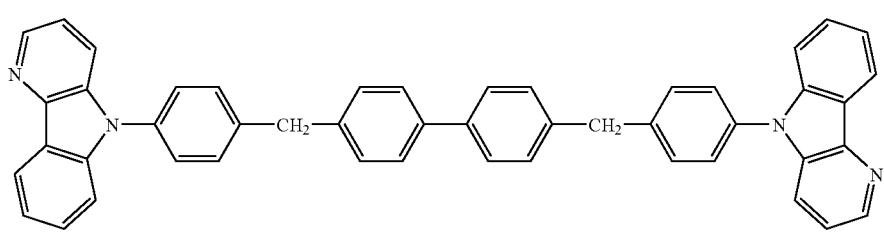
133 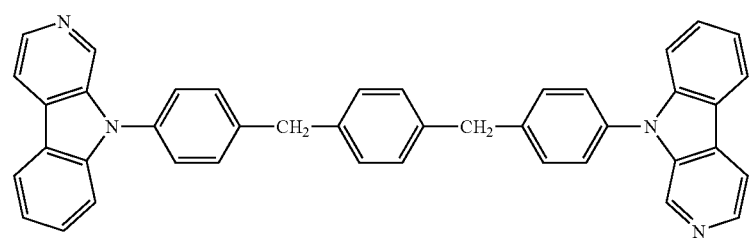

134 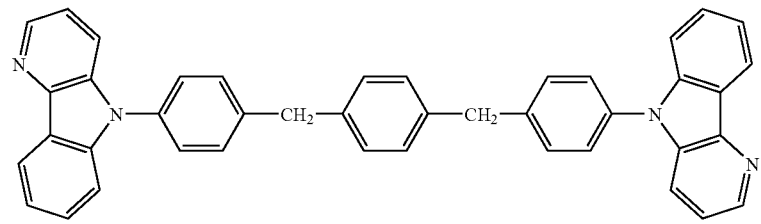
135 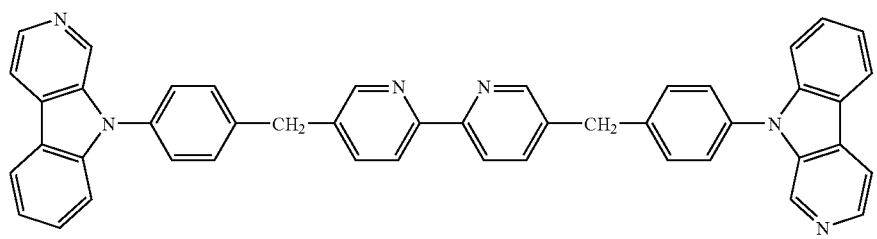
136 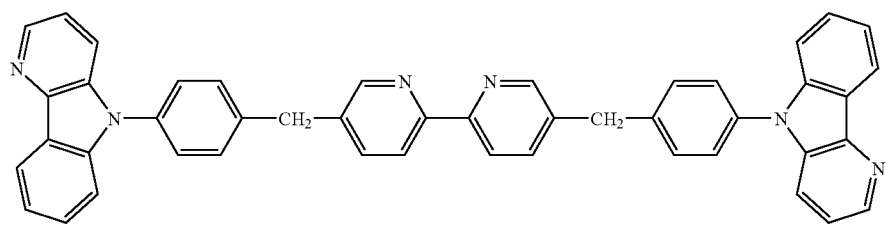
137 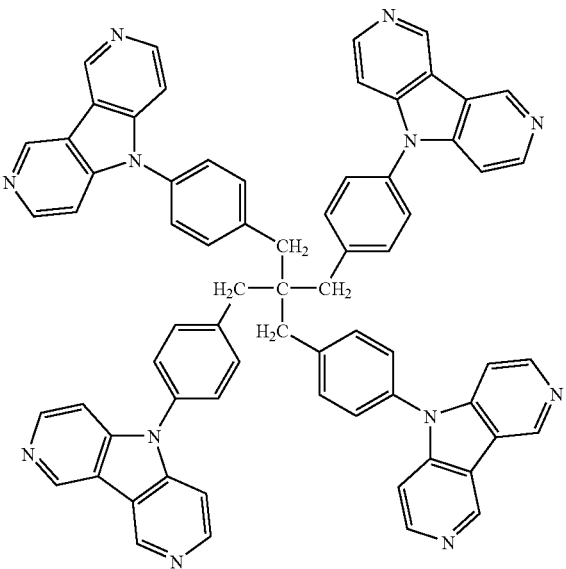

-continued
138
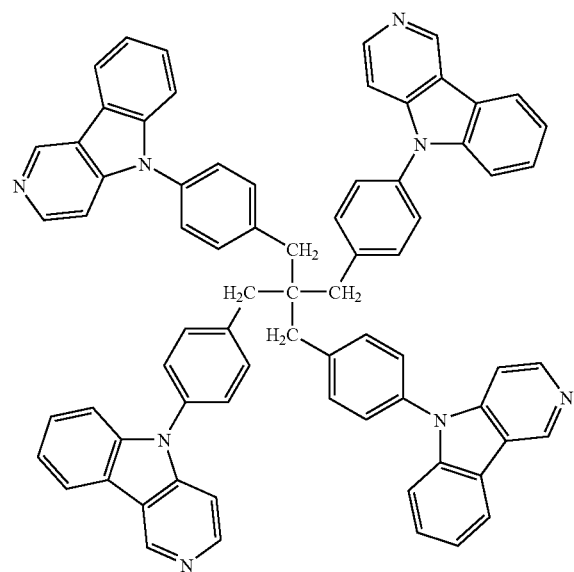
139
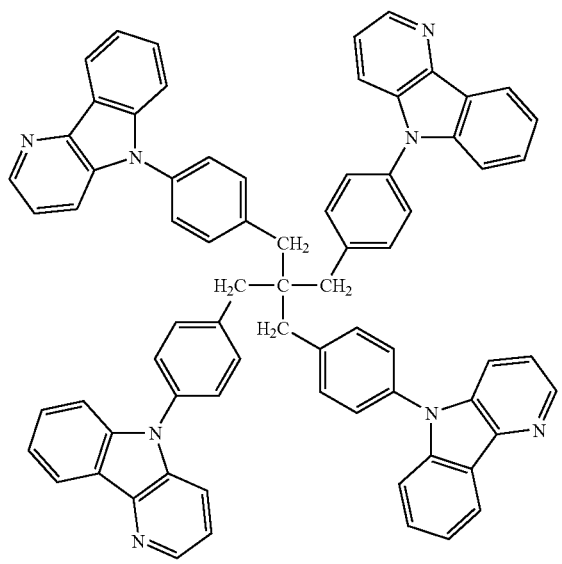

140
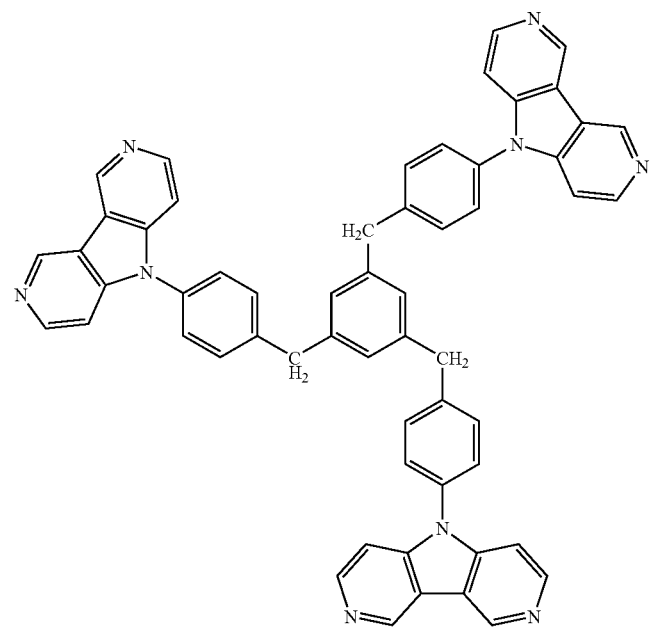
141
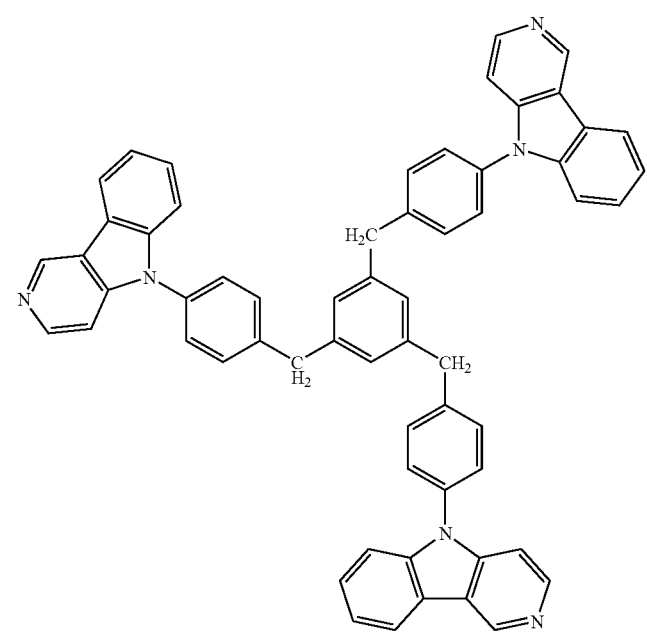

-continued
142
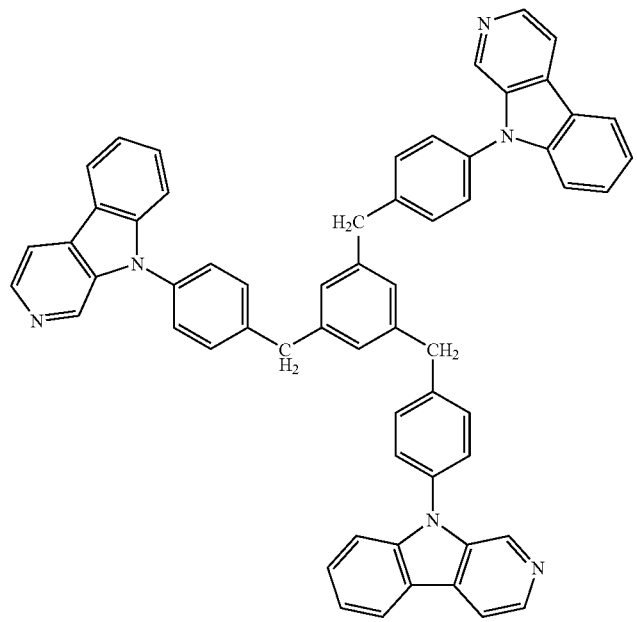
143
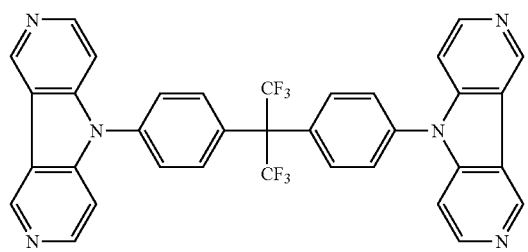
144
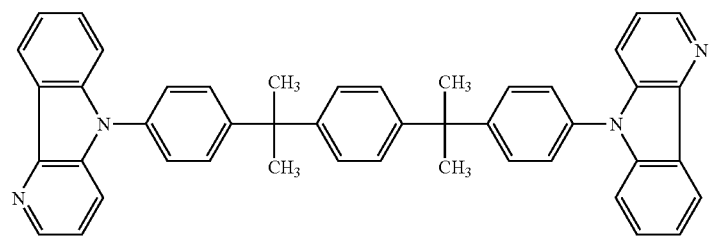
145
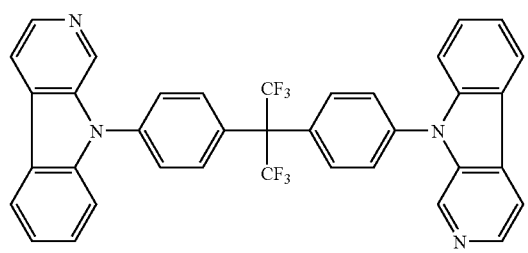
146
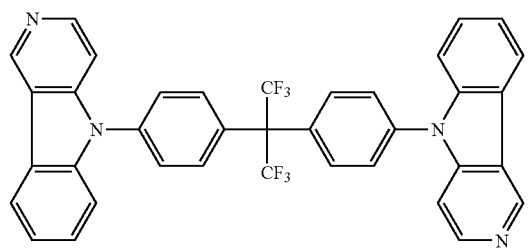

-continued
147
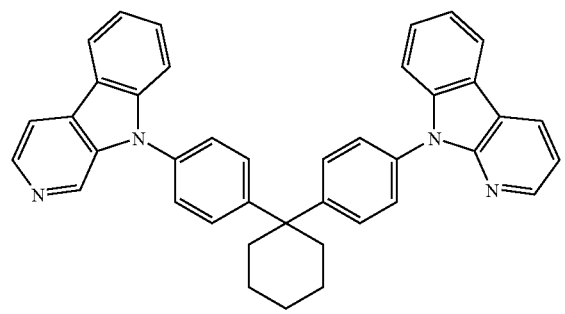
148
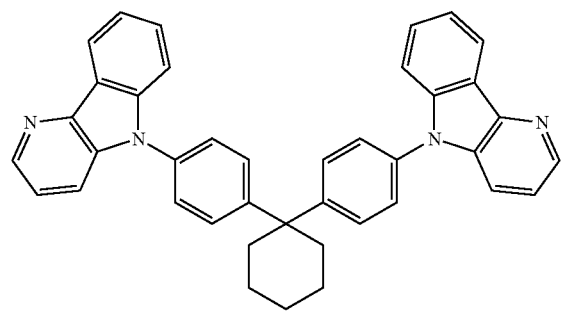
149
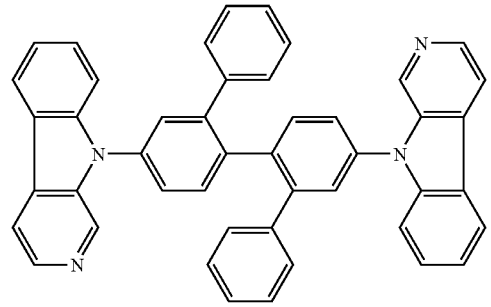
150
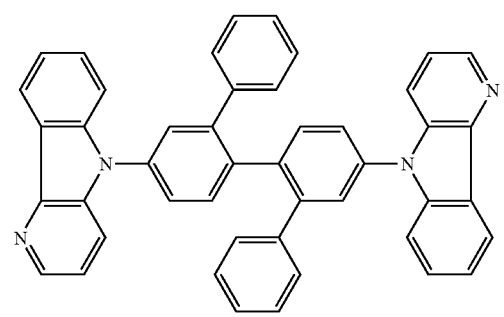
151
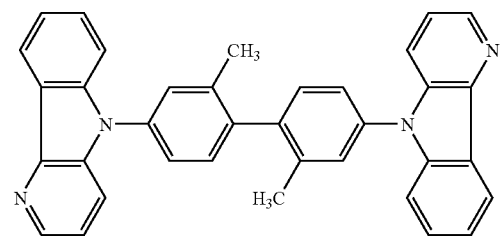

-continued
152
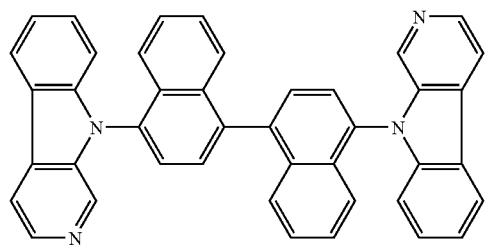
153
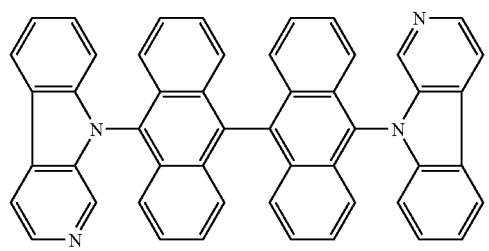
154
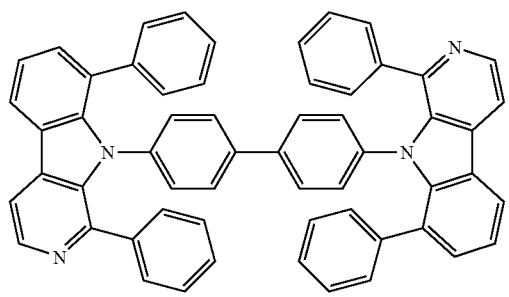
155
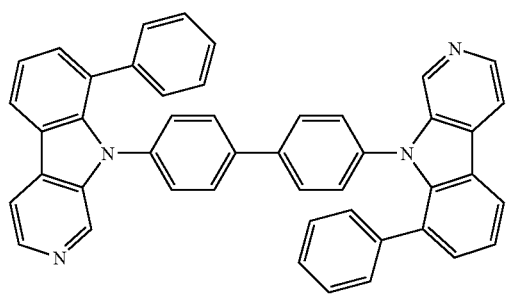
156
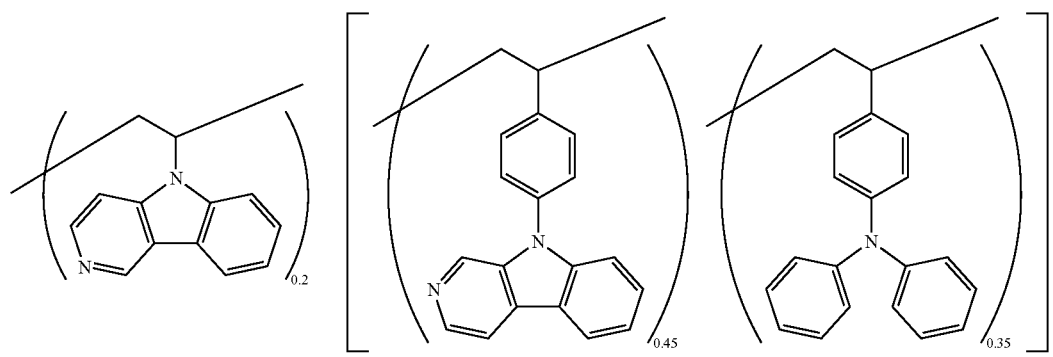

-continued
157
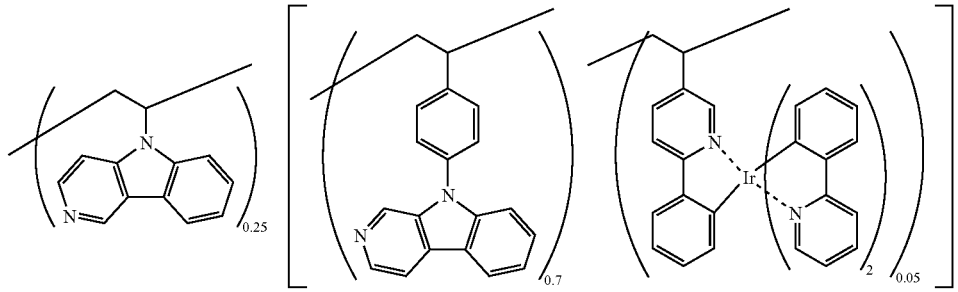
158
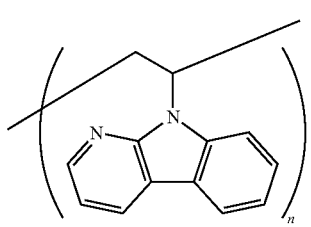
159
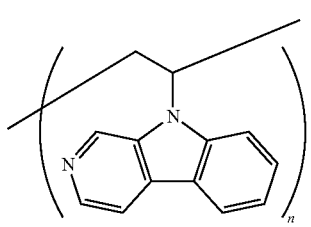
160
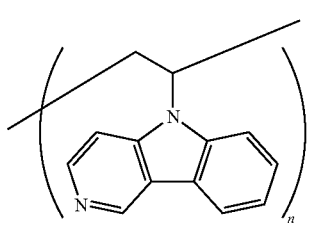
161
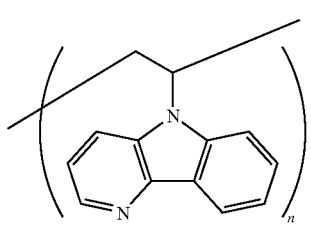
162
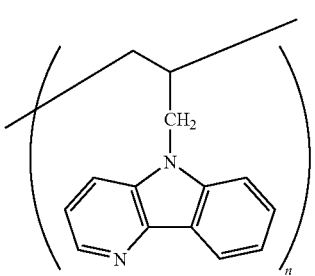

163
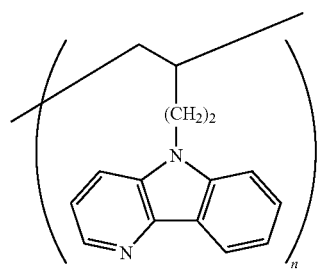
164
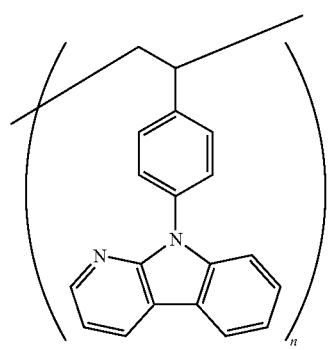
165
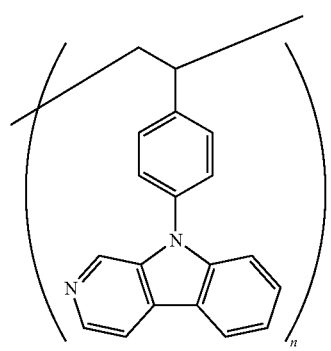
166
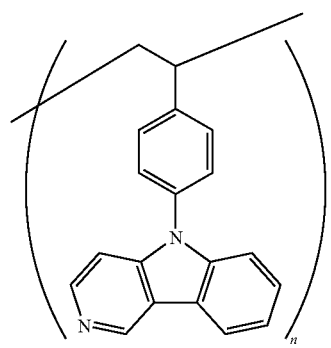

-continued
167
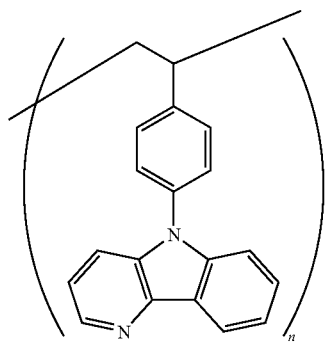
168
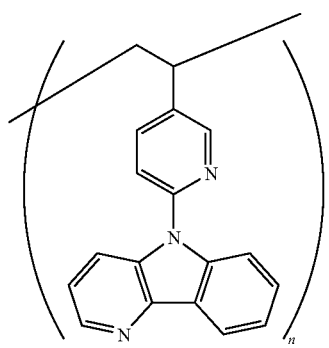
169
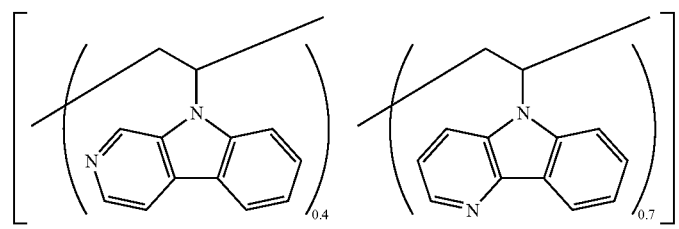
170
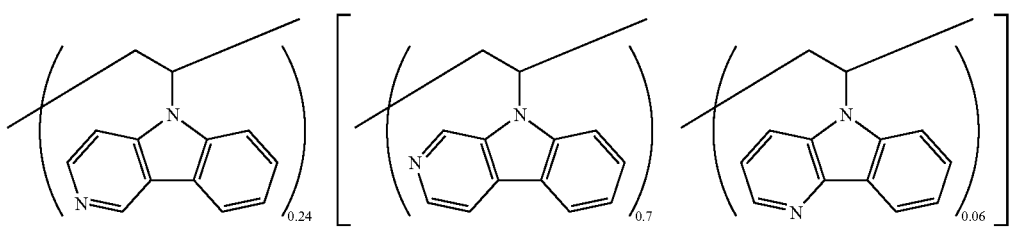
171
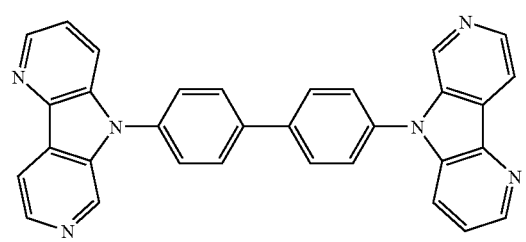

-continued
172 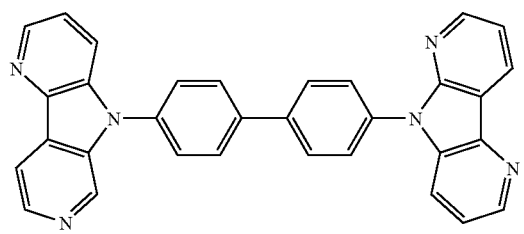
173 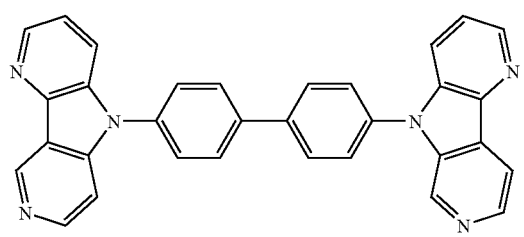
174 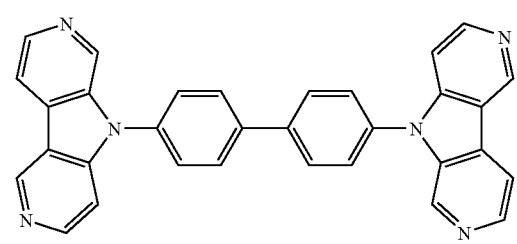
175 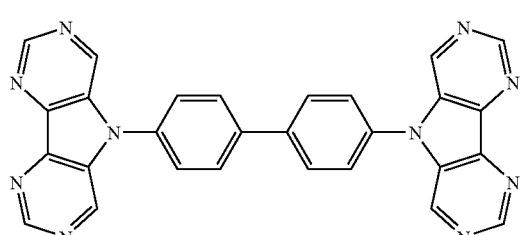
176 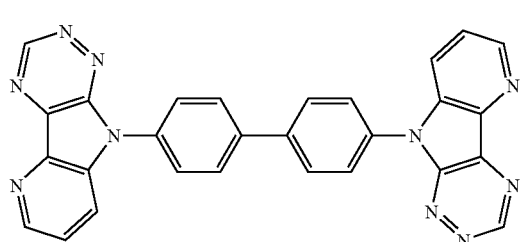
177 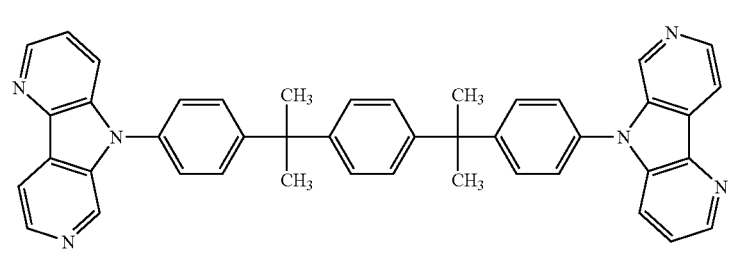

-continued
178 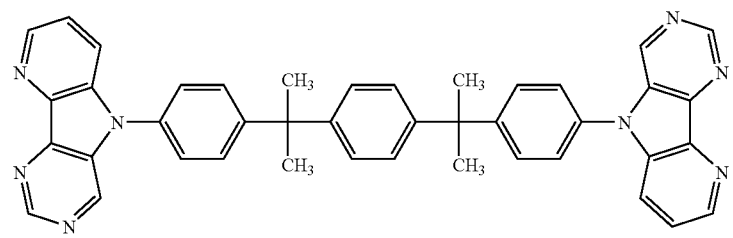
179 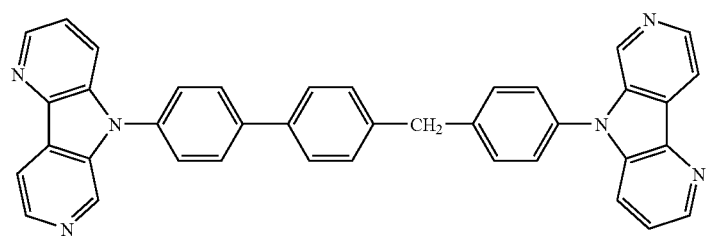
180 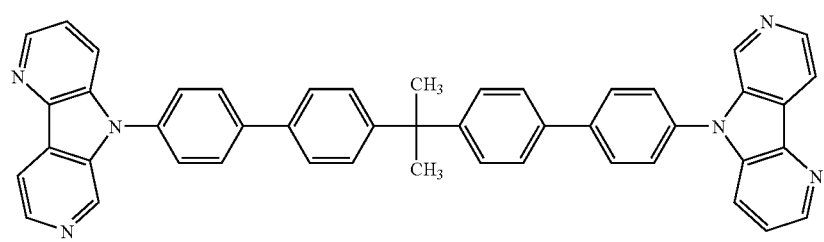
181 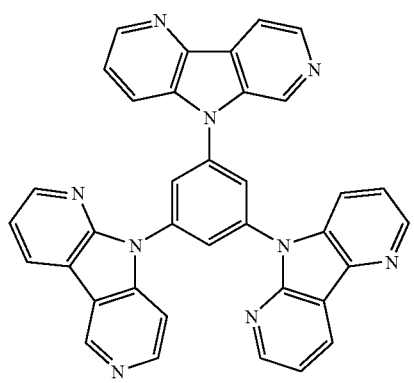
182 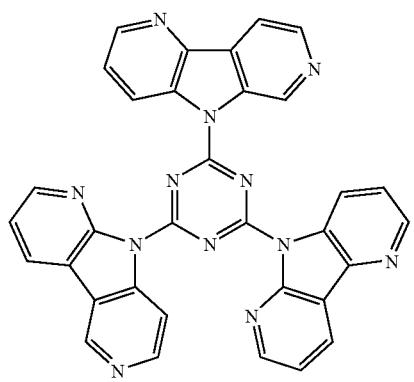

-continued
183
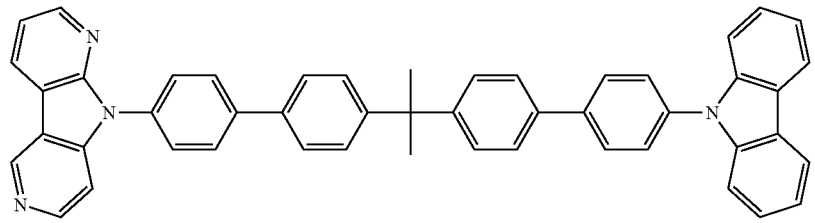
184
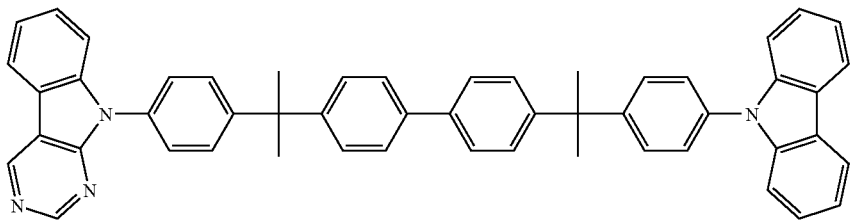
185
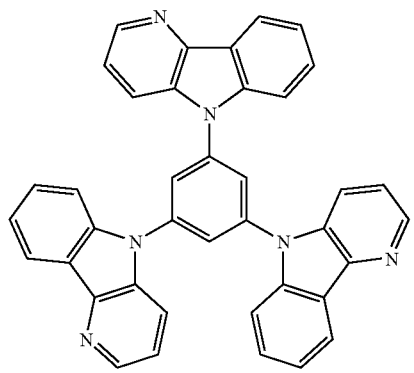
186
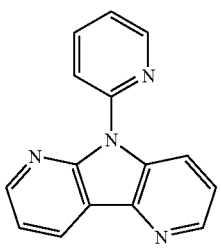
187
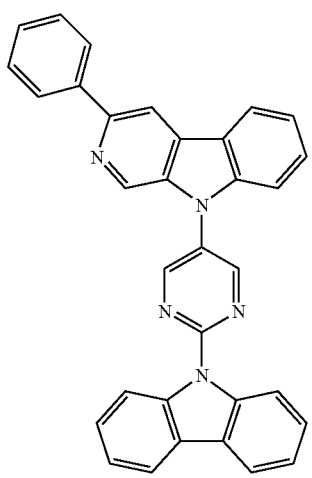

188

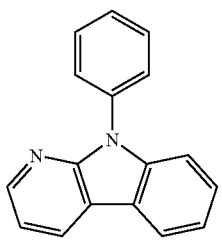

In the following, typical compounds relating the present invention or typical examples of preparation method of the compounds relating the present invention will be described, however, the present invention is not limited thereto.

<<Preparation of Exemplified Compound 73>>

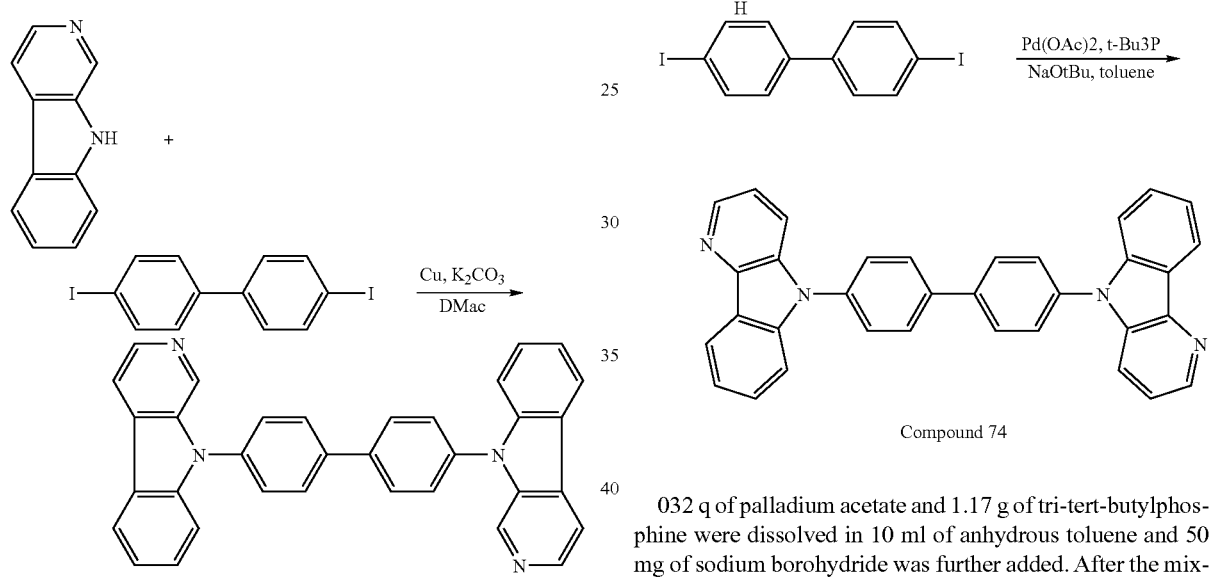

In a mixed solution of 50 ml of N,N-dimethylacetamide, 6.87 g of 4,4'-diiodobiphenyl and 6.00 g of β-carboline, 4.5 g of copper powder and 7.36 g of potassium carbonate were added, and then heat reflux was carried out for 15 hours. After standing to cool, water and chloroform were added, and the insoluble portion was removed by filtering. Then, the organic layer was separated, washed by water and saturated sodium chloride solution, and condensed under reduced pressure. The obtained residue was dissolved in acetic acid, treated with activated carbon, and recrystallized to obtain 4.2 g of colorless crystals of the exemplified compound 73.

The structure of the exemplifying compound 73 was identified with $^1$H-NMR spectrum and mass spectroscopy analysis. The property data and spectrum data of the exemplified compound 73 are shown below.

A colorless crystal, melting point: 200° C.

MS (FAB) m/z: 487 (M$^{+1}$)

$^1$H-NMR (400 MHz, CDCl$_3$): δ/ppm 7.3-7.5 (m, 2H), 7.5-7.6 (m, 4H), 7.7-7.8 (m, 4H), 7.9-8.0 (m, 4H), 8.06 (d, J=5.1 Hz, 2H), 8.24 (d, J=7.8 Hz, 2H), 8.56 (d, J=5.1 Hz, 2H), 8.96 (s, 2H)<

<Preparation of Exemplified Compound 74>>

Compound 74

032 q of palladium acetate and 1.17 g of tri-tert-butylphosphine were dissolved in 10 ml of anhydrous toluene and 50 mg of sodium borohydride was further added. After the mixture was agitated for 10 minutes at room temperature, 5.00 g of δ-carboline, 5.87 g of 4,4'-diiodobiphenyl and 3.42 g of sodium-tert-butoxide were added and dispersed in 50 ml of anhydrous xylene, and agitated for 10 hours at the reflux temperature under a nitrogen atmosphere. After standing the reaction mixture to cool, chloroform and water were added, and the organic layer was separated. The organic layer was washed with water and a saturated sodium chloride solution, and condensed under reduced pressure. The obtained residue was dissolved in tetrahydrofuran, treated with activated carbon, and recrystallized to obtain 5.0 g of colorless crystals of the exemplified compound 74.

The structure of the exemplifying compound 74 was identified with $^1$H-NMR spectrum and mass spectroscopy analysis. The property data and spectrum data of the exemplified compound 74 are shown below.

MS (FAB) m/z: 487 (M$^{+1}$)

$^1$H-NMR (400 MHz, CDCl$_3$): δ/ppm 7.37 (dd, J=4.7 Hz, J=8.3 Hz, 2H), 7.4-7.5 (m, 2H), 7.5-7.6 (m, 4H), 7.7-7.8 (m, 4H), 7.81 (dd, J=1.2 Hz, J=8.3 Hz, 2H), 7.9-8.0 (m, 4H), 8.48 (d, J=7.8 Hz, 2H), 8.65 (dd, J=1.2 Hz, J=4.6 Hz, 2H)

<<A Compound of the Exemplifying Compound 60>>

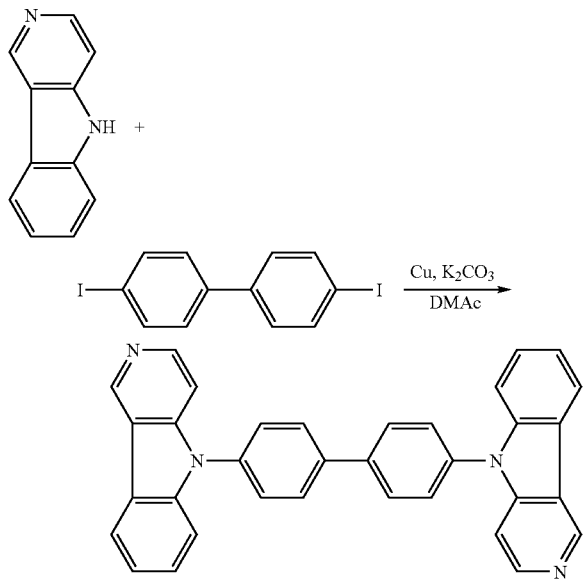

In a mixed solution of 50 ml of N,N-dimethylacetamide, 6.87 g of 4,4'-diiodobiphenyl and 6.00 g of γ-carboline, 4.5 g of copper powder and 7.36 g of potassium carbonate were added, and then heat reflux was carried out for 15 hours. After standing to cool, water and chloroform were added, and the insoluble portion was removed by filtering. Then, the organic layer was separated, washed by water and saturated sodium chloride solution, and condensed under reduced pressure. After the obtained residue was examined by a silica-gel chromatography, the residue was recrystallized in dichloromethane/cyclohexane to obtain 4.3 g of colorless crystals of the exemplified compound 60.

The structure of the exemplifying compound 60 was identified with $^1$H-NMR spectrum and mass spectroscopy analysis. The property data and spectrum data of the exemplified compound 60 are shown below.

MS (FAB) m/z: 487 (M$^{+1}$)

$^1$H-NMR (400 MHz, CDCl$_3$): δ/ppm 7.4-7.4 (m, 4H), 7.4-7.5 (m, 4H), 7.7-7.8 (m, 4H) 7.9-8.0 (m, 4H), 8.25 (d, J=7.8 Hz, 2H), 8.57 (d, J=5.6 Hz, 2H), 9.42 (s, 1H)

<<Synthesis of the Exemplified Compound 144>>

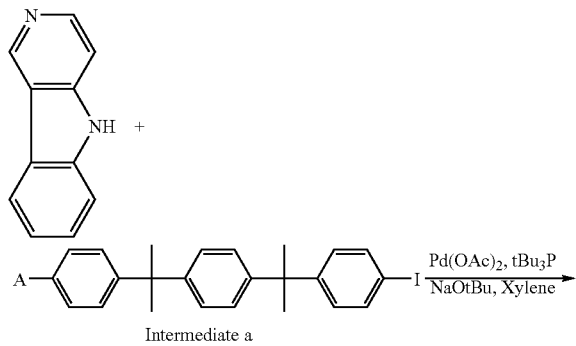

Intermediate a

-continued

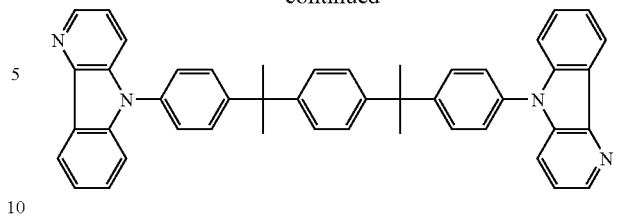

0.16 g of palladium acetate and 0.58 g of tri-tert-butyl phosphine were dissolved in 10 ml of anhydrous toluene, and 25 mg of sodium borohydride was added. After the mixture was agitated for 10 minutes at ambient temperature, 2.00 g of δ-carboline, 3.20 g of an intermediate a and 1.37 g of sodium-tert-butoxide were added and dispersed in 50 ml of anhydrous xylene followed by stirring at reflux temperature for 10 hours under a nitrogen atmosphere. After standing the product to cool, chloroform and water were added to separate an organic layer. The organic layer was washed by water and a saturated sodium chloride solution, and condensed under a reduced pressure. The residue was recrystallized in acetic acid, and 1.5 g of colorless crystal of the exemplified compound 144 was obtained.

The structure of the exemplified compound 144 was identified with a $^1$H-NMR spectrum and a mass spectroscopy. The spectrum data are as follows:

MS (FAB) m/z: 647 (M$^{+1}$) $^1$H-NMR (400 MHz, CDCl$_3$) δ/ppm 1.80 (S, 12H), 7.27 (S, 4H), 7.34 (dd, J=4.9 Hz, J=8.3 Hz, 2H), 7.3-7.4 (m, 2H), 7.4-7.5 (m, 12H), 7.76 (dd, J=1.3 Hz, J=8.3 Hz, 2H), 8.45 (d, J=7.8 Hz, 2H), 8.63 (dd, J=1.3 Hz, J=4.9 Hz, 2H)

<<Synthesis of the Exemplified Compound 143>>

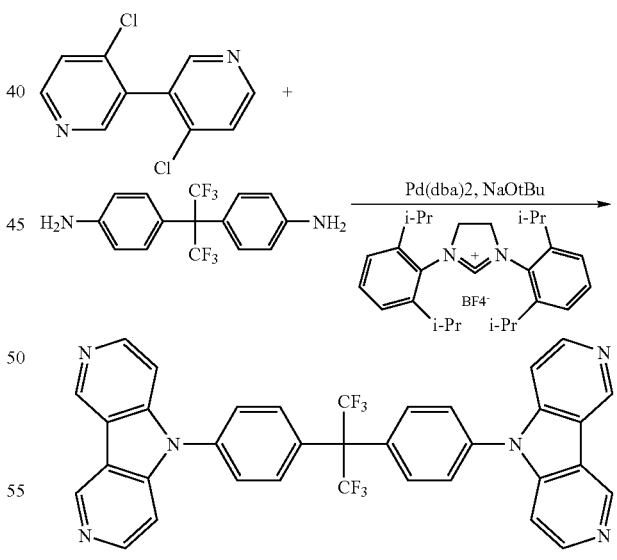

Compound 143

0.85 g of 4,4'-dichloro-3,3'-bipyridyl, 0.59 g of diamine b, 44 mg of dibenzylideneacetone palladium, 36 mg of imidazolium salt, and 1.09 g of the sodium-tert-butoxide were added to 5 ml of dimethoxy ethane, and stirred for 24 hours at 80° C. After standing the product to cool, chloroform and water were added to separate an organic layer. The organic layer was washed by water and a saturated sodium chloride solution, and condensed under a reduced pressure. The residue was recrystallized in ethyl acetate, and 0.3 g of colorless crystal of the exemplified compound 143 was obtained.

The structure of the exemplified compound 143 was identified with a $^1$H-NMR spectrum and a mass spectroscopy. The spectrum data are as follows:

MS (FAB) m/z 639 ($M^{+1}$) $^1$H-NMR (400 MHz, $CDCl_3$): δ/ppm 7.46 (d, J=5.7 Hz, 4H), 7.6-7.7 (m, 4H), 7.8-7.9 (m, 4H), 8.67 (d, J=5.7 Hz, 4H), 9.51 (S, 4H)

<<Synthesis of the Exemplified Compound 145>>

The exemplified compound 145 was synthesized in the same manner as the exemplified compound 143, except that 3-(2-chlorophenyl)-4-chloropyridine was used, which is a compound prepared by replacing one of the pyridine rings of 4,4'-dichloro-3,3'-bipyridyl with benzene.

The structure of the exemplified compound 145 was identified with a $^1$H-NMR spectrum and a mass spectroscopy. The spectrum data of the exemplified compound 145 are as follows:

MS (FAB) m/z 637 ($M^{+1}$) $^1$H-NMR (400 MHz, $CDCl_3$): δ/ppm 7.3-7.4 (m, 2H), 7.6-7.7 (m, 4H), 7.7-7.8 (m, 4H), 7.8-7.9 (m, 4H), 8.06 (d, J=5.3 Hz, 2H), 8.23 (d, J=7.8 Hz, 2H), 8.56 (d, J=5.3 Hz, 2H), 8.96 (S, 2H)

In addition to the above-mentioned synthetic example, an azacarbazole ring of these compounds and its analog may be synthesized according to: J. Chem. Soc., Perkin Trans., 1, 1505-1510 (1999), Pol. J. Chem., 54, 1585 (1980), and Tetrahedron Lett., 41 (2000), 481-484. Introduction of a core or a linking group, for example, an aromatic ring, a heterocyclic ring or an alkyl group into synthesized azacarbazole ring or its analog may be carried out by means of a well known method, such as an Ullman coupling, a coupling which used the Pd catalyst, or the Suzuki coupling.

The compound of the present invention preferably has the molecular weight of not less than 400, more preferably not less than 450, further preferably not less than 600 and specifically preferably not less than 800, whereby the glass transition temperature and the stability of the compound are increased, and a longer life of the organic EL element is obtained.

The compound of the present invention is used as a constituent of the constituting layers of the organic EL element which will be described later. In the constituting layers of the organic EL element of the present invention, the compound of the present invention is preferably contained in the light emitting layer or in the electron transporting layer (in the electron transporting layer, the compound is used as a hole blocking material), more preferably in the light emitting layer, and specifically preferably as a host compound in the light emitting layer. The compound of the present invention may also be used in other constituting layer of the organic EL element if necessary, to control a variety of properties of the organic EL element.

The compounds of the present invention are used as materials for the organic EL element (for example, a back light, a flat panel display, a light source of an illumination, a display device, a light source for electrophotography, a recording light source, an exposure light source, a reading light source, a sign, a signboard, an interior, an optical-transmission device). Examples of other usage include extended fields such as: materials for an organic semiconductor laser (for example, a recording light source, an exposure light source, a reading light source, an optical transmission device and a light source for electrophotography); materials for a photorecepter for electrophotography; materials for an organic TFT element (for example, an organic memory device, an organic operation device, an organic switching element); materials for an organic wavelength converter; and materials for a photoelectric conversion device (for example, a solar cell, a photosensor).

The constituting layers of the organic EL element of the present invention will be explained below in details.

Preferred examples of the constituting layers of the organic EL element of the present invention will be shown below, however, the present invention is not limited thereto.

(i): Anode/Light emitting layer/Electron transporting layer/Cathode (ii): Anode/Hole transporting layer/Light emitting layer/Electron transporting layer/Cathode (iii): Anode/Hole transporting layer/Light emitting layer/Hole blocking layer/Electron transporting layer/Cathode (iv): Anode/Hole transporting layer/Light emitting layer/Hole blocking layer/Electron transporting layer/Cathode buffering layer/Cathode (v): Anode/Anode buffering layer/Hole transporting layer/Light emitting layer/Hole blocking layer/Electron transporting layer/Cathode buffering layer/Cathode <<Anode>>

For the anode of the organic EL element, a metal, an alloy, or an electroconductive compound each having a high working function (not less than 4 eV), and mixture thereof are preferably used as the electrode material. Specific examples of such an electrode material include a metal such as Au, CuI and a transparent electroconductive material such as indium tin oxide (ITO), $SnO_2$, or ZnO. A material capable of forming an amorphous and transparent conductive layer such as IDIXO ($In_2O_3$—ZnO) may also be used. The anode may be prepared by forming a thin layer of the electrode material according to a depositing or spattering method, and by forming the layer into a desired pattern according to a photolithographic method. When required precision of the pattern is not so high (not less than 100 μm), the pattern may be formed by depositing or spattering of the electrode material through a mask having a desired form. When light is emitted through the anode, the transmittance of the anode is preferably 10% or more, and the sheet resistance of the anode is preferably not more than several hundred Ω/□. The thickness of the layer is ordinarily within the range of from 10 nm to 1 μm, and preferably from 10 to 200 nm, although it may vary due to kinds of materials used.

<<Cathode>>

On the other hand, for the cathode, a metal (also referred to as an electron injecting metal), an alloy, and an electroconductive compound each having a low working function (not more than 4 eV), and a mixture thereof are used as the electrode material. Specific examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as a deposition or spattering method. The sheet resistance as the cathode is preferably not more than several hundred Ω/□, and the thickness of the layer is ordinarily from 10 nm to 1 μm, and preferably from 50 to 200 nm. It is preferable in increasing the light emission efficiency that either the anode or the cathode of the organic EL element is transparent or semi-transparent.

After a layer of the metal described above as a cathode is formed to give a thickness of from 1 to 20 nm, a layer of the transparent electroconductive material as described in the anode is formed on the resulting metal layer, whereby a transparent or semi-transparent cathode can be prepared. Employing the cathode, an element can be manufactured in which both anode and cathode are transparent.

Next, an injecting layer, a blocking layer, and an electron transporting layer used in the component layer of the organic EL element of the present invention will be explained.

<<Injecting Layer: Electron Injecting Layer, Hole Injecting Layer>>

The injecting layer is optionally provided, for example, an electron injecting layer or a hole injecting layer, and may be provided between the anode and the light emitting layer or hole transporting layer, and between the cathode and the light emitting layer or electron transporting layer as described above.

The injecting layer herein referred to is a layer provided between the electrode and an organic layer in order to reduce the driving voltage or to improve of light emission efficiency. As the buffer layer there are a hole injecting layer (an anode buffer layer) and an electron injecting layer (a cathode buffer layer), which are described in "Electrode Material" pages 123-166, Div. 2 Chapter 2 of "Organic EL element and its frontier of industrialization" (published by NTS Corporation, Nov. 30, 1998) in detail.

The anode buffer layer (hole injecting layer) is described in, for example, JP-A Nos. 9-45479, 9-260062, and 8-288069, and its examples include a phthalocyanine buffer layer represented by a copper phthalocyanine layer, an oxide buffer layer represented by a vanadium oxide layer, an amorphous carbon buffer layer, a polymer buffer layer employing and an electroconductive polymer such as polyaniline (emeraldine) and polythiophene.

The cathode buffer layer (electron injecting layer) is described in, for example, JP-A Nos, 6-325871, 9-17574, and 10-74586, in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide. The buffer layer (injecting layer) is preferably very thin and has a thickness of preferably from 0.1 to 5 μm depending on kinds of the material used.

<<Blocking Layer: Hole Blocking Layer, Electron Blocking Layer>>

The blocking layer is a layer provided if necessary in addition to the fundamental component layers as described above, and is for example a hole blocking layer as described in JP-A Nos. 11-204258, and 11-204359, and on page 237 of "Organic EL element and its frontier of industrialization" (published by NTS Corporation, Nov. 30, 1998).

The hole blocking layer is an electron transporting layer in a broad sense, and is a material having an ability of transporting electrons, however, an extremely poor ability of transporting holes, which can increase a recombination probability of electrons and holes by transporting electrons while blocking holes.

The hole blocking layer of the organic EL element of the present invention is provided adjacent to the light emitting layer. In the present invention, the hole blocking layer preferably contains the above mentioned compounds relating the present invention as a hole blocking material, whereby an organic EL element exhibiting a higher emission efficiency is obtained, further an organic EL element exhibiting a longer life is obtained.

On the other hand, the electron blocking layer is an hole transporting layer in a broad sense, and is a material having an ability of transporting holes, however, an extremely poor ability of transporting electrons, which can increase a recombination probability of electrons and holes by transporting holes while blocking electrons.

<<Light Emitting Layer>>

The light emitting layer of the present invention is a layer where electrons and holes, injected from electrodes, an electron transporting layer or a hole transporting layer, are recombined to emit light. The portions where light emits may be in the light emitting layer or at the interface between the light emitting layer and the layer adjacent thereto.

(Host Compounds)

The light emitting layer of the present invention preferably contains a host compound and a phosphorescent compound (also referred to as a phosphorescent light emitting compound) which will be described later. In the present invention, the above described compounds relating to the present invention are preferably used as a host compound, whereby an organic EL element exhibiting higher emission efficiency is obtained. Further, other compounds besides the relating compounds to the present invention may also be used as a host compound. In the present invention, a host compound is defined as a compound of which the quantum yield of phosphorescent light emission is less than 0.01.

A plurality of known host compounds may also be used in combination. Use of a plurality of host compounds makes the control of the transfer of electrons possible, and an organic EL element exhibiting higher light emission efficiency is obtained. Also, use of a plurality of phosphorescent compounds makes it possible to mix different colors of emitted light, and an arbitrary color of emitted light is obtained. Emission of white light is possible by adjusting the types and amounts of doping of mixed phosphorescent compounds, whereby application of the organic EL element to an illuminator or a backlight is possible.

Among the known host compounds, preferable are the compounds having hole transporting ability, electron transporting ability, effect to prevent a shift of light emission to a longer wavelength side and a high Tg (a glass transition temperature).

Examples of the known host compounds include the compounds disclosed in the following documents:

JP-A No. 2001-257076, No. 2002-308855, No. 2001-313179, No. 2002-319491, No. 2001-357977, No. 2002-334786, No. 2002-8860, No. 2002-334787, No. 2002-15871, No. 2002-334788, No. 2002-43056, No. 2002-334789, No. 2002-75645, No. 2002-338579, No. 2002-105445, No. 2002-343568, No. 2002-141173, No. 2002-352957, No. 2002-203683, No. 2002-363227, No. 2002-231453, No. 2003-3165, No. 2002-234888, No. 2003-27048, No. 2002-255934, No. 2002-260861, No. 2002-280183, No. 2002-299060, No. 2002-302516, No. 2002-305083, No. 2002-305084, No. 2002-308837.

The light emitting layer may contain a host compound having a fluorescence maximum wavelength as a host compound. In this case, by a energy transfer from other host compound or a phosphorescent compound to a fluorescent compound, light emission from a host compound having a fluorescence maximum wavelength is obtained as the result of electroluminescence of an organic EL element. The host compound having a fluorescence maximum wavelength preferably has a high fluorescence quantum yield in the form of solution. Herein, the fluorescence quantum yield is preferably not less than 10%, and more preferably not less than 30%. Examples of the a host compound having a wavelength providing a fluorescence maximum wavelength include a coumarin dye, a cyanine dye, a chloconium dye, a squalenium dye, an oxobenzanthracene dye, a fluorescene dye, a rhodamine dye, a pyrylium dye, a perylene dye, a stilbene dye, and a polythiophene dye. The fluorescence quantum yield can be measured according to a method described in the fourth edition, Jikken Kagaku Koza 7, Bunko II, p. 362 (1992) published by Maruzen.

(Phosphorescent Compounds (Phosphorescent Light Emitting Compound))

A material used in the light emitting layer (hereinafter also referred to as light emitting material) preferably contains a phosphorescent compound together with the host compound described above, whereby an organic EL element exhibiting higher emission efficiency is obtained.

The phosphorescent compound in the present invention is a compound which emits light from the excited triplet, which can emit phosphorescence at room temperature (25° C.), and exhibits a phosphorescent quantum yield at 25° C. of not less than 0.01. The phosphorescent quantum yield at 25° C. is preferably not less than 0.1.

The phosphorescent quantum yield can be measured according to a method described in the fourth edition "Jikken Kagaku Koza 7", Bunko II, page 398 (1992) published by Maruzen. The phosphorescent quantum yield can be measured in a solution employing various kinds of solvents. The phosphorescent compound used in the present invention is a compound, in which the phosphorescent quantum yield measured employing any one of the solvents falls within the above-described range.

The light emission of the phosphorescent compound is divided in two types in principle, one is an energy transfer type in which recombination of a carrier occurs on the host to which the carrier is transported to excite the host, the resulting energy is transferred to the phosphorescent compound, and light is emitted from the phosphorescent compound, and the other is a carrier trap type in which recombination of a carrier occurs on the phosphorescent compound which is a carrier trap material, and light is emitted from the phosphorescent compound. However, in each type, energy level of the phosphorescent compound in excited state is lower than that of the host in excited state.

The phosphorescent compound is suitably selected from those used in the light emitting layer of an organic EL element known in the prior art.

The phosphorescent compound used in the present invention is preferably a metal complex containing a metal belonging to a group VIII of the periodic, and is more preferably an iridium compound, an osmium compound, a platinum compound (a platinum complex) or a rare earth compound, and most preferably an iridium compound.

Examples of the phosphorescent compound used in the present invention will be listed below, however, the present invention is not limited thereto. These compounds can be synthesized according to a method described in Inorg. Chem., 40, 1704-1711.

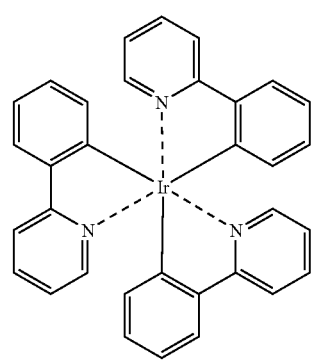

Ir-1

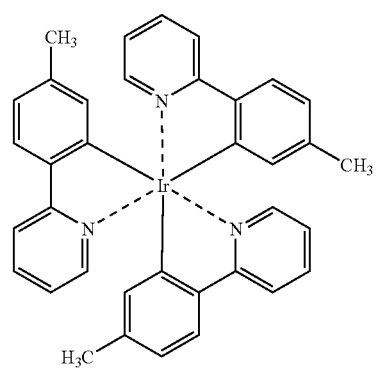

Ir-2

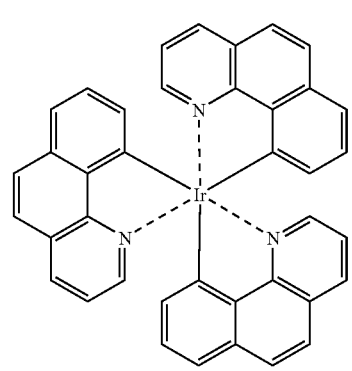

Ir-3

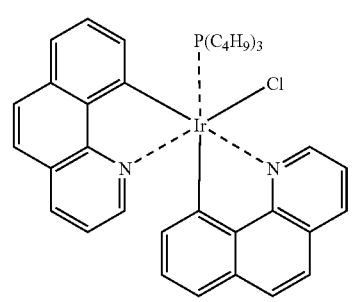

Ir-4

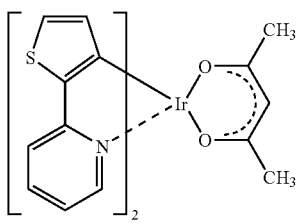
Ir-5
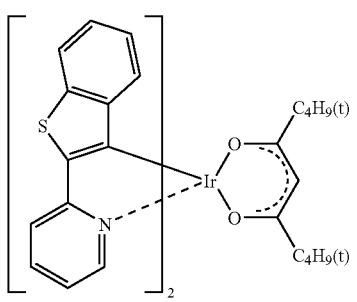
Ir-6
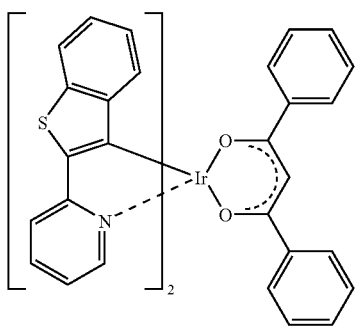
Ir-7
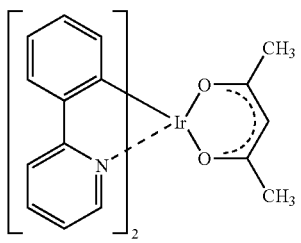
Ir-8
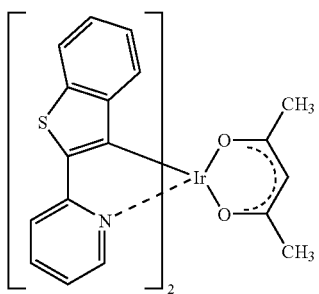
Ir-9
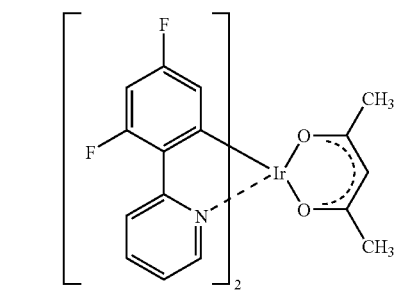
Ir-10
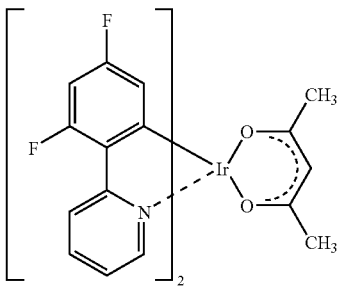
Ir-11
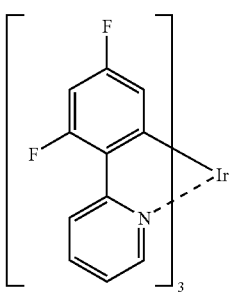
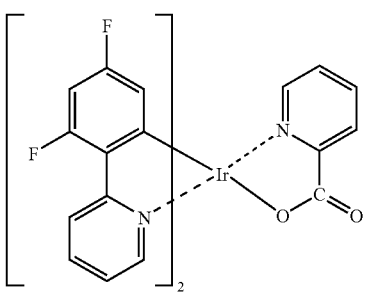
Ir-12
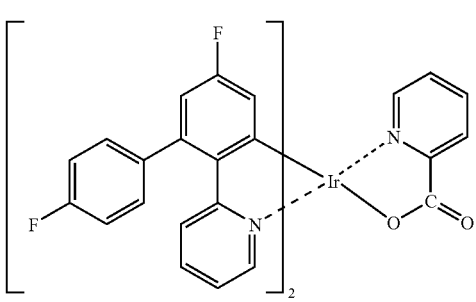
Ir-13
Pt-1

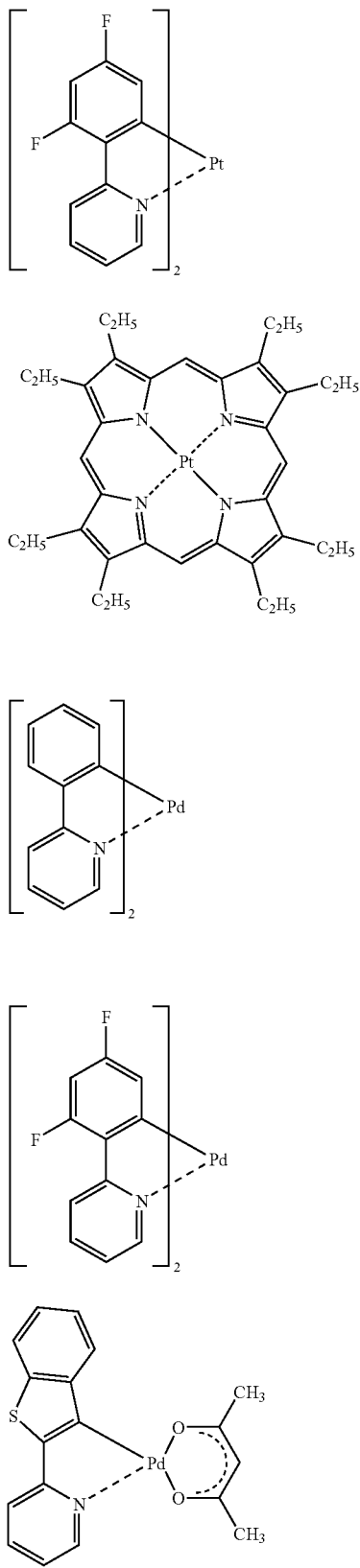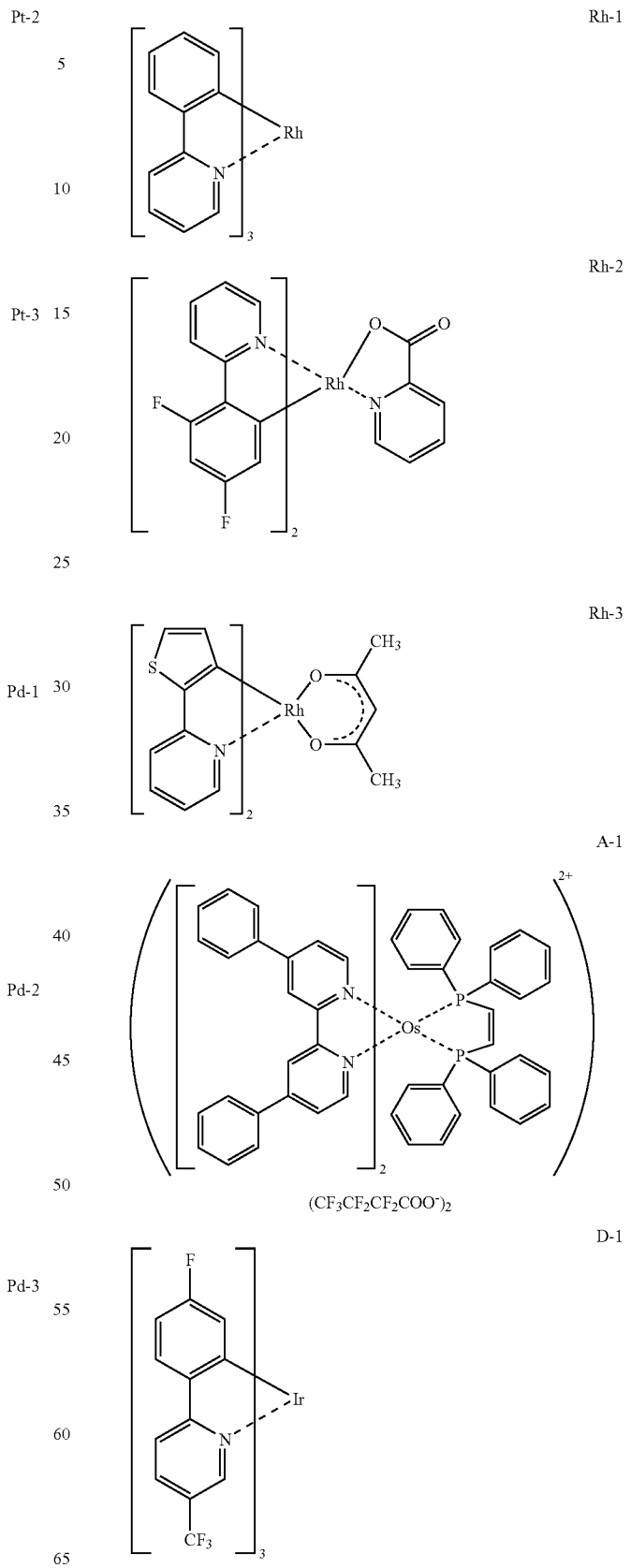

-continued

D-2
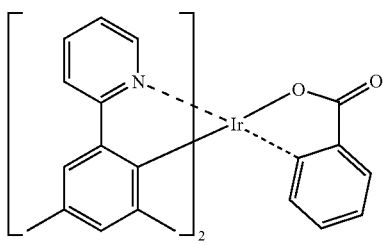

D-3
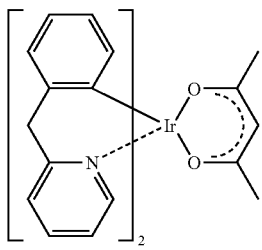

D-4
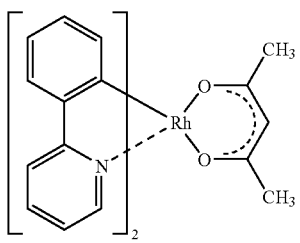

D-5
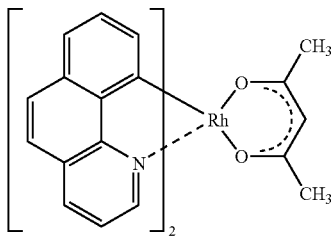

D-6
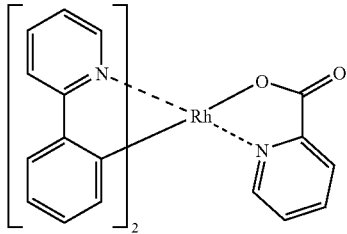

In the present invention, the wavelength of the phosphorescence maximum of the phosphorescent compound is not specifically limited. Theoretically, the phosphorescence wavelength can be varied by selecting a center metal, a ligand, or a substituent of the ligand. The phosphorescent compound preferably has a wavelength of the phosphorescence maximum in the wavelength region from 380 to 430 nm. Such an organic EL element emitting a blue or white light phosphorescence can provide higher emission efficiency.

Figure 4:
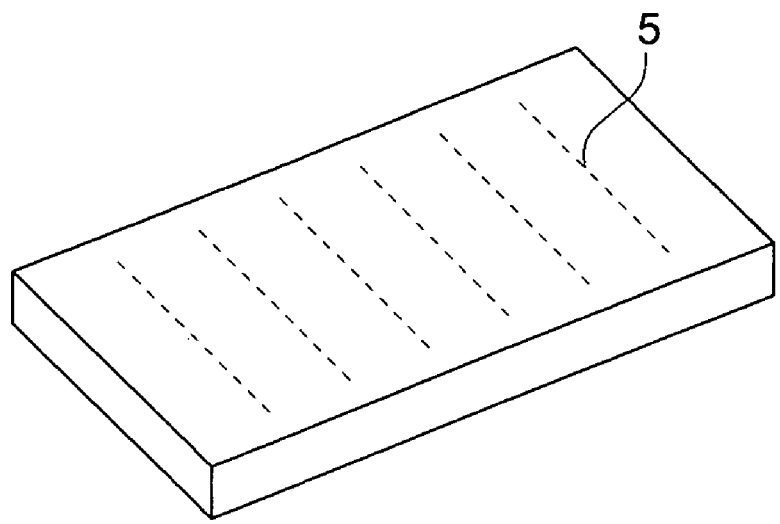
FIG. 4 is a schematic drawing of a display employing a passive matrix method.
Figure 4:
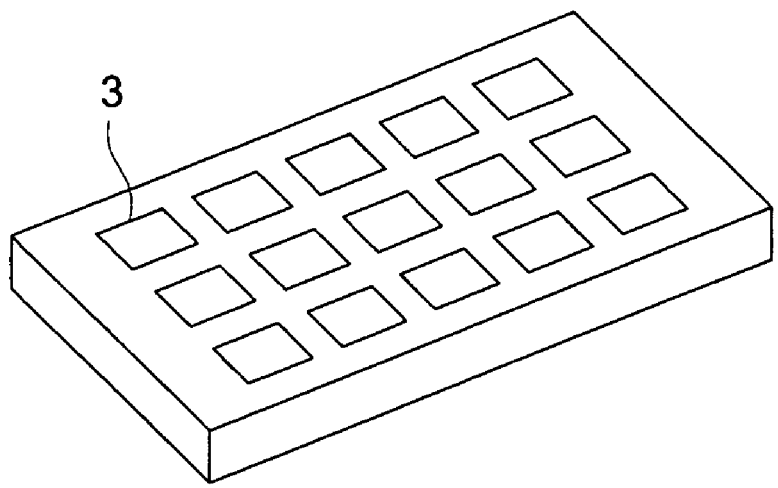
Figure 4:
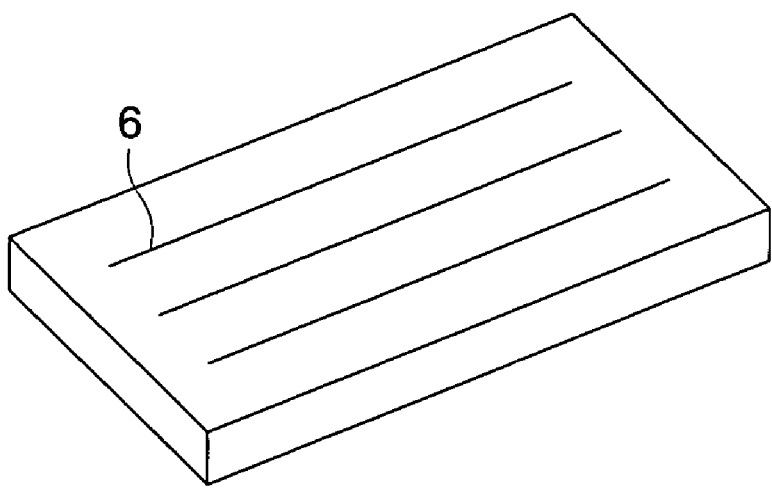

Color of light emitted from the organic EL element or the compound of the present invention is measured by a spectral light meter CS-1000, manufactured by Minolta Co., Ltd., and expressed according to CIE chromaticity diagram described in FIG. 4.16 on page 108 of "Shinpen Shikisai Kagaku Handbook" (Coloring Science Handbook, New Edition), edited by Nihon Shikisai Gakkai, published by Todai Shuppan Kai, 1985.

The light emitting layer can be formed employing the above-described compounds and a known method such as a vacuum deposition method, a spin coat method, a casting method, an LB method or an ink jet method. The thickness of the light emitting layer is not specifically limited, however, is ordinarily from 5 nm to 5 μm, and preferably from 5 to 200 nm. The light emitting layer may be composed of a single layer comprising one or two or more of the phosphorescent compound or the host compound, or of plural layers comprising the same composition, or different composition.

<<Hole Transporting Layer>>

The hole transporting layer may be either an organic substance or an inorganic substance as long as it has a hole injecting ability, a hole transporting ability or an ability to form a barrier to electrons. Examples of thereof include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, specifically a thiophene oligomer. As the hole transporting Material, those described above are used, however, a porphyrin compound, an aromatic tertiary amine compound or a styrylamine compound is preferably used, and, specifically, an aromatic tertiary amine compound is more preferably used.

Typical examples of the aromatic tertiary amine compound and styrylamine compound include N,N,N',N'-tetraphenyl-4,4'-diaminophenyl, N,N''-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in JP-A No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used. As the hole injecting material or the hole transporting material, inorganic compounds such as p-Si and p-SiC are usable.

The hole transporting layer can be formed by preparing a thin layer of the hole transporting material using a known method such as a vacuum deposition method, a spin coat method, a casting method, an ink jet method, and an LB method. The thickness of the hole transporting layer is not specifically limited, however, is ordinarily from 5 to 5000 nm.

The hole transporting layer may be composed of a single layer structure comprising one or two or more of the materials mentioned above.

<<Electron Transporting Layer>>

The electron transporting layer contains a material having an electron transporting ability, and in a broad sense an electron injecting layer or a hole blocking layer are included in an electron transporting layer. The electron transporting layer can be provided as a single layer or plural layers.

An electron transporting material (which serves also as a hole blocking material) used in a single electron transporting layer or in the electron transporting layer closest to the cathode when plural electron transporting layers are employed, may be a compound which has a function of transporting electrons injected from a cathode to a light emitting layer. The material used in the electron transporting layer can be optionally selected from known compounds used as electron transporting materials.

Examples of the material used in the electron transporting layer include a nitro-substituted fluorene derivative, a diphenylquinone derivative, a thiopyran dioxide derivative, a carbodiimide, a fluorenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material.

A polymer in which the material mentioned above is introduced in the polymer side chain or a polymer having the material as the polymer main chain can be also used.

A metal complex of an 8-quinolynol derivative such as aluminum tris(8-quinolynol) (Alq$_3$), aluminum tris(5,7-dichloro-8-quinolynol), aluminum tris(5,7-dibromo-8-quinolynol), aluminum tris(2-methyl-8-quinolynol), aluminum tris(5-methyl-8-quinolynol), or zinc bis(8-quinolynol) (Znq$_2$), and a metal complex formed by replacing the central metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for the light emitting layer may preferably be employed as the electron transporting material. An inorganic semiconductor such as n-Si and n-SiC may also be used as the electron transporting material in a similar way as in the hole transporting layer.

The electron transporting layer can be formed employing the above described electron transporting materials and a known method such as a vacuum deposition method, a spin coat method, a casting method, a printing method including an ink jet method or an LB method. The thickness of electron transporting layer is not specifically limited, however, is ordinarily from 5 nm to 5 μm, and preferably from 5 to 200 nm. The electron transporting layer may be composed of a single layer containing one or two or more of the electron transporting material.

<<Substrate>>

The organic EL element of the present invention is preferably provided on a substrate.

The substrate (referred to as also base plate, base or support) employed for the organic electroluminescent element of the present invention is not restricted to specific kinds of materials such as glass and plastic, as far as it is transparent. Examples of the substrate preferably used include glass, quartz and light transmissible plastic film. Specifically preferred one is a resin film capable of providing flexibility to the organic EL element.

Examples of the resin film include films of polyethylene terephthalate (PET), polyethylene naphthalate (PEN), polyethersulfone (PES), polyetherimide, polyetheretherketone, polyphenylene sulfide, polyarylate, polyimide, polycarbonate (PC), cellulose triacetate (TAC), cellulose acetate propionate (CAP). The surface of the resin film may have a layer of an inorganic or organic compound or a hybrid layer of both compounds.

The external light emission efficiency of the organic electroluminescent element of the present invention is preferably not less than 1%, and more preferably not less than 5% at room temperature. Herein, external quantum yield (%) is represented by the following formula:

External quantum yield (%)=(the number of photons emitted to the exterior of the organic electroluminescent element×100)/(the number of electrons supplied to the organic electroluminescent element)

A hue improving filter such as a color filter may be used in combination or a color conversion filter which can convert emission light color from an organic EL element, to multicolor employing a fluorescent compound may be used in combination. In the case where the color conversion filter is used, the λmax of the light emitted from the organic EL element is preferably not more than 480 nm.

<<Preparation of Organic EL Element>>

For one example, the preparation of the organic EL element, which has the following constitution will be described: Anode/Hole injecting layer/Hole transporting layer/Light emitting layer/Electron transporting layer/Electron injecting layer/Cathode. A thin layer of a desired material for an electrode such as a material of the anode is formed on a suitable substrate by a deposition or sputtering method to prepare the anode, so that the thickness of the layer is not more than 1 μm, and preferably within the range of from 10 to 200 nm. Then the hole injecting layer, the hole transporting layer, the light emitting layer, the electron transporting layer and the electron injecting layer, which constitute the organic EL element, are formed on the resulting anode in that order as organic compound thin layers.

As methods for formation of the thin layers, as the same as described above, there are a vacuum deposition method and a wet process (for example, a spin coating method, a casting method, an ink jet method, and a printing method), however, a vacuum deposition method, a spin coating method, an ink jet method and a printing method are preferably used, since a uniform layer without a pinhole can be formed. Different methods may be used for formation of different layers. When the vacuum deposition method is used for the thin layer formation method, although conditions of the vacuum deposition differs due to kinds of materials used, vacuum deposition is preferably carried out at a boat temperature of from 50° C. to 450° C., at a degree of vacuum of from $10^{-6}$ to $10^{-2}$ Pa, at a deposition speed of from 0.01 to 50 nm/second, and at a substrate temperature of from 50 to 300° C. to form a layer with a thickness of from 0.1 nm to 5 μm, preferably from 5 to 200 nm.

After these layers has been formed, a thin layer of a material for a cathode is formed thereon to prepare a cathode, employing, for example, a deposition method or sputtering method to give a thickness of not more than 1 μm, and preferably from 50 to 200 nm. Thus, a desired organic EL element is obtained. It is preferred that the layers from the hole injecting layer to the cathode are continuously formed under one time of vacuuming to obtain an organic EL element. However, on the way of the layer formation under vacuum, a different layer formation method by taking the layer out of the vacuum chamber may be inserted. When the different method is used, the process is required to be carried out under a dry inert gas atmosphere.

In the multicolor display of the present invention, the light emitting layer only is formed using a shadow mask, and the other layers, besides the light emitting layer, are formed employing a vacuum method, a casting method, a spin coat method or a printing method in which patterning employing the shadow mask is not required.

When the light emitting layer only is formed by patterning, the layer formation, although not specifically limited, is carried out preferably according to a deposition method, an ink jet method or a printing method. When a deposition method is used as the layer formation method, patterning of the layer is preferably carried out employing a shadow mask.

Further, the organic EL element can be prepared in the reverse order, in which the cathode, the electron injecting layer, the electron transporting layer, the light emitting layer, the hole transporting layer, the hole injecting layer, and the anode are formed in that order. When a direct current voltage, a voltage of 2 to 40 V is applied to thus obtained multicolor display, setting the anode as a + polarity and the cathode as a − polarity, light emission occurs. An alternating current may also be applied to cause light emission. Arbitrary wave shape of alternating current may be used.

The display of the present invention can be used as a display device, a display, or various light emission sources. The display device or the display, which employs three kinds of organic EL elements emitting a blue light, a red light and a green light can present a full color image.

Examples of the display device or the display include a television, a personal computer, a mobile device or an AV device, a display for text broadcasting, and an information display used in a car. The display device may be used as specifically a display for reproducing a still image or a moving image. When the display device is used as a display for reproducing a moving image, the driving method may be either a simple matrix (passive matrix) method or an active matrix method.

Examples of an illuminator include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, however, are not limited thereto.

The organic EL element of the present invention may be an organic EL element having a resonator structure.

The organic EL element having a resonator structure is applied to a light source for a photo-memory medium, a light source for an electrophotographic copier, a light source for an optical communication instrument, or a light source for a photo-sensor, however, its application is not limited thereto. In the above application, a laser oscillation may be carried out.

The organic EL element of the present invention can be applied to an organic EL element emitting substantially white light as an illuminator. White light is obtained by mixing plural color lights, which are emitted from plural emission compounds. A combination of the plural color lights may be that of lights of three primary colors, blue, green, and red colors, each having a different emission maximum wavelength, or that of lights of complementary colors such as blue and yellow colors, or blue green and orange colors, each having a different emission maximum wavelength.

A combination of light emitting materials for obtaining plural color lights may be a combination of materials emitting plural fluorescent or phosphorescent light, or a combination of fluorescent or phosphorescent light emitting-material and colorant which emit light under excitation due to excitation light from the light emitting-materials. In the white light emitting organic EL element of the present invention, a combination of only plural light emitting dopants is used.

A mask is used only in the process when a light emitting layer, a hole transporting layer or an electron transporting layer is formed, and each organic EL element is simply juxtaposed on the substrate by applying through a mask. Since, other layers are common, patterning with a mask is not necessary, and the layers, for example, the electrode layer, are formed employing a vacuum method, a casting method, a spin coat method, an ink-jet method or a printing method, all over the substrate, whereby productivity is increased. In this method, the light emitting element itself emits white light, which is different from a white light emitting organic EL element composed of an array of light emitting elements of plural colors.

Light emitting materials used in the light emitting layer are not specifically limited. For example, a back light used in a liquid crystal display is prepared by arbitrary selecting materials from orthometal-complexes (for example, an Ir-complex or a Pt-complex) or from known light emitting compounds and by using the selected materials in combination to emit white light, so that the emitted light fits the wavelength range corresponding to the CF (color filter) property.

The white light emitting organic EL element of the present invention may be suitably used for a variety of emitting light source, an illuminator for household use or in a vehicle, a kind of a lamp such as a light source for exposure, or for a display device, for example, as a back light of a liquid crystal display.

Other examples of the usage include: a backlight of a watch, an advertisement signboard, a traffic light, a light source for an optical memory medium, a light source for an electrophotographic copier, a light source for an optical communication processor, a light source for a light sensor and electric appliances for household use having a display device.

<<Display Device>>

The organic EL element of the present invention can be used as a lamp such as an illuminating lamp or a light source for exposure, as a projection device for projecting an image, or as a display for directly viewing a still image or a moving image. When the element is used in a display for reproducing a moving image, the driving method may be either a simple matrix (passive matrix) method or an active matrix method. The display can present a full color image by employing two or more kinds of organic EL elements each emitting light with a different color. A monochromatic color; for example, a white color can be converted to a full color of BGR, employing a color filter. Further, employing a color conversion filter, light color emitted from the organic EL element can be converted to another color or full color, where the λmax of the light emitted from the organic EL element is preferably not more than 480 nm.

One example of the display comprising the organic EL element of the present invention will be explained below employing Figures.

FIG. 1 is a schematic drawing of one example of a display containing an organic EL element. FIG. 1 is a display such as that of a cellular phone, displaying image information due to light emission from the organic EL.

A display 1 contains a display section A having plural pixels and a control section B carrying out image scanning based on image information to display an image in the display section A. The control on B is electrically connected to the display section A, transmits a scanning signal and an image data signal to each of the plural pixels based on image information from the exterior, and conducts image scanning which emits light from each pixel due to the scanning signal according to the image data signal, whereby an image is displayed on the display section A.

Figure 2:
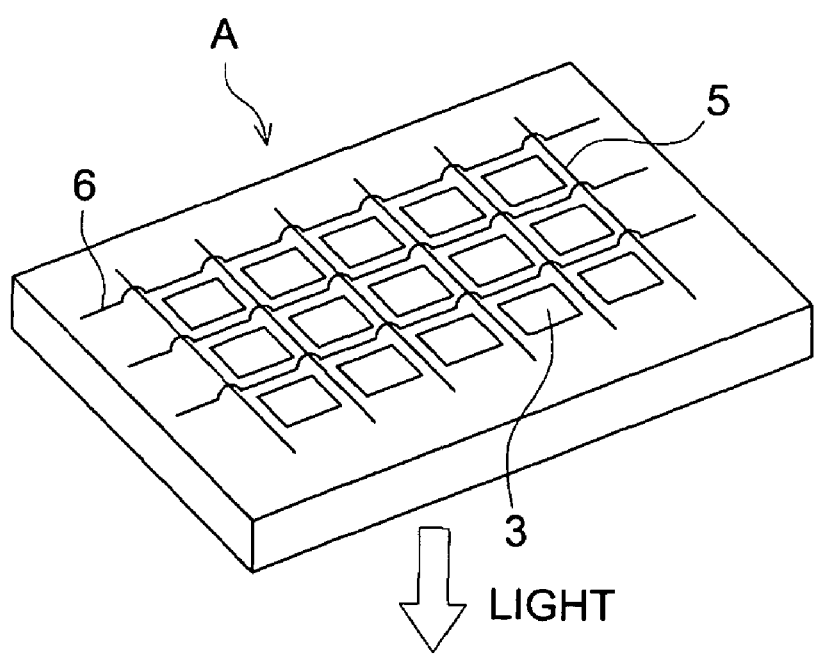
FIG. 2 is a schematic drawing of a display section.

FIG. 2 is a schematic drawing of a display section A. The display section A contains a substrate, plural pixels 3, and a wiring section containing plural scanning lines 5 and plural data lines 6. The main members of the display section A will be explained below. In FIG. 2, light from pixels 3 is emitted in the direction of an arrow.

The plural scanning lines 5 and plural data lines 6 of the wiring section 2 each are composed of an electroconductive material, the lines 5 and the lines 6 being crossed with each other at a right angle, and connected with the pixels 3 at the crossed points (not illustrated).

The plural pixels 3, when the scanning signal is applied from the scanning lines 5, receive the data signal from the data lines 6, and emit light corresponding to the image data received. Provision of red light emitting pixels, green light emitting pixels, and blue light emitting pixels side by side on the same substrate can display a full color image.

Next, an emission process of pixels will be explained.

Figure 3:
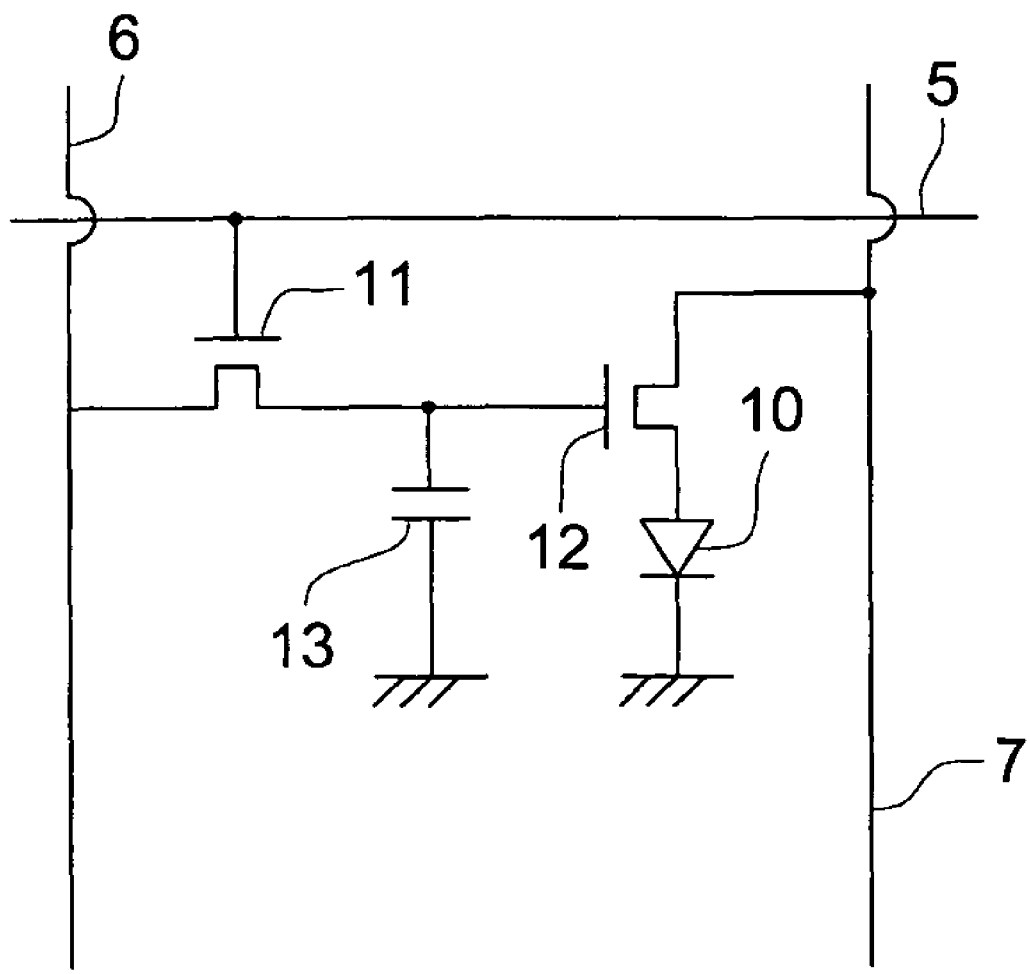
FIG. 3 is a schematic drawing of a pixel.

FIG. 3 is a schematic drawing of a pixel. The pixel contains an organic EL element 10, a switching transistor 11, a driving transistor 12, and a capacitor 13. When a pixel with a red light emitting organic EL element, a pixel with a green light emitting organic EL element, and a pixel with a blue light emitting organic EL element are provided side by side on the same substrate, a full color image can be displayed.

In FIG. 3, an image data signal is applied through the data lines 6 from the control section B to a drain of the switching transistor 11, and when a scanning signal is applied to a gate of the switching transistor 11 through the scanning lines 5 from the control section B, the switching transistor 11 is switched on, and the image signal data applied to the drain is transmitted to the capacitor 13 and the gate of the driving transistor 12.

The capacitor 13 is charged according to the electric potential of the image data signal transmitted, and the driving transistor 12 is switched on. In the driving transistor 12, the drain is connected to an electric source line 7, and the source to an organic EL element 10. Current is supplied from the electric source line 7 to the organic EL element 10 according to the electric potential of the image data signal applied to the gate.

The scanning signal is transmitted to the next scanning line 5 according to the successive scanning of the control section B, the switching transistor 11 is switched off. Even if the switching transistor 11 is switched off, the driving transistor 12 is turned on since the capacitor 13 maintains a charged potential of image data signal, and light emission from the organic EL element 10 continues until the next scanning signal is applied. When the next scanning signal is applied according the successive scanning, the driving transistor 12 works according to an electric potential of the next image data signal synchronized with the scanning signal, and light is emitted from the organic EL element 10.

That is, light is emitted from the organic EL element 10 in each of the plural pixels 3 due to the switching transistor 11 as an active element and the driving transistor 12 each being provided in the organic EL element 10 of each of the plural pixels 3. This emission process is called an active matrix process.

Herein, light emission from the organic EL element 10 may be emission with plural gradations according to image signal data of multiple value having plural gradation potentials, or emission due to on-off according to a binary value of the image data signals.

The electric potential of the capacitor 13 may maintain till the next application of the scanning signal, or may be discharged immediately before the next scanning signal is applied.

In the present invention, light emission may be carried out employing a passive matrix method as well as the active matrix method as described above. The passive matrix method is one in which light is emitted from the organic EL element according to the data signal only when the scanning signals are scanned.

FIG. 4 is a schematic drawing of a display employing a passive matrix method.

In FIG. 4, pixels 3 are provided between the scanning lines 5 and the data lines 6, crossing with each other. When scanning signal is applied to scanning line 5 according to successive scanning, pixel 3 connecting the scanning line 5 emits according to the image data signal. The passive matrix method has no active element in the pixel 3, which reduces manufacturing cost of a display.

EXAMPLES

Example 1

Preparation of Organic EL Element Nos. 1-1 to 1-21

A pattern was formed on a substrate (100 mm×100 mm×1.1 mm) composed of a glass plate and a 100 nm ITO (indium tin oxide) layer (NA45 manufactured by NH Technoglass Co., Ltd.) as an anode. Then the resulting transparent substrate having the ITO transparent electrode was subjected to ultrasonic washing in i-propyl alcohol and dried by a dry nitrogen gas and subjected to UV-ozone cleaning for 5 minutes. Thus obtained transparent substrate was fixed on a substrate holder of a vacuum deposition apparatus available on the market. Further, 200 mg of α-NPD was placed in a first resistive heating molybdenum boat, 200 mg of exemplified compound 9 was put in a second resistive heating molybdenum boat, 200 mg of bathocuproine (BCP) was placed in a third resistive heating molybdenum boat, 100 mg of Ir-12 was placed in a fourth resistive heating molybdenum boat, and 200 mg of Alq$_3$ was placed in a fifth resistive heating molybdenum boat.

The resulting boats were set in the vacuum deposition apparatus, and pressure in the vacuum tank was reduced to $4 \times 10^{-4}$ Pa. Then, the boat carrying α-NPD being heated by supplying an electric current to the boat, α-NPD was deposited onto the transparent substrate at a depositing speed of 0.1 nm/sec to form a first hole transporting layer. After that, the boat carrying Exemplified compound 9 as a host compound and the boat carrying Ir-12 being heated by supplying an electric current to both boats, Exemplified compound 9 at a depositing speed of 0.2 nm/sec and Ir-12 at a depositing speed of 0.012 nm/sec were co-deposited onto the resulting hole transporting layer to form a light emitting layer. The temperature of the substrate at the time of the deposition was room temperature. Subsequently, the boat carrying BCP being heated by supplying an electric current to the boat, BCP was deposited onto the resulting light emitting layer at a depositing speed of 0.1 nm/sec to form a hole blocking layer with a thickness of 10 nm. Further, the boat carrying Alq$_3$ being heated by supplying an electric current to the boat, Alq$_3$ was deposited onto the resulting hole blocking layer at a depositing speed of 0.1 nm/sec to form an electron transporting layer with a thickness of 40 nm. The temperature of the substrate at the time of the deposition was room temperature.

After that, a 0.5 nm thick lithium fluoride layer and a 110 nm thick aluminum layer were deposited on the resulting material to form a cathode. Thus, Organic EL Element No. 1-1 was prepared. Organic EL Element Nos. 1-2 to 1-21 were prepared in the same manner as Organic EL Element No. 1-1 above, except that Exemplified compound 9 used as a host compound was replaced by the compounds shown in Table 1. The structures of the compounds used above are shown below:

CBP

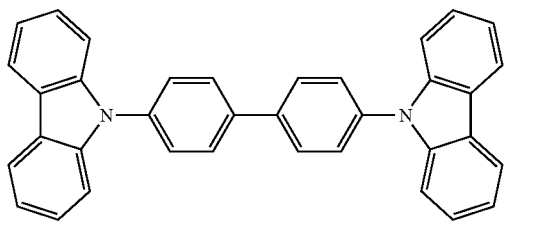

BCP

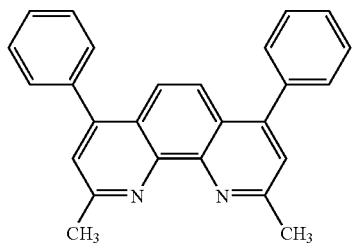

α-NPD

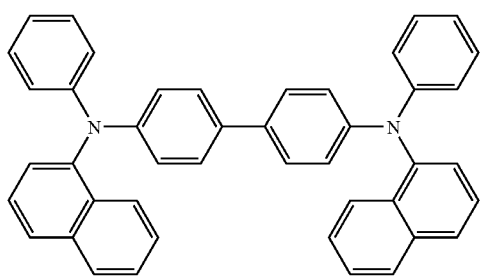

Alq$_3$

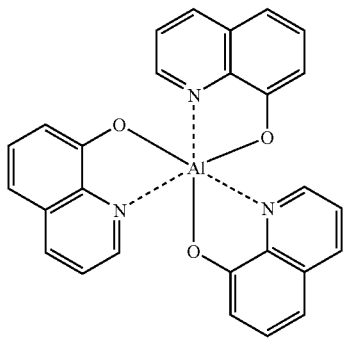

<<Evaluation of Organic EL Element Nos. 1-1 to 1-21>>

The Organic EL Element Nos. 1-1 to 1-21 obtained above were evaluated as follows.

(Luminance)

Luminance (cd/m$^2$) was measured by using a spectral radiance meter CS-1000 produced by Konica Minolta Sensing Inc.

(External Quantum Efficiency)

Electric current of 2.5 mA/cm$^2$ was supplied to each sample at 23° C. in an atmosphere of a dry nitrogen gas, and the external quantum efficiency (%) of each sample was measured. The external quantum efficiency (%) was calculated from the date obtained by being measured through a spectral radiance meter CS-1000 produced by Konica Minolta Sensing Inc.

In the following table, the measured luminance and external quantum efficiency were expressed by relative values when each of the luminance and the external quantum efficiency values of Organic EL Element No. 1-15 was set as 100.

The results are shown in the following table.

| Organic EL Element No. | Host Compound | Luminance | External Quantum Efficiency | Remarks |
| --- | --- | --- | --- | --- |
| 1-1 | 9 | 220 | 221 | Inv. |
| 1-2 | 10 | 180 | 179 | Inv. |
| 1-3 | 13 | 215 | 217 | Inv. |
| 1-4 | 16 | 160 | 165 | Inv. |
| 1-5 | 28 | 205 | 202 | Inv. |
| 1-6 | 33 | 155 | 153 | Inv. |
| 1-7 | 39 | 215 | 215 | Inv. |
| 1-8 | 50 | 213 | 212 | Inv. |
| 1-9 | 53 | 189 | 190 | Inv. |
| 1-10 | 56 | 212 | 210 | Inv. |
| 1-11 | 64 | 217 | 217 | Inv. |
| 1-12 | 71 | 201 | 200 | Inv. |
| 1-13 | 79 | 170 | 172 | Inv. |
| 1-14 | 90 | 180 | 179 | Inv. |
| 1-15 | CBP | 100 | 100 | Comp. |
| 1-16 | 105 | 199 | 201 | Inv. |
| 1-17 | 122 | 213 | 213 | Inv. |
| 1-18 | 123 | 196 | 198 | Inv. |
| 1-19 | 131 | 192 | 191 | Inv. |
| 1-20 | 132 | 190 | 191 | Inv. |
| 1-21 | 140 | 198 | 198 | Inv. |

Inv.: Present Invention,
Comp.: Comparative Sample

As is clear from the above table, the organic EL elements of the present invention exhibited higher luminance values and considerably higher external quantum efficiency values compared to those of the comparative organic EL element.

Example 2

Preparation of Organic EL Element Nos. 2-1 to 2-20

A pattern was formed on a substrate (100 mm×100 mm×1.1 mm) composed of a glass plate and a 100 nm ITO (iridium tin oxide) layer (manufactured by NH Technoglass Co., Ltd.) as an anode. Then the resulting transparent substrate having the ITO transparent electrode was subjected to ultrasonic washing in i-propyl alcohol and dried by a dry nitrogen gas and subjected to UV-ozone cleaning for 5 minutes. Thus obtained transparent substrate was fixed on a substrate holder of a vacuum deposition apparatus available on the market. Further, 200 mg of α-NPD was placed in a first resistive heating molybdenum boat, 200 mg of CEP was placed in a second resistive heating molybdenum boat, 200 mg of Exemplified compound 9 as a hole blocking material was placed in a third resistive heating molybdenum boat, 100 mg of Ir-1 was placed in a fourth resistive heating molybdenum boat, and 200 mg of $Alq_3$ was placed in a fifth resistive heating molybdenum boat.

The resulting boats were set in the vacuum deposition apparatus, and pressure in the vacuum tank was reduced to $4 \times 10^{-4}$ Pa. Then, the boat carrying α-NPD being heated by supplying an electric current to the boat, α-NPD was deposited onto the transparent substrate at a depositing speed of 0.1 nm/sec to form a first hole transporting layer. After that, the boat carrying CBP and the boat carrying Ir-1 being heated by supplying an electric current to both boats, CBP at a depositing speed of 0.2 nm/sec and Ir-1 at a depositing speed of 0.012 nm/sec were co-deposited onto the resulting hole transporting layer to form a light emitting layer. The temperature of the substrate at the time of the deposition was room temperature. Subsequently, the boat carrying Exemplified compound 9 being heated by supplying an electric current to the boat, Exemplified compound 9 was deposited onto the resulting light emitting layer at a depositing speed of 0.1 nm/sec to form a hole blocking layer with a thickness of 10 nm. Further, the boat carrying $Alq_3$ being heated by supplying an electric current to the boat, $Alq_3$ was deposited onto the resulting hole blocking layer at a depositing speed of 0.1 nm/sec to form an electron transporting layer with a thickness of 40 nm. The temperature of the substrate at the time of the deposition was room temperature.

After that, a 0.5 nm thick lithium fluoride layer and a 110 nm thick aluminum layer were deposited on the resulting layer to form a cathode. Thus, Organic EL Element No. 2-1 was prepared. Organic EL Element Nos. 2-2 to 1-20 were prepared in the same manner as Organic EL Element No. 2-1, except that Exemplified compound 9 used as a hole blocking compound was replaced by the compounds shown in the following table.

<<Evaluation of Organic EL Element Nos. 2-1 to 2-20>>

The luminance and external quantum efficiency of Organic EL Element Nos. 2-1 to 2-20 were evaluated in the same manner as Example 1. Further, the life of the organic EL element was evaluated in a method described below.

(Life)

A period in which an initial emission intensity of an organic EL element decreased to half of it was defined as a half-life period (τ 0.5) and used as an index of the life of an organic EL element, the emission intensity being measured by supplying a constant electric current of 2.5 $mA/cm^2$ at 23° C. in an atmosphere of a dry nitrogen gas. A spectral radiance meter CS-1000 produced by Konica Minolta Sensing Inc. was used for the measurement of the life of an organic EL element.

The results are shown in the following table. In the following table, the measured luminance, external quantum efficiency and life shown in the following table were expressed by relative values when each of the luminance, external quantum efficiency and life values of Organic EL Element No. 2-12 was set as 100.

| Organic EL Element No. | Hole Blocking Material | Luminance | External Quantum Efficiency | Life | Remarks |
|---|---|---|---|---|---|
| 2-1 | 9 | 120 | 120 | 325 | Inv. |
| 2-2 | 11 | 130 | 129 | 534 | Inv. |
| 2-3 | 15 | 125 | 123 | 330 | Inv. |
| 2-4 | 16 | 120 | 122 | 357 | Inv. |
| 2-5 | 23 | 105 | 103 | 296 | Inv. |
| 2-6 | 40 | 122 | 120 | 440 | Inv. |
| 2-7 | 50 | 125 | 126 | 600 | Inv. |
| 2-8 | 53 | 110 | 112 | 320 | Inv. |
| 2-9 | 56 | 124 | 122 | 764 | Inv. |
| 2-10 | 79 | 106 | 105 | 250 | Inv. |
| 2-11 | 88 | 103 | 102 | 305 | Inv. |
| 2-12 | BCP | 100 | 100 | 100 | Comp. |
| 2-13 | 73 | 118 | 118 | 621 | Inv. |
| 2-14 | 74 | 114 | 115 | 832 | Inv. |
| 2-15 | 105 | 120 | 120 | 537 | Inv. |
| 2-16 | 119 | 115 | 114 | 945 | Inv. |
| 2-17 | 123 | 112 | 111 | 584 | Inv. |
| 2-18 | 131 | 110 | 110 | 482 | Inv. |
| 2-19 | 132 | 113 | 112 | 561 | Inv. |
| 2-20 | 140 | 121 | 123 | 556 | Inv. |

Inv.: Present Invention,
Comp.: Comparative Sample

As is clear from the above table, the organic EL elements of the present invention exhibited higher luminance values, higher external quantum efficiency values and longer lives compared to those of the comparative organic EL element.

Example 3

Preparation of Organic EL Element Nos. 3-1 to 3-8

Organic EL Element Nos. 3-1 to 3-8 were prepared in the same manner as Organic EL Element No. 1-1 described in Example 1, except that the host compound in the light emitting layer was replaced by the compounds shown in the following table, Ir-12 was replaced by Ir-1 and BCP was replaced by B-Alq.

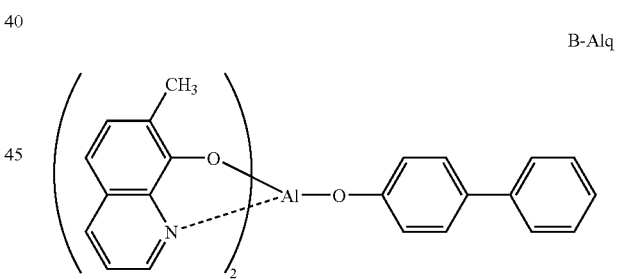

B-Alq

<Evaluation of Organic EL Element Nos. 3-1 to 3-8>

The luminance and external quantum efficiency of Organic EL Element Nos. 3-1 to 3-8 were evaluated in the same manner as Example 1. Further, the life of the organic EL element was evaluated in a method described below.

(Storage Stability)

Each organic EL element was reserved at 85° C. for 24 hours, and the luminance of each organic EL element before and after the reservation was measured by passing through a constant current of 2.5 $mA/cm^2$. The ratio of luminance before and after the reservation was calculated according to the following equation and used as a criterion of storage stability.

Storage Stability(%)=luminance after reservation (2.5 $mA/cm^2$)/luminance before reservation (2.5 $mA/cm^2$)×100

The results are given in the following table.

| Organic EL Element No. | Host Compound | Storage Stability (%) | Remarks |
| --- | --- | --- | --- |
| 3-1 | 180 | 90 | Inv. |
| 3-2 | 175 | 85 | Inv. |
| 3-3 | 82 | 88 | Inv. |
| 3-4 | 184 | 82 | Inv. |
| 3-5 | 183 | 86 | Inv. |
| 3-6 | CBP | 48 | Comp. |
| 3-7 | 186 | 53 | Inv. |
| 3-8 | 187 | 64 | Inv. |

Inv.: Present Invention,
Comp.: Comparative Sample

As is clear in the above table, the organic EL elements of the present invention exhibited higher storage stability compared to those of the comparative organic EL element. Among these, compounds relating to Formula (1-12) having molecular weight of 450 or more gave specifically good results.

Example 4

Preparation of Organic EL Element Nos. 4-1 to 4-8

Organic EL Element Nos. 4-1 to 4-8 were prepared in the same manner as Organic EL Element No. 1-1 described in Example 1, except that the host compound in the light emitting layer was replaced by the compounds shown in the following table, Ir-12 was replaced by Ir-1 and BCP was replaced by B-Alq.

<Evaluation of Organic EL Element Nos. 4-1 to 4-8>

The luminance and external quantum efficiency of Organic EL Element Nos. 4-1 to 4-8 were evaluated in the same manner as Example 1. Further, the 50° C. driving life of the organic EL element was evaluated in a method described below. (50° C. driving life)

Each organic EL element was driven under a constant current giving a initial luminance of 1000 cd/m$^2$ and a period in which the luminance decreased to 1/2 (500 cd/m$^2$) of the initial value was determined. This period was used as a criterion of the 50° C. driving life. Each value of the 50° C. driving life was expressed by a relative value when the value of 50° C. driving life of the comparative sample of Organic EL Element No. 4-6 was set as 100.

The results are given in the following table.

| Organic EL Element No. | Host Compound | 50° C. Driving Life | Remarks |
| --- | --- | --- | --- |
| 4-1 | 185 | 730 | Inv. |
| 4-2 | 74 | 685 | Inv. |
| 4-3 | 139 | 725 | Inv. |
| 4-4 | 144 | 755 | Inv. |
| 4-5 | 89 | 780 | Inv. |
| 4-6 | CBP | 100 | Comp. |
| 4-7 | 186 | 132 | Inv. |
| 4-8 | 187 | 253 | Inv. |

Inv.: Present Invention,
Comp.: Comparative Sample

As is clear in the above table, the organic EL elements of the present invention exhibited longer 50° C. driving lives compared to those of the comparative organic EL element.

Among these, compounds relating to Formula (1-13) having molecular weight of 450 or more gave specifically good results.

Example 5

Preparation of Organic EL Element Nos. 5-1 to 5-8

Organic EL Element Nos. 5-1 to 5-8 were prepared in the same manner as Organic EL Element No. 1-1 described in Example 1, except that the host compound in the light emitting layer was replaced by the compounds shown in the following table, Ir-12 was replaced by Ir-1 and BCP was replaced by B-Alq.

<Evaluation of Organic EL Element Nos. 5-1 to 5-8>

The luminance and external quantum efficiency of Organic EL Element Nos. 5-1 to 5-8 were evaluated in the same manner as Example 1. Further, initial life-time of the organic EL element was evaluated in a method described below.

(Initial Lifetime)

Each organic EL element was driven under a constant current giving a initial luminance of 1000 cd/m$^2$ and a period in which the luminance decreased to 90% (900 cd/m$^2$) of the initial value was determined. This period was used as a criterion of the initial lifetime. Each value of the initial lifetime was expressed by a relative value when the value initial degradation of the comparative sample of Organic EL Element No. 5-6 was set as 100.

The results are given in the following table.

| Organic EL Element No. | Host Compound | Initial Lifetime | Remarks |
| --- | --- | --- | --- |
| 5-1 | 118 | 555 | Inv. |
| 5-2 | 123 | 485 | Inv. |
| 5-3 | 73 | 550 | Inv. |
| 5-4 | 48 | 490 | Inv. |
| 5-5 | 130 | 535 | Inv. |
| 5-6 | CBP | 100 | Comp. |
| 5-7 | 188 | 126 | Inv. |
| 5-8 | 187 | 198 | Inv. |

Inv.: Present Invention,
Comp.: Comparative Sample

As is clear in the above table, the organic EL elements of the present invention exhibited longer initial life-time compared to those of the comparative organic EL element. Among these, compounds relating to Formula (1-11) gave specifically good results.

Example 6

Preparation of Organic EL Element Nos. 6-1 to 6-8

Organic EL Element Nos. 6-1 to 6-8 were prepared in the same manner as Organic EL Element No. 1-1 described in Example 1, except that the host compound in the light emitting layer was replaced by the compounds shown in the following table, Ir-12 was replaced by Ir-1 and BCP was replaced by B-Alq.

<<Evaluation of Organic EL Element Nos. 6-1 to 6-8>>

The luminance and external quantum efficiency of Organic EL Element Nos. 6-1 to 6-8 were evaluated in the same manner as Example 1. Further, driving voltage of the organic EL element was evaluated in a method described below.

(Driving Voltage)

Driving voltage represents the voltage of an organic EL element when it is driven under a current of 2.5 mA/cm². A difference between the driving voltages of the organic EL element and the comparative Organic EL Element No. 6-6 was determined.

Driving Voltage (V)=Voltage of Organic EL Element No. 6-6 under driving (V)–Voltage of the organic EL element of the present invention under driving (V)

The results are given in the following table.

| Organic EL Element No. | Host Compound | Driving Voltage | Remarks |
|---|---|---|---|
| 6-1 | 14 | 1.3 | Inv. |
| 6-2 | 16 | 1.4 | Inv. |
| 6-3 | 52 | 1.5 | Inv. |
| 6-4 | 89 | 1.2 | Inv. |
| 6-5 | 48 | 1.2 | Inv. |
| 6-6 | CBP | 0 | Comp. |
| 6-7 | 186 | 0.8 | Inv. |
| 6-8 | 187 | 0.8 | Inv. |

Inv.: Present Invention,
Comp.: Comparative Sample

As is clear in the above table, the organic EL elements of the present invention exhibited superior driving voltage characteristics compared to those of the comparative organic EL element. Among these, compounds relating to Formulae (1-1) to (1-4) gave specifically good results.

Example 7

Preparation of Organic EL Element Nos. 7-1 to 7-8

Organic EL Element Nos. 7-1 to 7-8 were prepared in the same manner as Organic EL Element No, 2-12 described in Example 2, except that the host compound in the light emitting layer (CBP) was replaced by the Exemplified compound 130 and BCP in the hole blocking layer was replaced by the hole blocking materials shown in the following table.

<<Evaluation of Organic EL Element Nos. 7-1 to 7-8>>

The luminance, external quantum efficiency and storage stability of Organic EL Element Nos. 7-1 to 7-8 were evaluated in the same manner as Example 3.

The results are given in the following table.

| Organic EL Element No. | Hole Blocking Material | Storage Stability | Remarks |
|---|---|---|---|
| 7-1 | 180 | 92 | Inv. |
| 7-2 | 175 | 88 | Inv. |
| 7-3 | 82 | 89 | Inv. |
| 7-4 | 184 | 86 | Inv. |
| 7-5 | 183 | 90 | Inv. |
| 7-6 | B-Alq | 67 | Comp. |
| 7-7 | 186 | 67 | Inv. |
| 7-8 | 187 | 76 | Inv. |

Inv.: Present Invention,
Comp.: Comparative Sample

As is clear in the above table, the organic EL elements of the present invention exhibited superior storage stability compared to those of the comparative organic EL element. Among these, compounds relating to Formula (1-12) having molecular weight of 450 or more gave specifically good results.

Example 8

Preparation of Organic EL Element. Nos. 8-1 to 8-8

Organic EL Element Nos. 8-1 to 8-8 were prepared in the same manner as Organic EL Element No. 2-12 described in Example 2, except that the host compound in the light emitting layer (CBP) was replaced by the Exemplified compound 130 and BOP in the hole blocking layer was replaced by the hole blocking materials shown in the following table.

<<Evaluation of Organic EL Element Nos. 8-1 to 8-8>>

The luminance, external quantum efficiency and 50° C. driving life of Organic EL Element Nos. 8-1 to 8-8 were evaluated in the same manner as Example 4.

The results are given in the following table. Each value of measured 50° C. driving life given in the following table was expressed as a relative value when each value for Organic EL Element 8-6 was set as 100.

| Organic EL Element No. | Hole Blocking Material | 50° C. Driving Life | Remarks |
|---|---|---|---|
| 8-1 | 185 | 420 | Inv. |
| 8-2 | 74 | 385 | Inv. |
| 8-3 | 139 | 390 | Inv. |
| 8-4 | 144 | 365 | Inv. |
| 8-5 | 89 | 440 | Inv. |
| 8-6 | B-Alq | 100 | Comp. |
| 8-7 | 186 | 121 | Inv. |
| 8-8 | 187 | 173 | Inv. |

Inv.: Present Invention,
Comp.: Comparative Sample

As is clear in the above table, the organic EL elements of the present invention exhibited longer 50° C. driving lives compared to those of the comparative organic EL element. Among these, compounds relating to Formula (1-13) having molecular weight of 450 or more gave specifically good results.

Example 9

Preparation of Organic EL Element Nos. 9-1 to 9-8

Organic EL Element Nos. 9-1 to 9-8 were prepared in the same manner as Organic EL Element No. 2-12 described in Example 2, except that the host compound in the light emitting layer (CBP) was replaced by the Exemplified compound 130 and BCP in the hole blocking layer was replaced by the hole blocking materials shown in the following table.

<<Evaluation of Organic EL Element Nos. 9-1 to 9-8>>

The luminance, external quantum efficiency and initial life of Organic EL Element Nos. 9-1 to 9-8 were evaluated in the same mariner as Example 5.

The results are given in the following table. Each value of measured initial life given in the following table was expressed as a relative value when the value for Organic EL Element 9-6 was set as 100.

| Organic EL Element No. | Hole Blocking Material | Initial Lifetime | Remarks |
|---|---|---|---|
| 9-1 | 118 | 321 | Inv. |
| 9-2 | 123 | 298 | Inv. |

-continued

| Organic EL Element No. | Hole Blocking Material | Initial Lifetime | Remarks |
|---|---|---|---|
| 9-3 | 73 | 350 | Inv. |
| 9-4 | 48 | 310 | Inv. |
| 9-5 | 130 | 350 | Inv. |
| 9-6 | B-Alq | 100 | Comp. |
| 9-7 | 188 | 112 | Inv. |
| 9-8 | 187 | 141 | Inv. |

Inv.: Present Invention,
Comp.: Comparative Sample

As is clear in the above table, the organic EL elements of the present invention exhibited longer initial lives compared to those of the comparative organic EL element. Among these, compounds relating to Formula (1-11) gave specifically good results.

Example 10

Preparation of Organic EL Element Nos. 10-1 to 10-8

Organic EL Element Nos. 10-1 to 10-8 were prepared in the same manner as Organic EL Element No. 2-12 described in Example 2, except that the host compound in the light emitting layer (CBP) was replaced by the Exemplified compound 130 and BCP in the hole blocking layer was replaced by the hole blocking materials shown in the following table.

<<Evaluation of Organic EL Element Nos. 10-1 to 10-8>>

The luminance, external quantum efficiency and driving voltage of Organic EL Element Nos. 10-1 to 10-8 were evaluated in the same manner as Example 6.

The results are given in the following table. Each driving voltage was obtained as a voltage difference between the voltage of each organic EL element and that of Organic EL Element No. 10-6.

| Organic EL Element No. | Host Compound | Driving Voltage | Remarks |
|---|---|---|---|
| 10-1 | 14 | 0.9 | Inv. |
| 10-2 | 16 | 1.0 | Inv. |
| 10-3 | 52 | 1.0 | Inv. |
| 10-4 | 89 | 0.8 | Inv. |
| 10-5 | 48 | 0.9 | Inv. |
| 10-6 | B-Alq | 0 | Comp. |
| 10-7 | 186 | 0.4 | Inv. |
| 10-8 | 187 | 0.4 | Inv. |

Inv.: Present Invention,
Comp.: Comparative Sample

As is clear in the above table, the organic EL elements of the present invention exhibited superior driving voltages compared to those of the comparative organic EL element. Among these, compounds relating to Formulae (1-1) to (1-4) gave specifically good results.

Example 11

Organic EL Element No. 1-1 of the present invention prepared in Example 1, Organic EL Element No. 2-7 of the present invention prepared in Example 2 and an organic EL element prepared in the same manner as Organic EL Element No. 2-7 of the present invention, except that the phosphorescent compound was replaced by Exemplified compound Ir-9, were juxtaposed on the same substrate to prepare a full color display device driven by an active matrix method, illustrated in FIG. 1. In FIG. 2, a schematic drawing of only display section A is shown. Namely, on the same substitute, a wiring section containing plural scanning lines 5 and plural data lines 6 and juxtaposed plural pixels 3 (pixels emitting red light, pixels emitting green light and pixels emitting blue light) are provided. The plural scanning lines 5 and plural data lines 6 of the wiring section 2 are composed of an electroconductive material. The lines 5 and the lines 6 are crossing with each other at a right angle to form a lattice, and connected to the pixels 3 at the crossed points (not illustrated). The plural pixels 3 are driven by an active matrix method in which each pixel contained an organic EL element emitting a corresponding color light and active elements including a switching transistor and a driving transistor. When scanning signals are applied through the scanning lines 5, image data signals are received through data lines 6, and emission occurs according to the received image data. By juxtaposing red light emitting pixels, green light emitting pixels, and blue light emitting pixels side by side on the same substrate, display of a full color image becomes possible.

By driving the full color display device, a sharp full color moving picture with high external quantum efficiency and high durability was obtained.

Possibility for Industrial Use

The present invention can provide an organic electroluminescent element and a display device exhibiting high emission efficiency and a long life.

What is claimed is:

1. An organic electroluminescent element comprising a pair of electrodes having therebetween at least one constituting layer containing a phosphorescent light emitting layer, wherein one of the constituting layers contains a compound represented by Formula (15):

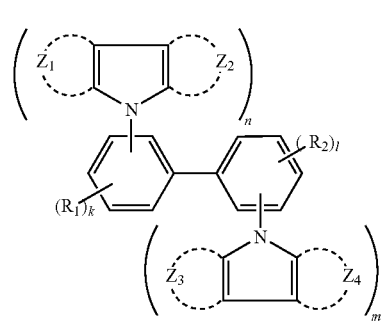

Formula (15)

wherein $R_1$ and $R_2$ each independently represents a hydrogen atom or a substituent; n and m each represents an integer of 1 to 2; k and l each represents an integer of 3 to 4, provided that n+k=5 and l+m=5; and $Z_1$, $Z_2$, $Z_3$ and $Z_4$ each represent a 6-membered aromatic heterocyclic ring containing a nitrogen atom;

and wherein said substituent is selected from the group consisting of an alkyl group, a cycloalkyl group, an alkenyl group, an alkynyl group, an aryl group, an aromatic heterocyclic group, a heterocyclic group, an alkoxy group, a cyclo alkoxyl group, acyloxy group, alkylthio group, cycloalkylthio group, an arylthio group, an alkoxycarbonyl group, an aryloxycarbonyl group, a sulfamoyl group, an acyl group, an acyloxy group, an amino group, a carbamoyl group, an ureido group, a sulfinyl group, an alkylsulfonyl group, an aryl sulfonyl group, an amino group, a halogen atom, a fluoride hydro fluoro carbon group, a cyano group, a nitro group, a hydroxyl group, a mercapto group and a silyl group.

2. The organic electroluminescent element of claim 1, wherein the compound represented by Formula 15 has a molecular weight of 450 or more.

3. The organic electroluminescent element of claim 1, wherein the light emitting layer contains the compound represented by Formula 15.

4. The organic electroluminescent element of claim 1, wherein at least one of the constituting layers is a hole blocking layer and the hole blocking layer contains the compound represented by Formula 15.

5. The organic electroluminescent element of claim 1 which emits blue light.

6. The organic electroluminescent element of claim 1 which emits white light.

7. A display device having the organic electroluminescent element of claim 1.

8. The organic electroluminescent element of claim 1, wherein the constituting layer containing the compound represented by Formula (15) is an electron transporting layer.

* * * * *